(12) United States Patent
Kremin

(10) Patent No.: US 8,547,114 B2
(45) Date of Patent: Oct. 1, 2013

(54) CAPACITANCE TO CODE CONVERTER WITH SIGMA-DELTA MODULATOR

(75) Inventor: Viktor Kremin, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 1202 days.

(21) Appl. No.: 11/600,255

(22) Filed: Nov. 14, 2006

(65) Prior Publication Data

US 2008/0111714 A1   May 15, 2008

(51) Int. Cl.
*G01R 27/26* (2006.01)
(52) U.S. Cl.
USPC ............................ 324/678; 324/679; 341/33
(58) Field of Classification Search
CPC ....................................................... G06F 3/044
USPC ......................... 324/658, 678, 679; 341/33
See application file for complete search history.

(56) References Cited

U.S. PATENT DOCUMENTS

| | | |
|---|---|---|
| 3,660,801 A | 5/1972 | Paulfus |
| 3,921,167 A | 11/1975 | Fox |
| 3,979,745 A | 9/1976 | Bishop |
| 4,090,092 A | 5/1978 | Serrano |
| 4,103,252 A | 7/1978 | Bobick |
| 4,113,378 A | 9/1978 | Wirtz |
| 4,193,063 A | 3/1980 | Hitt et al. |
| 4,238,711 A | 12/1980 | Wallot |
| 4,266,144 A | 5/1981 | Bristol |
| 4,292,604 A | 9/1981 | Embree et al. |
| 4,293,734 A | 10/1981 | Pepper, Jr. |
| 4,305,135 A | 12/1981 | Dahl et al. |
| 4,558,274 A | 12/1985 | Carusillo |
| 4,560,830 A | 12/1985 | Perl |
| 4,586,260 A | 5/1986 | Baxter et al. |
| 4,736,191 A | 4/1988 | Matzke et al. |
| 4,742,331 A | 5/1988 | Barrow et al. |
| 4,772,983 A | 9/1988 | Kerber et al. |
| 4,831,325 A | 5/1989 | Watson, Jr. |
| 4,878,013 A | 10/1989 | Andermo |
| 4,879,505 A | 11/1989 | Barrow et al. |
| 4,879,508 A | 11/1989 | Andermo |

(Continued)

FOREIGN PATENT DOCUMENTS

| | | |
|---|---|---|
| EP | 0574213 A | 12/1993 |
| GB | 05000604 B2 | 2/2005 |

(Continued)

OTHER PUBLICATIONS

CSR User Module Data Sheet, CSD v1.0, CY8C21x34 Data Sheet, Oct. 6, 2006, pp. 1-36.

(Continued)

*Primary Examiner* — Hai Phan
*Assistant Examiner* — Amine Benlagsir

(57) ABSTRACT

An apparatus and method for converting a capacitance measured on a sensor element to a digital code. The apparatus may include a switching capacitor as a sensor element of a sensing device, and a sigma-delta modulator coupled to the sensor element to convert a capacitance measured on the sensor element to a digital code. The switching capacitor is in a feedback loop of the sigma-delta modulator. The method may include measuring a capacitance on a sensor element of a sensing device using a sigma-delta modulator, and converting the capacitance measured on the sensor element to a digital code.

58 Claims, 23 Drawing Sheets

(56) References Cited

U.S. PATENT DOCUMENTS

| | | | |
|---|---|---|---|
| 4,920,399 A | 4/1990 | Hall | |
| 4,940,980 A | 7/1990 | Tice | |
| 4,977,480 A | 12/1990 | Nishihara | |
| 5,008,497 A | 4/1991 | Asher | |
| 5,165,054 A | 11/1992 | Platt et al. | |
| 5,214,388 A | 5/1993 | Vranish et al. | |
| 5,237,879 A | 8/1993 | Speeter | |
| 5,281,862 A | 1/1994 | Ma | |
| 5,294,889 A | 3/1994 | Heep et al. | |
| 5,305,017 A | 4/1994 | Gerpheide | |
| 5,323,158 A | 6/1994 | Ferguson, Jr. | |
| 5,373,245 A | 12/1994 | Vranish et al. | |
| 5,386,219 A | 1/1995 | Greanias et al. | |
| 5,412,387 A * | 5/1995 | Vincelette et al. | 341/150 |
| 5,424,756 A | 6/1995 | Ho et al. | |
| 5,461,321 A | 10/1995 | Sanders et al. | |
| 5,479,103 A | 12/1995 | Kernahan et al. | |
| 5,518,078 A | 5/1996 | Tsujioka et al. | |
| 5,525,980 A | 6/1996 | Jahier et al. | |
| 5,541,580 A | 7/1996 | Gerston et al. | |
| 5,543,590 A | 8/1996 | Gillespie et al. | |
| 5,572,205 A | 11/1996 | Caldwell et al. | |
| 5,589,856 A | 12/1996 | Stein et al. | |
| 5,670,915 A | 9/1997 | Cooper et al. | |
| 5,672,959 A | 9/1997 | Der | |
| 5,680,070 A | 10/1997 | Anderson et al. | |
| 5,684,487 A | 11/1997 | Timko | |
| 5,694,063 A | 12/1997 | Burlison et al. | |
| 5,730,165 A | 3/1998 | Philipp | |
| 5,748,185 A | 5/1998 | Stephan et al. | |
| 5,763,924 A | 6/1998 | Lum et al. | |
| 5,844,265 A | 12/1998 | Mead et al. | |
| 5,905,489 A | 5/1999 | Takahama et al. | |
| 5,942,733 A | 8/1999 | Allen et al. | |
| 5,943,052 A | 8/1999 | Allen et al. | |
| 5,949,264 A | 9/1999 | Lo | |
| 5,969,513 A | 10/1999 | Clark | |
| 6,023,422 A | 2/2000 | Allen et al. | |
| 6,028,271 A | 2/2000 | Gillespie et al. | |
| 6,028,959 A | 2/2000 | Wang et al. | |
| 6,037,929 A | 3/2000 | Ogura et al. | |
| 6,037,930 A | 3/2000 | Wolfe et al. | |
| 6,060,957 A | 5/2000 | Kodrnja et al. | |
| 6,067,019 A | 5/2000 | Scott | |
| 6,097,432 A | 8/2000 | Mead et al. | |
| 6,140,853 A | 10/2000 | Lo | |
| 6,145,850 A | 11/2000 | Rehm | |
| 6,148,104 A | 11/2000 | Wang et al. | |
| 6,184,871 B1 | 2/2001 | Teres et al. | |
| 6,188,228 B1 | 2/2001 | Philipp | |
| 6,188,391 B1 | 2/2001 | Seely et al. | |
| 6,222,528 B1 | 4/2001 | Gerpheide et al. | |
| 6,239,389 B1 | 5/2001 | Allen et al. | |
| 6,249,447 B1 | 6/2001 | Boylan et al. | |
| 6,262,717 B1 | 7/2001 | Donohue et al. | |
| 6,271,719 B1 | 8/2001 | Sevastopoulos | |
| 6,271,720 B1 | 8/2001 | Sevastopoulos | |
| 6,271,835 B1 | 8/2001 | Hoeksma | |
| 6,278,283 B1 | 8/2001 | Tsugai | |
| 6,288,707 B1 | 9/2001 | Philipp | |
| 6,295,052 B1 | 9/2001 | Kato et al. | |
| 6,304,014 B1 | 10/2001 | England et al. | |
| 6,320,184 B1 | 11/2001 | Winklhofer et al. | |
| 6,323,846 B1 | 11/2001 | Westerman et al. | |
| 6,342,817 B1 | 1/2002 | Crofts et al. | |
| 6,344,773 B1 | 2/2002 | Sevastopoulos et al. | |
| 6,353,200 B1 | 3/2002 | Schwankhart | |
| 6,366,099 B1 | 4/2002 | Reddi | |
| 6,377,009 B1 | 4/2002 | Philipp | |
| 6,377,129 B1 | 4/2002 | Rhee et al. | |
| 6,380,929 B1 | 4/2002 | Platt | |
| 6,380,931 B1 | 4/2002 | Gillespie et al. | |
| 6,400,217 B1 | 6/2002 | Bhandari | |
| 6,414,671 B1 | 7/2002 | Gillespie et al. | |
| 6,424,338 B1 | 7/2002 | Anderson | |
| 6,430,305 B1 | 8/2002 | Decker | |
| 6,441,073 B1 | 8/2002 | Tanaka et al. | |
| 6,441,682 B1 | 8/2002 | Vinn et al. | |
| 6,445,257 B1 | 9/2002 | Cox et al. | |
| 6,448,911 B1 | 9/2002 | Somayajula | |
| 6,452,514 B1 | 9/2002 | Philipp | |
| 6,457,355 B1 | 10/2002 | Philipp | |
| 6,459,321 B1 | 10/2002 | Belch | |
| 6,466,036 B1 | 10/2002 | Philipp | |
| 6,473,069 B1 | 10/2002 | Gerpheide | |
| 6,489,899 B1 | 12/2002 | Ely et al. | |
| 6,490,203 B1 | 12/2002 | Tang | |
| 6,498,720 B2 | 12/2002 | Glad | |
| 6,499,359 B1 | 12/2002 | Washeleski et al. | |
| 6,522,083 B1 | 2/2003 | Roach | |
| 6,522,128 B1 | 2/2003 | Ely et al. | |
| 6,522,187 B1 | 2/2003 | Sousa | |
| 6,523,416 B2 | 2/2003 | Takagi et al. | |
| 6,529,015 B2 | 3/2003 | Nonoyama et al. | |
| 6,534,970 B1 | 3/2003 | Ely et al. | |
| 6,535,200 B2 | 3/2003 | Philipp | |
| 6,570,557 B1 | 5/2003 | Westerman et al. | |
| 6,574,095 B2 | 6/2003 | Suzuki | |
| 6,577,140 B1 | 6/2003 | Wenman | |
| 6,583,632 B2 | 6/2003 | Von Basse et al. | |
| 6,587,093 B1 | 7/2003 | Shaw et al. | |
| 6,597,347 B1 | 7/2003 | Yasutake | |
| 6,610,936 B2 | 8/2003 | Gillespie et al. | |
| 6,614,313 B2 | 9/2003 | Crofts et al. | |
| 6,639,586 B2 | 10/2003 | Gerpheide | |
| 6,642,857 B1 | 11/2003 | Schediwy et al. | |
| 6,649,924 B1 | 11/2003 | Philipp et al. | |
| 6,667,740 B2 | 12/2003 | Ely et al. | |
| 6,673,308 B2 | 1/2004 | Hino et al. | |
| 6,677,758 B2 | 1/2004 | Maki et al. | |
| 6,677,932 B1 | 1/2004 | Westerman | |
| 6,680,731 B2 | 1/2004 | Gerpheide et al. | |
| 6,683,462 B2 | 1/2004 | Shimizu | |
| 6,704,005 B2 | 3/2004 | Kato et al. | |
| 6,705,511 B1 | 3/2004 | Dames et al. | |
| 6,720,777 B2 | 4/2004 | Wang | |
| 6,731,121 B1 | 5/2004 | Hsu et al. | |
| 6,744,258 B2 | 6/2004 | Ishio et al. | |
| 6,768,420 B2 | 7/2004 | McCarthy et al. | |
| 6,781,577 B2 | 8/2004 | Shigetaka | |
| 6,806,693 B1 | 10/2004 | Bron | |
| 6,810,442 B1 | 10/2004 | Lin et al. | |
| 6,825,673 B1 | 11/2004 | Yamaoka | |
| 6,825,890 B2 | 11/2004 | Matsufusa | |
| 6,829,727 B2 | 12/2004 | Pawloski | |
| 6,838,887 B2 | 1/2005 | Denen et al. | |
| 6,861,961 B2 | 3/2005 | Sandbach et al. | |
| 6,879,215 B1 | 4/2005 | Roach | |
| 6,882,338 B2 | 4/2005 | Flowers | |
| 6,888,536 B2 | 5/2005 | Westerman et al. | |
| 6,891,531 B2 | 5/2005 | Lin | |
| 6,897,673 B2 | 5/2005 | Savage et al. | |
| 6,914,547 B1 | 7/2005 | Swaroop et al. | |
| 6,933,873 B1 | 8/2005 | Horsley et al. | |
| 6,940,291 B1 | 9/2005 | Ozick | |
| 6,946,853 B2 | 9/2005 | Gifford et al. | |
| 6,949,937 B2 | 9/2005 | Knoedgen | |
| 6,958,594 B2 | 10/2005 | Redl et al. | |
| 6,970,126 B1 | 11/2005 | O'Dowd et al. | |
| 6,993,607 B2 | 1/2006 | Philipp | |
| 6,999,009 B2 | 2/2006 | Monney | |
| 7,002,557 B2 | 2/2006 | Iizuka et al. | |
| 7,006,078 B2 | 2/2006 | Kim | |
| 7,006,938 B2 | 2/2006 | Laraia et al. | |
| 7,030,860 B1 | 4/2006 | Hsu et al. | |
| 7,032,051 B2 | 4/2006 | Reay et al. | |
| 7,068,039 B2 | 6/2006 | Parker | |
| 7,075,316 B2 | 7/2006 | Umeda et al. | |
| 7,075,864 B2 | 7/2006 | Kakitsuka et al. | |
| 7,098,675 B2 | 8/2006 | Inaba et al. | |
| 7,129,714 B2 | 10/2006 | Baxter | |
| 7,151,276 B2 | 12/2006 | Gerlach et al. | |
| 7,158,056 B2 | 1/2007 | Wright et al. | |
| 7,158,125 B2 | 1/2007 | Sinclair et al. | |

| | | |
|---|---|---|
| 7,202,857 B2 | 4/2007 | Hinckley et al. |
| 7,205,777 B2 | 4/2007 | Schulz et al. |
| 7,225,090 B2 | 5/2007 | Coley |
| 7,245,131 B2 | 7/2007 | Kurachi et al. |
| 7,253,643 B1 | 8/2007 | Seguine |
| 7,254,775 B2 | 8/2007 | Geaghan et al. |
| 7,256,588 B2 | 8/2007 | Howard et al. |
| 7,271,608 B1 | 9/2007 | Vermeire et al. |
| 7,288,946 B2 | 10/2007 | Hargreaves et al. |
| 7,301,350 B2 * | 11/2007 | Hargreaves et al. ......... 324/678 |
| 7,307,485 B1 | 12/2007 | Snyder et al. |
| 7,312,616 B2 | 12/2007 | Snyder |
| 7,323,879 B2 | 1/2008 | Kuo et al. |
| 7,333,090 B2 | 2/2008 | Tanaka et al. |
| 7,359,816 B2 | 4/2008 | Kumar et al. |
| 7,375,535 B1 | 5/2008 | Kutz et al. |
| 7,381,031 B2 | 6/2008 | Kawaguchi et al. |
| 7,392,431 B2 | 6/2008 | Swoboda |
| 7,439,962 B2 | 10/2008 | Reynolds et al. |
| 7,479,788 B2 | 1/2009 | Bolender et al. |
| 7,495,659 B2 | 2/2009 | Marriott et al. |
| 7,504,833 B1 | 3/2009 | Seguine |
| 7,515,140 B2 | 4/2009 | Philipp |
| RE40,867 E | 8/2009 | Binstead |
| 7,598,752 B2 | 10/2009 | Li |
| 7,598,822 B2 | 10/2009 | Rajagopal et al. |
| 7,667,468 B1 | 2/2010 | Anderson |
| 7,804,307 B1 | 9/2010 | Bokma et al. |
| 7,812,829 B2 | 10/2010 | Gillespie et al. |
| 7,821,274 B2 | 10/2010 | Philipp |
| 7,911,456 B2 | 3/2011 | Gillespie et al. |
| 8,040,142 B1 | 10/2011 | Bokma et al. |
| 8,089,288 B1 | 1/2012 | Maharita |
| 8,089,289 B1 | 1/2012 | Kremin et al. |
| 8,093,914 B2 | 1/2012 | Maharyta |
| 2001/0012667 A1 | 8/2001 | Ma et al. |
| 2002/0000978 A1 | 1/2002 | Gerpheide |
| 2002/0067348 A1 | 6/2002 | Masters et al. |
| 2002/0109035 A1 | 8/2002 | Denen et al. |
| 2002/0136372 A1 | 9/2002 | Bozorgui-Nesbat |
| 2002/0140440 A1 | 10/2002 | Haase |
| 2003/0014239 A1 | 1/2003 | Ichbiah et al. |
| 2003/0025679 A1 | 2/2003 | Taylor et al. |
| 2003/0063073 A1 | 4/2003 | Geaghan et al. |
| 2003/0063428 A1 | 4/2003 | Nishi |
| 2003/0076306 A1 | 4/2003 | Zadesky et al. |
| 2003/0091220 A1 | 5/2003 | Sato et al. |
| 2003/0098858 A1 | 5/2003 | Perski et al. |
| 2003/0112021 A1 | 6/2003 | Palata et al. |
| 2003/0156098 A1 | 8/2003 | Shaw et al. |
| 2003/0160808 A1 | 8/2003 | Foote et al. |
| 2003/0178675 A1 | 9/2003 | Nishizaka et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2003/0189419 A1 | 10/2003 | Maki et al. |
| 2003/0230438 A1 | 12/2003 | Keefer et al. |
| 2003/0232507 A1 | 12/2003 | Chen |
| 2004/0041798 A1 | 3/2004 | Kim |
| 2004/0068409 A1 | 4/2004 | Tanaka et al. |
| 2004/0082198 A1 | 4/2004 | Nakamura et al. |
| 2004/0169594 A1 | 9/2004 | Ely et al. |
| 2004/0178997 A1 | 9/2004 | Gillespie et al. |
| 2004/0183560 A1 | 9/2004 | Savage et al. |
| 2004/0217945 A1 | 11/2004 | Miyamoto et al. |
| 2004/0239616 A1 | 12/2004 | Collins |
| 2004/0239650 A1 | 12/2004 | Mackey |
| 2004/0252109 A1 | 12/2004 | Trent et al. |
| 2004/0263864 A1 | 12/2004 | Lukacs et al. |
| 2005/0021269 A1 | 1/2005 | Ely et al. |
| 2005/0031175 A1 | 2/2005 | Hara et al. |
| 2005/0062732 A1 | 3/2005 | Sinclair et al. |
| 2005/0073302 A1 | 4/2005 | Hibbs et al. |
| 2005/0073322 A1 | 4/2005 | Hibbs et al. |
| 2005/0083110 A1 | 4/2005 | Latham, II et al. |
| 2005/0099188 A1 | 5/2005 | Baxter |
| 2005/0159126 A1 | 7/2005 | Wang |
| 2005/0169768 A1 | 8/2005 | Kawaguchi et al. |
| 2005/0179668 A1 | 8/2005 | Edwards |
| 2005/0270273 A1 | 12/2005 | Marten |
| 2005/0275382 A1 | 12/2005 | Stessman et al. |
| 2005/0280639 A1 | 12/2005 | Taylor et al. |
| 2005/0283330 A1 | 12/2005 | Laraia et al. |
| 2006/0022660 A1 | 2/2006 | Itoh |
| 2006/0026535 A1 | 2/2006 | Hotelling et al. |
| 2006/0033508 A1 | 2/2006 | Lee |
| 2006/0033724 A1 | 2/2006 | Chaudhri et al. |
| 2006/0049834 A1 | 3/2006 | Umeda |
| 2006/0053387 A1 | 3/2006 | Ording |
| 2006/0066582 A1 | 3/2006 | Lyon et al. |
| 2006/0066585 A1 | 3/2006 | Lin |
| 2006/0097991 A1 | 5/2006 | Hotelling et al. |
| 2006/0097992 A1 | 5/2006 | Gitzinger et al. |
| 2006/0108349 A1 | 5/2006 | Finley et al. |
| 2006/0113974 A1 | 6/2006 | Kan et al. |
| 2006/0114247 A1 | 6/2006 | Brown |
| 2006/0139469 A1 | 6/2006 | Yokota et al. |
| 2006/0152739 A1 | 7/2006 | Silvestre |
| 2006/0164142 A1 | 7/2006 | Stanley |
| 2006/0172767 A1 | 8/2006 | Cathey et al. |
| 2006/0176718 A1 | 8/2006 | Itoh |
| 2006/0187214 A1 | 8/2006 | Gillespie et al. |
| 2006/0193156 A1 | 8/2006 | Kaishita et al. |
| 2006/0197750 A1 | 9/2006 | Kerr et al. |
| 2006/0197752 A1 | 9/2006 | Hurst et al. |
| 2006/0227117 A1 | 10/2006 | Proctor |
| 2006/0232559 A1 | 10/2006 | Chien et al. |
| 2006/0258390 A1 | 11/2006 | Cui et al. |
| 2006/0262101 A1 | 11/2006 | Layton et al. |
| 2006/0290678 A1 | 12/2006 | Lii |
| 2007/0046299 A1 | 3/2007 | Hargreaves et al. |
| 2007/0069274 A1 | 3/2007 | Elsass et al. |
| 2007/0074913 A1 | 4/2007 | Geaghan et al. |
| 2007/0076897 A1 | 4/2007 | Philipp |
| 2007/0100566 A1 | 5/2007 | Coley |
| 2007/0132737 A1 | 6/2007 | Mulligan et al. |
| 2007/0152983 A1 | 7/2007 | McKillop et al. |
| 2007/0173220 A1 | 7/2007 | Kim et al. |
| 2007/0176609 A1 | 8/2007 | Ely et al. |
| 2007/0176903 A1 | 8/2007 | Dahlin et al. |
| 2007/0229469 A1 | 10/2007 | Seguine |
| 2007/0263191 A1 | 11/2007 | Shibazaki |
| 2007/0268265 A1 | 11/2007 | Xiaoping |
| 2007/0273659 A1 | 11/2007 | Xiaoping et al. |
| 2007/0291013 A1 | 12/2007 | Won |
| 2007/0296709 A1 | 12/2007 | Guanghai |
| 2008/0007534 A1 | 1/2008 | Peng et al. |
| 2008/0024455 A1 | 1/2008 | Lee et al. |
| 2008/0036473 A1 | 2/2008 | Jansson |
| 2008/0041640 A1 | 2/2008 | Gillespie et al. |
| 2008/0047764 A1 | 2/2008 | Lee |
| 2008/0062140 A1 | 3/2008 | Hotelling et al. |
| 2008/0088595 A1 | 4/2008 | Liu et al. |
| 2008/0111714 A1 | 5/2008 | Kremin |
| 2008/0158178 A1 | 7/2008 | Hotelling et al. |
| 2008/0165134 A1 | 7/2008 | Krah |
| 2008/0179112 A1 | 7/2008 | Qin et al. |
| 2008/0196945 A1 | 8/2008 | Konstas |
| 2008/0266263 A1 | 10/2008 | Motaparti et al. |
| 2009/0002206 A1 | 1/2009 | Kremin |
| 2009/0096758 A1 | 4/2009 | Hotelling et al. |
| 2009/0153152 A1 | 6/2009 | Maharyta et al. |

FOREIGN PATENT DOCUMENTS

| | | |
|---|---|---|
| JP | 04012528 | 1/1992 |
| JP | 5283519 | 10/1993 |
| JP | 6104334 | 4/1994 |
| JP | 6163528 | 6/1994 |
| WO | 0002188 A | 1/2000 |

OTHER PUBLICATIONS

Dave Van Ess, "Understanding Switched Capacitor Analog Blocks", Cypress Application Note AN2041, Revision B, Mar. 30, 2004, pp. 1-16.

Dennis Seguine, "Capacitive Switch Scan", Cypress Application note AN2233a, Revision B, Apr. 14, 2005, pp. 1-6.

Ryan Seguine, et al., "Layout Guidelines for PSoC™ CapSense™", Cypress Application Note AN2292, Revision B, Oct. 31, 2005, pp. 1-15.

Sigma-Delta ADCs and DACs, AN-283 Application Note, Analog Devices, 16 pages, 1993. downloaded from http://www.analog.com/UploadedFiles/Application_Notes/292524291525717245054923680458171AN283.pdf.

Dave Van Ess, "Understanding Switched Capacitor Analog Blocks", AN2041, Application Note, Mar. 30, 2004, 16 pages.

Dennis Seguine, "Capacitive Switch Scan", AN2233a, Application Note, CY8C21x34, Apr. 7, 2005, 6 pages.

Mark Lee, "CapSense Best Practices", AN2394, Application Note, Oct. 19, 2006, 10 pages.

CSD User Module Data Sheet, CSD v1.0, Oct. 23, 2006, 58 pages.

Vladislav Golub, Ph.D., Sigma-delta ADCs, publication date Jun. 17, 2003, 10 pages.

Sangil Park, Ph.D., "Motorola Digital Signal Processors, Principles of Sigma-Delta Modulation for Analog-to-Digital Converters", APR8/D Rev. 1. downloaded from: http://digitalsignallabs.com/SigmaDelta.pdf ,Mar. 1997.

USPTO Notice of Allowance for U.S. Appl. No. 11/489,944, dated Apr. 9, 2007; 7 pages.

USPTO Non-Final Rejection for U.S. Appl. No. 11/442,212 dated Feb. 25, 2011; 13 pages.

USPTO Non-Final Rejection for U.S. Appl. No. 12/861,812 dated Apr. 15, 2011; 26 pages.

USPTO Notice of Allowance for U.S. Appl. No. 12/167,100 dated Sep. 1, 2011; 8 pages.

USPTO Notice of Allowance for U.S. Appl. No. 12/167,100, dated Jun. 28, 2011; 8 pages.

USPTO Notice of Allowance for U.S. Appl. No. 12/167,100 dated Apr. 29, 2011; 8 pages.

USPTO Notice of Allowance for U.S. Appl. No. 12/167,100 dated Jan. 12, 2011; 8 pages.

USPTO Notice of Allowance for U.S. Appl. No. 12/167,100 dated Sep. 30, 2010; 7 pages.

Requirement for Restriction for U.S. Appl. No. 12/167,100 dated Aug. 20, 2010; 6 pages.

U.S. Appl. No. 12/380,141 "Compensation Circuit for a TX-RX Capacitive Sensor", filed Feb. 23, 2009, 50 pages.

USPTO Final Rejection, U.S. Appl. No. 11/729,818, dated Jul. 2, 2009, 30 pages.

USPTO Non-Final Rejection, U.S. Appl. No. 11/824,249, dated Mar. 30, 2012, 14 pages.

USPTO Final Rejection, U.S. Appl. No. 12/861,812, dated Oct. 18, 2011, 16 pages.

USPTO Notice of Allowance, U.S. Appl. No. 11/823,982, dated May 14, 2010, 32 pages.

USPTO Restriction Requirement, U.S. Appl. No. 12/380,141, dated Jul. 8, 2011, 7 pages.

USPTO Non-Final Rejection, U.S. Appl. No. 12/380,141, dated Sep. 19, 2011, 18 pages.

USPTO Notice of Allowance, U.S. Appl. No. 12/380,141, dated Jan. 26, 2012, 9 pages.

USPTO Notice of Allowance, U.S. Appl. No. 12/380,141, dated Apr. 10, 2012, 14 pages.

U.S. Appl. No. 11/824,249 "Noise Resistant Capacitive Sensor", filed Jun. 29, 2007, 44 pages.

USPTO Final Rejection for U.S. Appl. No. 11/395,417 dated Apr. 24, 2007; 9 pages.

USPTO Final Rejection for U.S. Appl. No. 11/437,517 dated Jan. 26, 2010; 11 pages.

USPTO Final Rejection for U.S. Appl. No. 11/442,212 dated Jun. 7, 2011; 14 pages.

USPTO Final Rejection for U.S. Appl. No. 11/442,212 dated Oct. 2, 2009; 12 pages.

USPTO Final Rejection for U.S. Appl. No. 11/442,212 dated Oct. 13, 2010; 13 pages.

USPTO Final Rejection for U.S. Appl. No. 11/477,179 dated Apr. 1, 2010; 10 pages.

USPTO Final Rejection for U.S. Appl. No. 11/477,179 dated Nov. 24, 2010; 10 pages.

USPTO Final Rejection for U.S. Appl. No. 11/484,085 dated Mar. 16, 2010; 7 pages.

USPTO Final Rejection for U.S. Appl. No. 11/502,267 dated Feb. 3, 2009; 10 pages.

USPTO Final Rejection for U.S. Appl. No. 11/512,042 dated Dec. 21, 2010; 7 pages.

USPTO Final Rejection for U.S. Appl. No. 11/600,896 dated Sep. 30, 2010; 19 pages.

USPTO Final Rejection for U.S. Appl. No. 11/601,465 dated May 28, 2010; 12 pages.

USPTO Final Rejection for U.S. Appl. No. 11/709,897 dated Jul. 29, 2010; 24 pages.

USPTO Final Rejection for U.S. Appl. No. 11/983,291 dated Aug. 12, 2009; 10 pages.

USPTO Final Rejection for U.S. Appl. No. 12/166,228 dated Jan. 4, 2011; 9 pages.

USPTO Final Rejection for U.S. Appl. No. 12/166,228 dated May 28, 2010; 12 pages.

USPTO Final Rejection for U.S. Appl. No. 12/239,692 dated May 9, 2011; 10 pages.

USPTO Final Rejection for U.S. Appl. No. 12/367,279 dated Apr. 1, 2010; 6 pages.

USPTO Final Rejection, U.S. Appl. No. 11/512,042, dated Jan. 21, 2010, 7 pages.

USPTO Final Rejection, U.S. Appl. No. 11/601,465, dated Mar. 6, 2009, 13 pages.

USPTO Final Rejection, U.S. Appl. No. 11/601,465, dated Jul. 9, 2008, 16 pages.

USPTO Final Rejection, U.S. Appl. No. 11/729,818, dated Jul. 2, 2009, 14 pages.

USPTO Final Rejection, U.S. Appl. No. 11/824,249, dated Dec. 22, 2011, 12 pages.

USPTO Final Rejection, U.S. Appl. No. 12/332,980, dated May 31, 2011, 12 pages.

USPTO Final Rejection, U.S. Appl. No. 12/861,812, dated Oct. 18, 2011, 10 pages.

USPTO Non-Final Rejection for U.S. Appl. No. 09/975,105 dated Jan. 19, 2006; 5 pages.

USPTO Non-Final Rejection for U.S. Appl. No. 09/975,105 dated Apr. 19, 2005; 9 pages.

USPTO Non-Final Rejection for U.S. Appl. No. 11/230,719 dated Jan. 16, 2007; 8 pages.

USPTO Non-Final Rejection for U.S. Appl. No. 11/230,719 dated May 11, 2006; 5 pages.

USPTO Non-Final Rejection for U.S. Appl. No. 11/230,719 dated May 25, 2007; 6 pages.

USPTO Non-Final Rejection for U.S. Appl. No. 11/230,719 dated Aug. 28, 2006; 7 pages.

USPTO Non-Final Rejection for U.S. Appl. No. 11/273,708 dated Mar. 19, 2007; 16 pages.

USPTO Non-Final Rejection for U.S. Appl. No. 11/337,272 dated May 17, 2007; 11 pages.

USPTO Non-Final Rejection for U.S. Appl. No. 11/337,272 dated Oct. 24, 2006; 9 pages.

USPTO Non-Final Rejection for U.S. Appl. No. 11/395,417 dated Apr. 25, 2008; 7 pages.

USPTO Non-Final Rejection for U.S. Appl. No. 11/395,417 dated Oct. 26, 2006; 13 pages.

USPTO Non-Final Rejection for U.S. Appl. No. 11/395,417 dated Nov. 1, 2007; 8 pages.

USPTO Non-Final Rejection for U.S. Appl. No. 11/437,517 dated Aug. 3, 2010; 10 pages.

USPTO Non-Final Rejection for U.S. Appl. No. 11/437,517 dated Aug. 5, 2009; 9 pages.

USPTO Non-Final Rejection for U.S. Appl. No. 11/442,212 dated Mar. 31, 2009;12 pages.

USPTO Non-Final Rejection for U.S. Appl. No. 11/442,212 dated Jul. 6, 2010; 13 pages.

USPTO Non-Final Rejection for U.S. Appl. No. 11/473,517 dated Aug. 3, 2010; 10 pages.

USPTO Non-Final Rejection for U.S. Appl. No. 11/477,179 dated Jun. 9, 2009; 13 pages.

USPTO Non-Final Rejection for U.S. Appl. No. 11/477,179 dated Jul. 20, 2010; 10 pages.
USPTO Non-Final Rejection for U.S. Appl. No. 11/477,179 dated Nov. 18, 2009; 10 pages.
USPTO Non-Final Rejection for U.S. Appl. No. 11/484,085 dated Sep. 17, 2009; 8 pages.
USPTO Non-Final Rejection for U.S. Appl. No. 11/493,350 dated Jun. 16, 2010; 8 pages.
USPTO Non-Final Rejection for U.S. Appl. No. 11/493,350 dated Nov. 9, 2010; 9 pages.
USPTO Non-Final Rejection for U.S. Appl. No. 11/502,267 dated Aug. 11, 2008; 10 pages.
USPTO Non-Final Rejection for U.S. Appl. No. 11/600,896, dated May 14, 2010; 15 pages.
USPTO Notice of Allowance, U.S. Appl. No. 11/601,465, dated Oct. 7, 2011, 19 pages.
USPTO Notice of Allowance, U.S. Appl. No. 11/601,465, dated Nov. 26, 2010, 16 pages.
USPTO Notice of Allowance, U.S. Appl. No. 11/729,818, dated Jan. 26, 2011, 12 pages.
USPTO Notice of Allowance, U.S. Appl. No. 11/729,818, dated May 9, 2011, 22 pages.
USPTO Notice of Allowance, U.S. Appl. No. 11/729,818, dated Jun. 9, 2011, 13 pages.
USPTO Notice of Allowance, U.S. Appl. No. 11/729,818, dated Oct. 5, 2010, 33 pages.
USPTO Notice of Allowance, U.S. Appl. No. 11/729,818, dated Nov. 13, 2009, 29 pages.
USPTO Notice of Allowance, U.S. Appl. No. 11/729,818, dated Feb. 24, 2010, 33 pages.
USPTO Notice of Allowance, U.S. Appl. No. 11/729,818, dated Jun. 25, 2010, 39 pages.
USPTO Notice of Allowance, U.S. Appl. No. 11/823,982, dated Feb. 1, 2010, 30 pages.
USPTO Notice of Allowance, U.S. Appl. No. 11/823,982, dated May 14, 2010, 8 pages.
USPTO Notice of Allowance, U.S. Appl. No. 11/823,982, dated Oct. 6, 2009, 22 pages.
USPTO Notice of Allowance, U.S. Appl. No. 12/332,980, dated Oct. 4, 2011, 13 pages.
USPTO Notice of Allowance, U.S. Appl. No. 13/047,620, dated Apr. 11, 2012, 19 pages.
USPTO Requirement for Restriction for U.S. Appl. No. 12/239,692 dated Sep. 27, 2010; 7 pages.
USPTO Requirement for Restriction for U.S. Appl. No. 12/380,141 dated Jul. 8, 2011; 6 pages.
USPTO Requirement for Restriction for U.S. Appl. No. 12/395,462 dated May 13, 2011; 6 pages.
USPTO Requirement for Restriction/Election for U.S. Appl. No. 11/337,272 dated Sep. 11, 2006; 5 pages.
USPTO Requirement Restriction for U.S. Appl. No. 11/824,249 dated Feb. 17, 2011; 5 pages.
USPTO Restriction Requirement, U.S. Appl. No. 11/601,465, dated Nov. 1, 2007, 7 pages.
USPTO Restriction Requirement, U.S. Appl. No. 11/824,249, dated Feb. 17, 2011, 6 pages.
USPTO Restriction Requirement, U.S. Appl. No. 13/047,620, dated Feb. 27, 2012, 7 pages.
Vladislav Golub, Ph.D., "Sigma-Delta ADCs", pub. date: Jun. 17, 2003, 10 pages.
Wikipedia, The Free Encyclopedia, "IBM PC Keyboard," <http://en.wikipedia.org/wiki/PC_keyboard> accessed May 19, 2006; 3 pages.
Written Opinion of the International Searching Authority for International Application No. PCT/US08/60696 dated Sep. 22, 2008; 4 pages.
Written Opinion of the International Searching Authority for International Application No. PCT/US2008/013622 mailed Feb. 9, 2009; 5 pages.
USPTO Non-Final Rejection for U.S. Appl. No. 11/600,896 dated Dec. 16, 2009; 13 pages.
USPTO Non-Final Rejection for U.S. Appl. No. 11/700,314 dated Mar. 26, 2010; 7 pages.
USPTO Non-Final Rejection for U.S. Appl. No. 11/709,897 dated Feb. 16, 2010; 21 pages.
USPTO Non-Final Rejection for U.S. Appl. No. 11/823,982 dated Mar. 19, 2009; 14 pages.
USPTO Non-Final Rejection for U.S. Appl. No. 11/824,249 dated May 25, 2011; 9 pages.
USPTO Non-Final Rejection for U.S. Appl. No. 11/880,963 dated Jun. 12, 2009; 10 pages.
USPTO Non-Final Rejection for U.S. Appl. No. 11/967,243 dated Sep. 17, 2009; 9 pages.
USPTO Non-Final Rejection for U.S. Appl. No. 11/983,291 dated Mar. 9, 2009; 9 pages.
USPTO Non-Final Rejection for U.S. Appl. No. 12/040,387 dated Jun. 30, 2011; 12 pages.
USPTO Non-Final Rejection for U.S. Appl. No. 12/166,228 dated Aug. 11, 2010; 8 pages.
USPTO Non-Final Rejection for U.S. Appl. No. 12/166,228 dated Dec. 30, 2009; 11 pages.
USPTO Non-Final Rejection for U.S. Appl. No. 12/239,692 dated Nov. 29, 2010; 9 pages.
USPTO Non-Final Rejection for U.S. Appl. No. 12/367,279 dated Oct. 29, 2009; 8 pages.
USPTO Non-Final Rejection for U.S. Appl. No. 12/395,462 dated Aug. 23, 2011; 5 pages.
USPTO Non-Final Rejection for U.S. Appl. No. 12/606,147 dated Aug. 23, 2011; 6 pages.
USPTO Non-Final Rejection, U.S. Appl. No. 11/512,042, dated Jul. 13, 2010, 14 pages.
USPTO Non-Final Rejection, U.S. Appl. No. 11/601,465, dated Oct. 2, 2008, 16 pages.
USPTO Non-Final Rejection, U.S. Appl. No. 11/601,465, dated Dec. 28, 2007, 16 pages.
USPTO Non-Final Rejection, U.S. Appl. No. 11/729,818, dated Dec. 17, 2008, 37 pages.
USPTO Non-Final Rejection, U.S. Appl. No. 11/823,982, dated Mar. 19, 2009, 21 pages.
USPTO Non-Final Rejection, U.S. Appl. No. 11/824,249, dated Mar. 30, 2012, 10 pages.
USPTO Non-Final Rejection, U.S. Appl. No. 11/824,249, dated May 25, 2011, 12 pages.
USPTO Non-Final Rejection, U.S. Appl. No. 12/332,980, dated Dec. 22, 2010, 20 pages.
USPTO Notice of Allowance for U.S. Appl. No. 09/975,105 dated Dec. 4, 2006; 4 pages.
USPTO Notice of Allowance for U.S. Appl. No. 09/986,338 dated Feb. 16, 2010; 4 pages.
USPTO Notice of Allowance for U.S. Appl. No. 10/888,666 dated Aug. 2, 2006; 11 pages.
USPTO Notice of Allowance for U.S. Appl. No. 11/230,719 dated Jan. 16, 2008; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/395,417 dated Nov. 16, 2008; 7 pages.
USPTO Notice of Allowance for U.S. Appl. No. 11/484,085 dated Jun. 6, 2010; 4 pages.
USPTO Notice of Allowance for U.S. Appl. No. 11/600,255 dated Jul. 27, 2010; 6 pages.
USPTO Notice of Allowance for U.S. Appl. No. 11/700,314 dated Sep. 16, 2010; 8 pages.
USPTO Notice of Allowance for U.S. Appl. No. 11/709,866 dated Feb. 16, 2010; 7 pages.
USPTO Notice of Allowance for U.S. Appl. No. 11/823,982 dated Feb. 1, 2010; 8 pages.
USPTO Notice of Allowance for U.S. Appl. No. 11/823,982 dated Oct. 6, 2009; 12 pages.
USPTO Notice of Allowance for U.S. Appl. No. 11/880,963 dated Oct. 2, 2009; 4 pages.
USPTO Notice of Allowance for U.S. Appl. No. 11/983,291 dated Mar. 9, 2010; 7 pages.

USPTO Notice of Allowance for U.S. Appl. No. 11/983,291 dated Jun. 21, 2010; 7 pages.
USPTO Notice of Allowance for U.S. Appl. No. 11/983,291 dated Sep. 29, 2010; 7 pages.
USPTO Notice of Allowance for U.S. Appl. No. 11/983,291 dated Oct. 22, 2009; 7 pages.
USPTO Notice of Allowance for U.S. Appl. No. 12/166,228 dated Mar. 22, 2011; 8 pages.
USPTO Notice of Allowance for U.S. Appl. No. 12/367,279 dated Aug. 23, 2010; 7 pages.
USPTO Notice of Allowance, U.S. Appl. No. 11/601,465, dated Jan. 11, 2010, 18 pages.
USPTO Notice of Allowance, U.S. Appl. No. 11/601,465, dated Mar. 11, 2011, 17 pages.
USPTO Notice of Allowance, U.S. Appl. No. 11/601,465, dated Apr. 22, 2010, 41 pages.
USPTO Notice of Allowance, U.S. Appl. No. 11/601,465, dated May 8, 2009, 14 pages.
USPTO Notice of Allowance, U.S. Appl. No. 11/601,465, dated Jun. 28, 2011, 21 pages.
USPTO Notice of Allowance, U.S. Appl. No. 11/601,465, dated Aug. 10, 2010, 17 pages.
USPTO Notice of Allowance, U.S. Appl. No. 11/601,465, dated Sep. 10, 2009, 21 pages.
"CSD User Module Data Sheet," CSD v1.0, Oct. 23, 2006; 58 pages.
"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.
"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.
Andrew S. Tanebaum with contributions from James R. Goodman, "Structured Computer Organization", 1999, Prentice Hall, Fourth Edition, pp. 264-288, 359-362.
U.S. Appl. No. 12/861,812 "Capacitance Measurement Systems and Methods", filed Aug. 23, 2010, 24 pages.
U.S. Appl. No. 13/047,620 "Touch Detection Techniques for Capacitive Touch Sense Systems", filed Mar. 14, 2011, 38 pages.
U.S. Appl. No. 13/191,806 "Capacitance Measurement Systems and Methods", filed Jul. 27, 2011, 38 pages.
U.S. Appl. No. 13/342,942 "Capacitive Field Sensor With Sigma-Delta Modulator", filed Jan. 3, 2012, 41 pages.
U.S. Appl. No. 13/345,504 "Compensation Circuit for a TX-RX Capacitive Sensor", filed Jan. 6, 2012, 55 pages.
U.S. Appl. No. 13/049,798: "Capacitance to Code Converter With Sigma-Delta Modulator," Kremin, filed Mar. 16, 2011; 77 pages.
U.S. Appl. No. 11/493,350: "Technique for Increasing the Sensitivity of Capacitive Sensor Arrays," Lee et al., filed Jul. 25, 2006; 48 pages.
U.S. Appl. No. 11/709,897: "Preventing Unintentional Activation of a Sensor Element of a Sensing Device," Jason Konstas; filed Feb. 21, 2007; 97 pages.
U.S. Appl. No. 12/197,466: "Radical Oxidation Process for Fabricating a Nonvolatile Charge Trap Memory Device," Ramkumar et al., filed Aug. 25, 2008; 68 pages.
U.S. Appl. No. 12/380,141: "Capacitive field sensor with sigma-delta modulator," Rystun et al., filed Feb. 23, 2009; 48 pages.
U.S. Appl. No. 12/618,661: "Automatic Tuning of a Capacitive Sensing Device," Dana Olson, filed Nov. 13, 2009; 30 pages.
U.S. Appl. No. 60/220,921: "Method for Automatically Tuning a Capacitive Sensing Device," Dana Olson, filed Jun. 26, 2009; 13 pages.
Cypress Semiconductor Corp., "PSoC Mixed Signal Controllers", Product Descriptioin, http://www.cypress.com/portal/server.pt?space=CommunityPage . . . , Sep. 27, 2005, pp. 1-2.
Dave Van Ess, "Understanding Switched Capacitor Analog Blocks," Application Note AN2041, Mar. 30, 2004; 16 pages.
Dennis Seguine, "Capacitive Switch Scan," AN2233a, Application Note, CY8C21x34, Apr. 7, 2005; 6 pages.
Golub, V., "Sigma-delta ADCs", Publication date Jun. 17, 2003, 10 pages.

International Search Report and Written Opinion of the International Searching Authority for International Application No. PCT/US08106627, filed May 23, 2008 and mailed Aug. 26, 2008.
International Search Report and Written Opinion of the International Searching Authority for International Application No. PCT/US08106627, filed on May 23, 2008 and mailed on Aug. 26, 2008.
International Search Report for International Application No. PCT/US05/23468 dated Aug. 25, 2006; 2 pages.
International Search Report of the International Searching Authority for International Application No. PCT/US2008/013622 mailed Feb. 9, 2009; 2pages.
International Search Report of the International Searching Authority, dated Feb. 9, 2009 for International Application No. PCTUS2008/013622; 2 pages.
Kremin, V. "Noise resistant capacitive sensor," US Patent Application Serial No. 11/8244249 filed Jun. 29, 2007.
Larry K. Baxter, "Capactive Sensors, Design and Applications," IEEE Press, The Institute of Electrical and Electronics Engineers Inc., Aug. 1996, pp. 177-187; 12 pages.
Mack, Chris, "Semiconductor Lithography—The Basic Process", Gentleman Scientist, downloaded Apr. 20, 2006, 12 pages, http://lithoguru.com/scientist/lithobasics.html.
Mark Lee, "CapSense Best Practice", Cypress Application Note AN2394, Rev. **, Oct. 19, 2006, pp. 1-10.
Milton Ohring, "The Materials Science of Thin Films: Deposition and Structure," 2nd Edition, Academic Press, 2002, pp. 336-337; 4 pages.
Min et al., "Offset Compensation of Capacitive Sensors for Electrostatic Microactuators," ISIE 2001, IEEE, Pusan Korea, pp. 2114-2117; 4 pages.
Ryan Seguine et al, "Layout Guidelines for PSoC CapSense", Cypress Application Note AN2292, Revision B, Oct. 31, 2005, pp. 1-15.
Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.
Sedra, Adel S. et al., "Microelectronic Circuits," 3rd Edition, Oxford University Press, pp. xiii-xx and 861-883, 1991; 20 pages.
The Authoritative Dictionary of IEEE Standards Terms, 2000, IEEE Press Publications, 7th Edition, pp. 1133-1134; 4 pages.
The Written Opinion of the International Searching Authority for International Application No. PCT/US05/23468 dated Aug. 25, 2006; 7 pages.
USPTO Advisory Action for U.S. Appl. No. 11/230,719 dated Nov. 30, 2007; 3 pages.
USPTO Advisory Action for U.S. Appl. No. 11/337,272 dated Apr. 3, 2007; 3 pages.
USPTO Advisory Action for U.S. Appl. No. 11/395,417 dated Jul. 6, 2007; 3 pages.
USPTO Advisory Action for U.S. Appl. No. 11/437,517 dated Apr. 7, 2010; 3 pages.
USPTO Advisory Action for U.S. Appl. No. 11/442,212 dated Jan. 5, 2011; 3 pages.
USPTO Advisory Action for U.S. Appl. No. 11/442,212 dated Dec. 17, 2009; 3 pages.
USPTO Advisory Action for U.S. Appl. No. 11/477,179 dated Jun. 7, 2010; 3 pages.
USPTO Advisory Action for U.S. Appl. No. 11/512,042 dated Feb. 23, 2011; 3 pages.
USPTO Advisory Action for U.S. Appl. No. 12/367,279 dated Jun. 25, 2010; 3 pages.
USPTO Advisory Action, U.S. Appl. No. 12/332,980, dated Aug. 9, 2011, 4 pages.
USPTO Final Rejection for U.S. Appl. No. 09/975,105, dated Jul. 13, 2006; 7 pages.
USPTO Final Rejection for U.S. Appl. No. 11/230,719 dated Sep. 7, 2007; 9 pages.
USPTO Final Rejection for U.S. Appl. No. 11/273,708 dated Jul. 5, 2007; 8 pages.
USPTO Final Rejection for U.S. Appl. No. 11/337,272 dated Feb. 2, 2007; 11 pages.

International Search Report for International Application No. PCT/US08/13622 dated Feb. 9, 2009; 2 pages.

SIPO 1st Office Action for Application No. 200880120802.9 dated Nov. 5, 2012; 6 pages.

USPTO Non-Final Rejection for U.S. Appl. No. 11/824,249 dated Sep. 26, 2012; 11 pages.

USPTO Non-Final Rejection for U.S. Appl. No. 12/380,141 dated Jan. 29, 2013; 6 pages.

USPTO Non-Final Rejection for U.S. Appl. No. 12/380,141 dated Sep. 5, 2012; 6 pages.

USPTO Non-Final Rejection for U.S. Appl. No. 13/612,803 dated Feb. 5, 2013; 7 pages.

USPTO Notice of Allowance for U.S. Appl. No. 11/824,249 dated Mar. 14, 2013; 5 pages.

USPTO Notice of Allowance for U.S. Appl. No. 13/612,803 date Dec. 10, 2012; 8 pages.

Written Opinion of the International Searching Authority for International Application No. PCT/US08/13622 mailed Feb. 9, 2009; 5 pages.

* cited by examiner

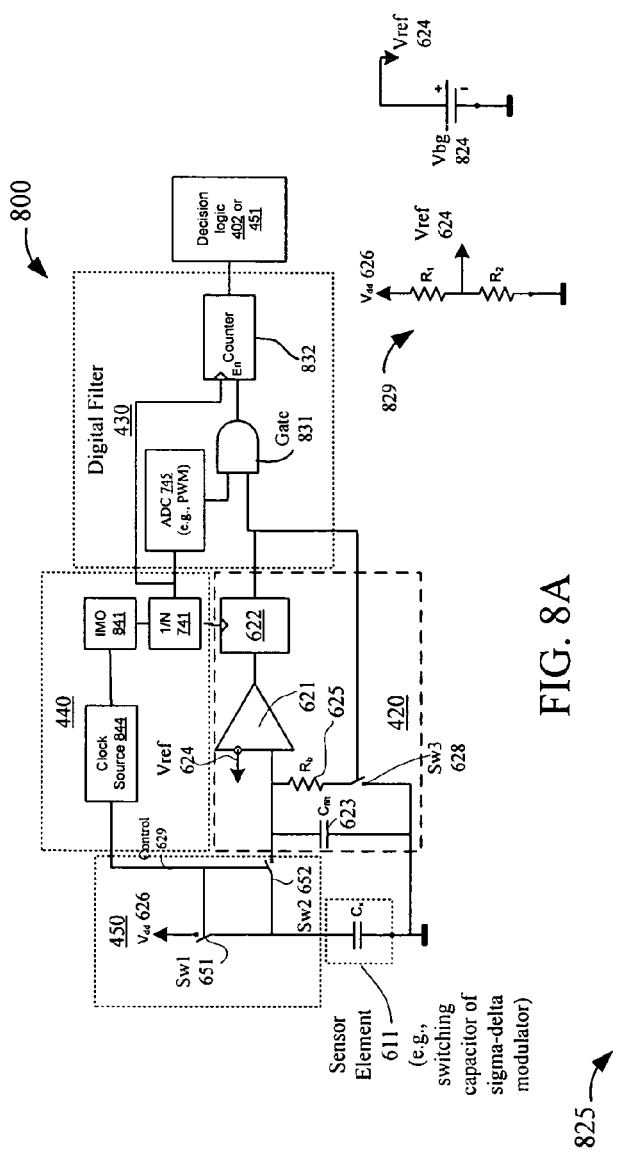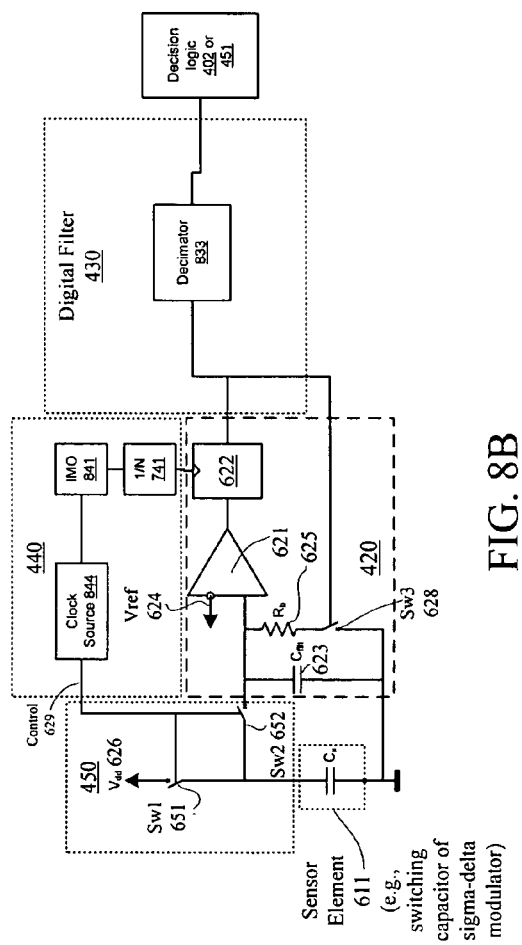
FIG. 8A
FIG. 8B

CAPACITANCE TO CODE CONVERTER WITH SIGMA-DELTA MODULATOR

TECHNICAL FIELD

This invention relates to the field of user interface devices and, in particular, to capacitive touch-sensor devices.

BACKGROUND

Computing devices, such as notebook computers, personal data assistants (PDAs), and mobile handsets, have user interface devices, which are also known as human interface device (HID). One user interface device that has become more common is a touch-sensor pad. A basic notebook touch-sensor pad emulates the function of a personal computer (PC) mouse. A touch-sensor pad is typically embedded into a PC notebook for built-in portability. A touch-sensor pad replicates mouse x/y movement by using two defined axes which contain a collection of sensor elements that detect the position of a conductive object, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touch-screens, touch panels, or touchscreen panels are display overlays which are typically either pressure-sensitive (resistive), electrically-sensitive (capacitive), acoustically-sensitive (SAW—surface acoustic wave) or photo-sensitive (infrared). The effect of such overlays allows a display to be used as an input device, removing the keyboard and/or the mouse as the primary input device for interacting with the display's content. Such displays can be attached to computers or, as terminals, to networks. There are a number of types of touch screen technology, such as optical imaging, resistive, surface wave, capacitive, infrared, dispersive signal, and strain gauge technologies. Touch screens have become familiar in retail settings, on point of sale systems, on ATMs, on mobile handsets, on game consoles, and on PDAs where a stylus is sometimes used to manipulate the graphical user interface (GUI) and to enter data.

FIG. 1A illustrates a conventional touch-sensor pad. The touch-sensor pad 100 includes a sensing surface 101 on which a conductive object may be used to position a pointer in the x- and y-axes, or to select an item on a display. Touch-sensor pad 100 may also include two buttons, left and right buttons 102 and 103, respectively. These buttons are typically mechanical buttons, and operate much like a left and right button on a mouse. These buttons permit a user to select items on a display or send other commands to the computing device.

FIG. 1B illustrates a conventional linear touch-sensor slider. The linear touch-sensor slider 110 includes a surface area 111 on which a conductive object may be used to position a pointer in the x-axes (or alternatively in the y-axes). The construct of touch-sensor slider 110 may be the same as that of touch-sensor pad 100. Touch-sensor slider 110 may include a one-dimensional sensor array. The slider structure may include one or more sensor elements that may be conductive traces. Each trace may be connected between a conductive line and a ground. By being in contact or in proximity on a particular portion of the slider structure, the capacitance between the conductive lines and ground varies and can be detected. The capacitance variation may be sent as a signal on the conductive line to a processing device. For example, by detecting the capacitance variation of each sensor element, the position of the changing capacitance can be pinpointed. In other words, it can be determined which sensor element has detected the presence of the conductive object, and it can also be determined the motion and/or the position of the conductive object over multiple sensor elements.

One difference between touch-sensor sliders and touch-sensor pads may be how the signals are processed after detecting the conductive objects. Another difference is that the touch-sensor slider is not necessarily used to convey absolute positional information of a conducting object (e.g., to emulate a mouse in controlling pointer positioning on a display) but, rather, may be used to actuate one or more functions associated with the sensing elements of the sensing device.

FIG. 1C illustrates a conventional sensing device having three touch-sensor buttons. Conventional sensing device 120 includes button 121, button 122, and button 123. These buttons may be capacitive touch-sensor buttons. These three buttons may be used for user input using a conductive object, such as a finger.

In general, capacitive touch sensors are intended to replace mechanical buttons, knobs, and other similar mechanical user interface controls. Capacitive sensor allows eliminating the complicated mechanical switches and buttons, providing the reliable operation under harsh conditions. Also, capacitive sensors are widely used in the modern customer applications, providing new user interface options in the exiting products.

Many conventional methods exist for capacitance sensing or measuring. Some conventional methods have been briefly described below.

FIG. 1D illustrates a conventional relaxation oscillator for capacitance measurement. The relaxation oscillator 150 is formed by the capacitance to be measured on capacitor 151, a charging current source 152, a comparator 153, and a reset switch 154. It should be noted that capacitor 151 is representative of the capacitance measured on a sensor element of a sensor array. The relaxation oscillator is coupled to drive a charging current (Ic) 157 in a single direction onto sensing capacitor Cx, capacitor 151.

FIG. 1E illustrates a variant of the conventional relaxation oscillator of FIG. 1D. In this case the dedicated reset switch is not used. Relaxation oscillator 160 includes a hysteresis comparator 153, and inverter 161. Comparator 153 operates as similar to the comparator describe above. The inverter 161 is configured to control the switches 162, which are configured to charge and discharge of the sensor element (e.g., capacitor 151).

Using either conventional relaxation oscillators described above, the capacitance change causes the output frequency variation, which can be easily detected, such as using a digital counter. The disadvantage of using these conventional relaxation oscillators is that they operate at a fixed frequency and include high-impedance signal paths (for example, current source that charges small sensing capacitor Cx.

FIG. 1F illustrates another conventional method for measuring capacitance is by phase shift measurement. The circuit 170 includes a voltage source, resistor, and phase shift meter, which are coupled to the capacitance sensor element. The changing of the capacitance on the sensor element varies the phase shift between a reference signal and a measured signal. The output of the phase shift meter can be converted to a code. Driving the capacitance through a fixed-value resistor yields voltage and current waveforms that are out of phase by a predictable amount. The drive frequency can be adjusted to keep the phase measurement in a readily measured range.

FIG. 1G illustrates another conventional capacitance measurement scheme based on charging the sensor capacitor from constant current source. Circuit 180 includes a comparator, a constant current source, and a time measurement circuit, such as a counter or a timer. In this conventional design, the capacitor is charged from the constant current source, and the time required for getting demanded threshold voltage is measured by using the counter or timer. Another similar conventional capacitance sensing device based on charging the sensor capacitor from constant current source charges and discharges the capacitor using the constant current source. A description of this type of conventional design can be found in U.S. Pat. No. 5,294,889.

FIG. 1H illustrates a conventional capacitive voltage divider circuit 190 for capacitance sensing. Capacitive voltage divider. Multiple implementations are possible for the capacitive voltage divider circuit, but FIG. 1H illustrates only one of these implementations. The circuit includes an AC source and two capacitors connected in series. In this case the voltage on sensing capacitor is inversely proportional to the capacitance. Also, illustrated in FIG. 1H, is a method for measuring the capacitance on the capacitance voltage divider circuit using a peak detector 191, as described in U.S. Pat. No. 5,572,205. The voltage can be measured using the synchronous demodulator, peak detector, root mean square (RMS) detector, or other suitable technique. FIG. 1H includes a conventional peak detector circuit 191 for measuring the voltage. It should be noted that in some implementations where a DC source is used instead AC source, the capacitors should be reset before DC voltage applying using some switches.

Two other conventional capacitive measuring schemes are the resistor-capacitor charge timing, capacitive bridge divider. The resistor-capacitor charge timing may include charging the capacitor through a fixed resistor and measuring timing on the voltage ramp. Small capacitor values may require very large resistors for reasonable timing. The capacitive bridge divider may include driving the capacitor under test through a fixed reference capacitor. The reference capacitor and the capacitor under test form a voltage divider. The voltage signal is recovered with a synchronous demodulator, which may be done in a processing device.

Another class of methods for measuring capacitance on a sensor element is switching capacitor methods. In these methods the sensing capacitor is charged at one phase and is discharged to some charge reception device at a second stage. A subclass of this class is charge accumulation. Methods of charge accumulation methods include transferring charge accumulated on the sensing capacitor to the charge-accumulation capacitor or integrator with capacitor in the feedback loop. These methods may have a key advantage in that charge-accumulation circuits have low sensitivity for radio-frequency (RF) fields and noise because the sensing capacitor is charged from a low-impedance source and charge is transferred to a low-impedance accumulator (e.g., integrator capacitor or charge-accumulation capacitor).

FIG. 1I illustrates a conventional charge-accumulation circuit 192. The conventional charge-accumulation circuit 192 includes the sensing circuit 194, the integration capacitor 195, switches 196 and 197, and the voltage source 193. The conventional charge-accumulation circuit 192 is described in U.S. Pat. No. 5,730,165. Switches $SW_1$ and $SW_2$ 196 are operating in the non-overlapping way, providing series of sensing capacitor Cx 194 cycles. Capacitance measurement is implemented in the several steps. First, the integration capacitor $C_{int}$ 195 is reset in the initial stage by using the some external switch $Sw_3$ 197. Next, the switches $Sw_1$, $Sw_2$ 196 start to operate in two non-overlapping phases, providing charge-discharge cycles to the sensing capacitor Cx 194. Consequently, the integration capacitor $C_{int}$ 195 voltage starts rising. The sensed capacitance value is determined by measuring number of cycles, required for the voltage accumulated on the integration capacitor $C_{int}$ 195 to a reference threshold voltage or by measuring the voltage on the integration capacitor $C_{int}$ 195 after a predefined number of charge transfer cycles. In the conventional method, the voltage on the integration capacitor $C_{int}$ 195 is represented by the following Equation (1):

$$V_{Cint} = V_{dd}\left(1 - e^{-N\frac{C_x}{C_{int}}}\right) \quad (1)$$

where the term $V_{Cint}$ is the voltage on the integration capacitor $C_{int}$ 195, the term N is the cycle count, the term $C_x$ is the sensing capacitance value, the term Cint is the integrator capacitor value, and the term $V_{dd}$ is the power supply voltage.

FIG. 1J illustrates another conventional charge-accumulation circuit 198, including an integrator. Charge-accumulation circuit 198 is described in U.S. Pat. No. 6,323,846. The charge-accumulation circuit 198 of FIG. 1J operates similarly to the charge-accumulation circuit 192 of FIG. 1I; however, the integration capacitor voltage rises in the linear way with respect to the number of cycles by placing the integration capacitor in the feedback of an operational amplifier.

FIG. 1K illustrates another conventional charge-accumulation circuit 199, including an integrating low-pass filter. Charge-accumulation circuit 198 is described in U.S. Pat. No. 6,323,846. The charge-accumulation circuit 199 of 90

The charge-accumulation circuit 199 of FIG. 1K operates similarly to the charge-accumulation circuit 192 of FIG. 1I and 198 of FIG. 1J; however, the charge-accumulation circuit 199 operates as capacitance to the voltage converter of the integrating low-pass filter output voltage that is measured by an analog-to-digital (ADC). The conventional charge-accumulation circuit 199 of FIG. 1K requires an additional ADC, which increases the total system complexity and cost. Furthermore, the additional ADC may introduce additional noise, such as quantization noise. Also, an additional operation amplifier is required for the integrator that increases the total cost of implementation.

FIG. 1L illustrates another switching capacitor design, called the successful approximation. Switches SW1 and SW2 and the capacitance sensor CX form a switched capacitor network with an equivalent circuit of a resistor to ground. With the iDAC set to a calibrated level, and SW1 and SW2 switching, the average voltage on CMOD settles at a level that varies with the value of capacitance on the capacitance sensor $C_x$. Setting the iDAC to a low current level with SW2 open, the voltage on CMOD ramps up. The time for the ramp voltage on CMOD to reach VREF is an indication of the value of Cx. The timer on the output of the comparator converts the ramp time to a digital value. Self-calibration of the system is accomplished through a successive approximation binary search to determine iDAC setting necessary to keep voltage on CMOD at VREF when no finger is present. Individual calibrated iDAC settings are stored for all sensors. When a finger is present, the voltage on CMOD settles at a lower voltage, requiring more time to reach the threshold voltage VREF, as shown in FIG. 1M. If (t2-t1) is long enough, the button state is in finger present state, otherwise the button is in the finger absent state.

Other convention charge-accumulation circuits are described in U.S. Pat. No. 6,888,536, U.S. Pat. No. 6,288,707, U.S. Pat. No. 6,570,557, U.S. Pat. No. 6,535,200, U.S. Pat. No. 6,466,036, and U.S. Pat. No. 6,452,514.

The conventional charge-accumulation circuits and methods described above operate in a cycle-based mode (e.g., FIGS. 1I and 1J), including resetting, integrating, measuring. The cycle-based mode does not allow flexibility in changes to the conversion time. The cycle-based mode also does not allow for tracking dynamic capacitance changes, which are common in game accessories, for example.

Most conventional charge accumulation methods have several stages that are executed in series: reset, integrate, and measure. Therefore, in order to track the faster capacitance changes, the conversion time can be reduced by using smaller integration capacitor, which reduces the accuracy as well. Also, the conventional charge accumulation methods can not provide its output to different digital filters at the same time.

Another conventional charge accumulation design includes a sigma-delta modulator for capacitance measurement, as described in U.S. Pat. No. 6,970,126. This design is illustrated in FIG. 1N. This modulator includes the switching signal generator 59 that forms the phase switching signals. These signals are used for setting the sensing capacitor drive switches 86 and 88 for setting levels Vh and Vl during different phases. The sensing capacitor c_sensor is placed between the excitation source switches 86 and 88 and the modulator input switches 44 and 46. The excitation source switches 86 and 88 and the modulator input switches 44 and 46 are controlled by the switching signal generator 59f. The output of the modulator is feedback to the voltage reference 30f to control the polarity of the reference voltage applied to the reference capacitor Cref 24f. The sensing capacitor c_sensor 90f is not in the feedback loop of the modulator. The sensing capacitor charge is integrated using the differential integrator 20 and passed to the zero-cross detector comparator 12. The zero cross detector comparator controls the reference capacitor switching using switches 32/34 and controlled reference voltage source Vref+. The modulator bitstream is passed to the digital filter. The disadvantages of this conventional solution are that this design requires a dual electrode system with excitation source, and the hardware complexity. The two electrode system requires one wire for exciting the sensing capacitor (e.g., excitation bus) and one wire for sensing the capacitance (e.g., sense line). This design can not work in a single wire configuration. Also, the full-scale range of this conventional solution is set by using the reference capacitor Cref value. This makes design less useful for applications when the full scale should be changed dynamically during device operation or large capacitance values need to be measured, taking into account that capacitors require more die space during IC manufacturing. This design requires a multiphase clock source, multiple switches, a differential integrator, a comparator, etc, which increase the hardware complexity, as well as the die space and overall cost of the end design.

BRIEF DESCRIPTION OF THE DRAWINGS

The present invention is illustrated by way of example, and not by way of limitation, in the figures of the accompanying drawings.

FIG. 8A illustrates a schematic of another embodiment of a circuit including a sigma-delta modulator, a clock generation circuit, and a counter-based digital filter for measuring capacitance on a sensor element.

FIG. 8B illustrates a schematic of another embodiment of a circuit including a sigma-delta modulator and a decimator-type digital filter for measuring capacitance on a sensor element.

DETAILED DESCRIPTION

Figure 1A:
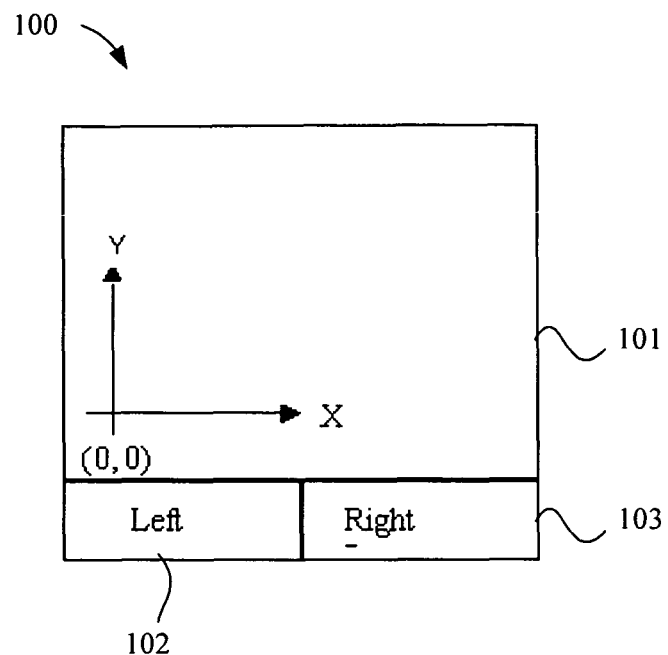
FIG. 1A illustrates a conventional touch-sensor pad.
Figure 1B:
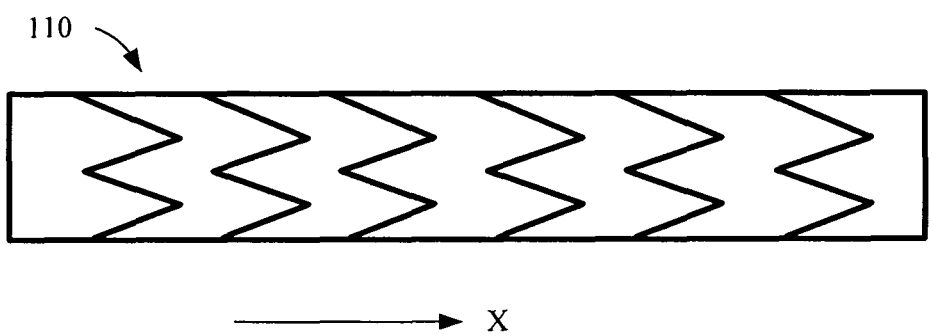
FIG. 1B illustrates a conventional linear touch-sensor slider.
Figure 1C:
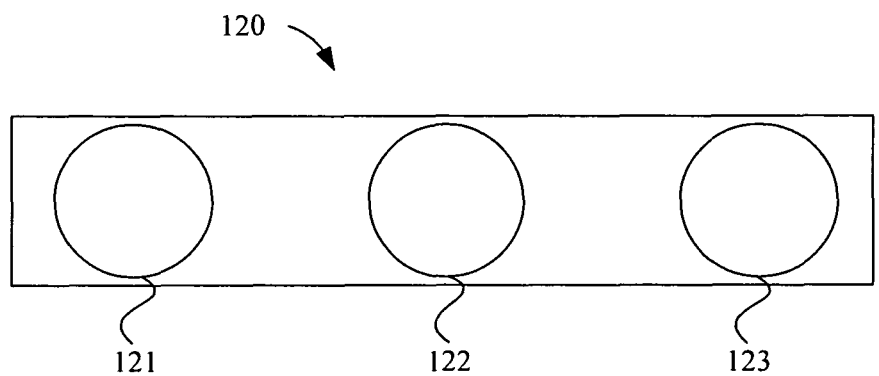
FIG. 1C illustrates a conventional sensing device having three touch-sensor buttons.
Figure 1D:
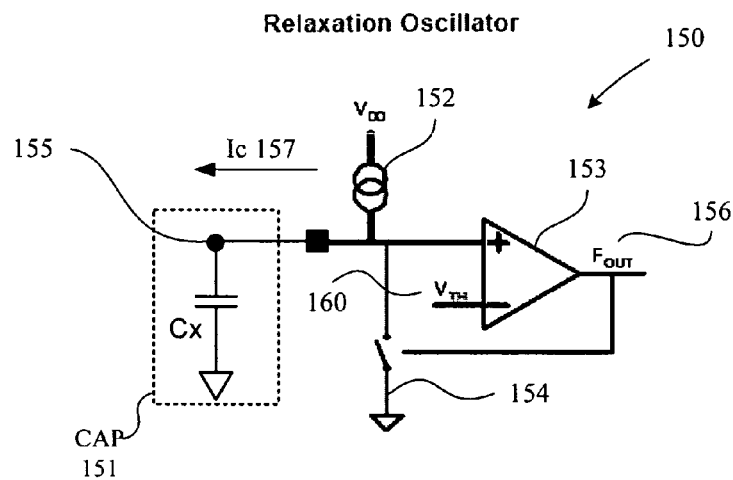
FIG. 1D illustrates a conventional relaxation oscillator for capacitance measurement.
Figure 1E:
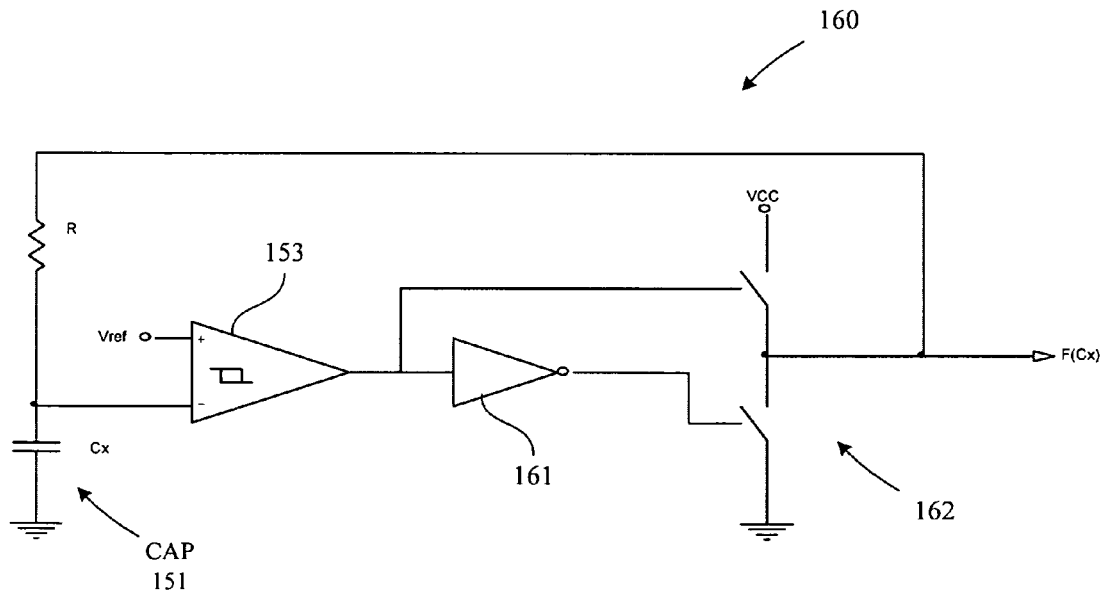
FIG. 1E illustrates a variant of the conventional relaxation oscillator of FIG. 1D.
Figure 1F:
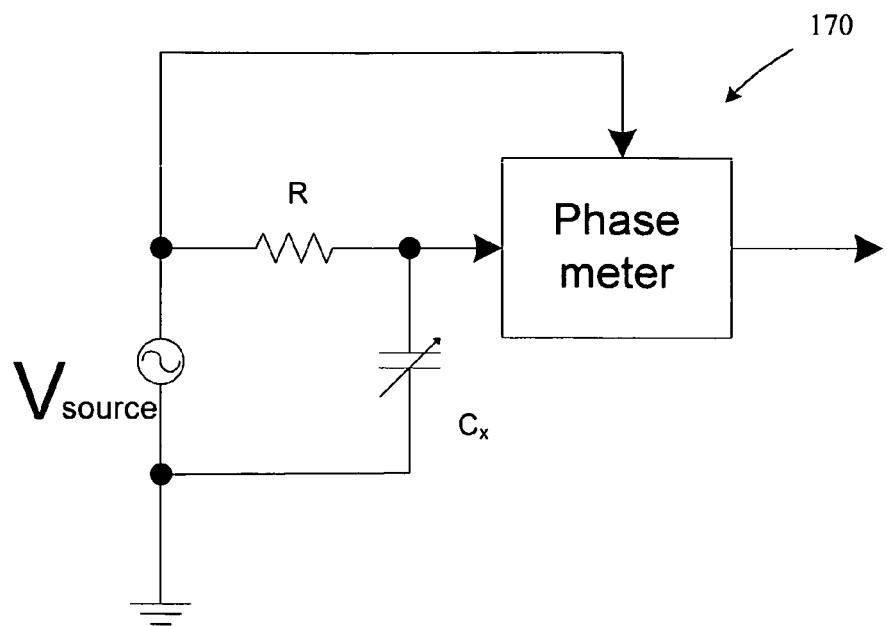
FIG. 1F illustrates another conventional method for measuring capacitance is by phase shift measurement.
Figure 1G:
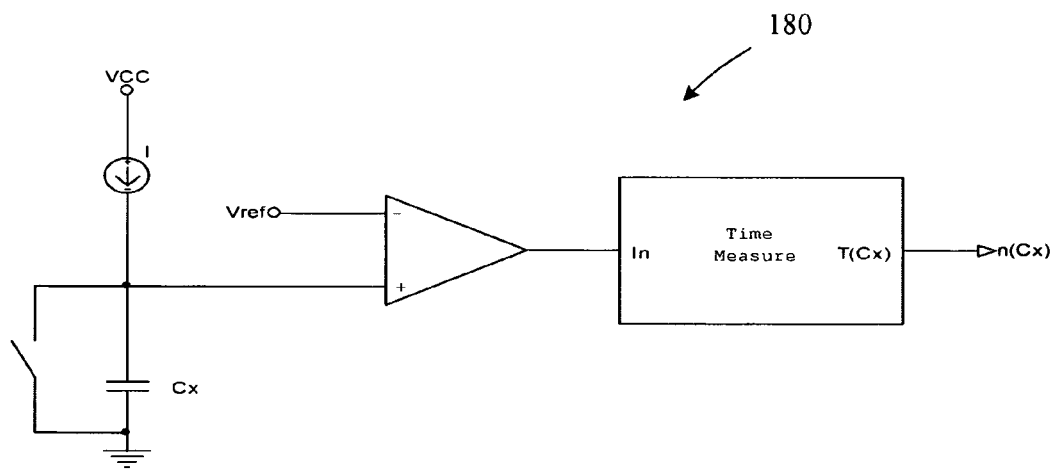
FIG. 1G illustrates another conventional capacitance measurement scheme based on charging the sensor capacitor from constant current source.
Figure 1H:
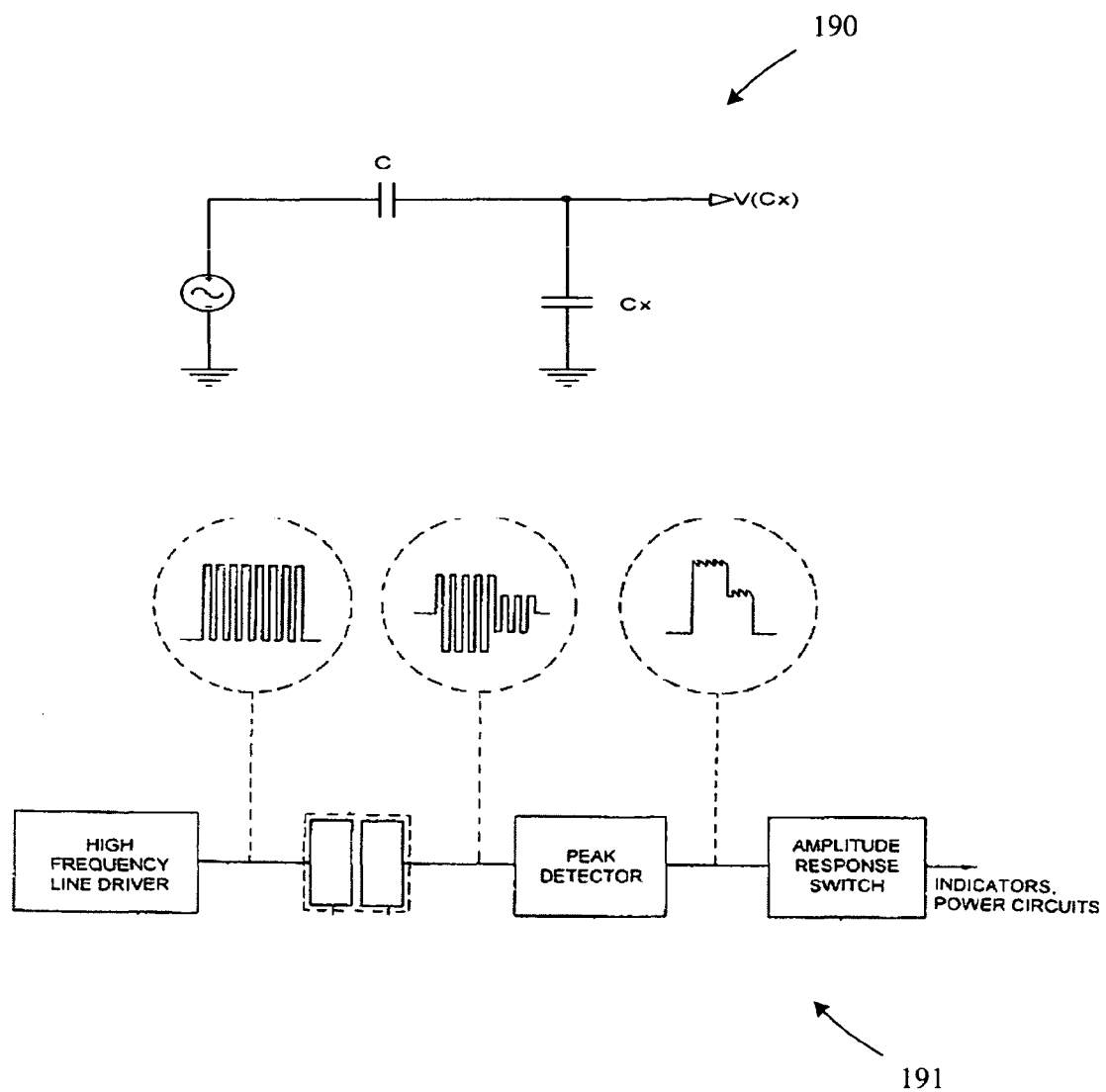
FIG. 1H illustrates a conventional capacitive voltage divider circuit 190 for capacitance sensing.
Figure 1I:
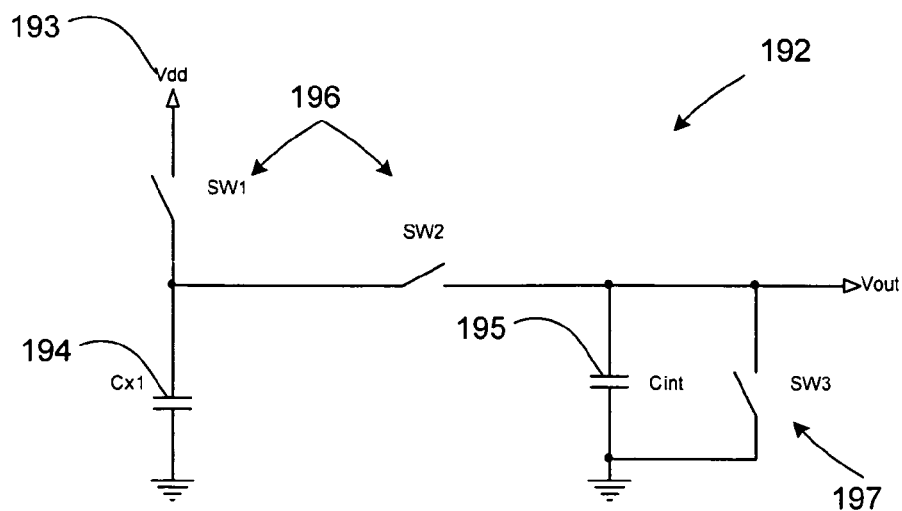
FIG. 1I illustrates a conventional charge-accumulation circuit.
Figure 1J:
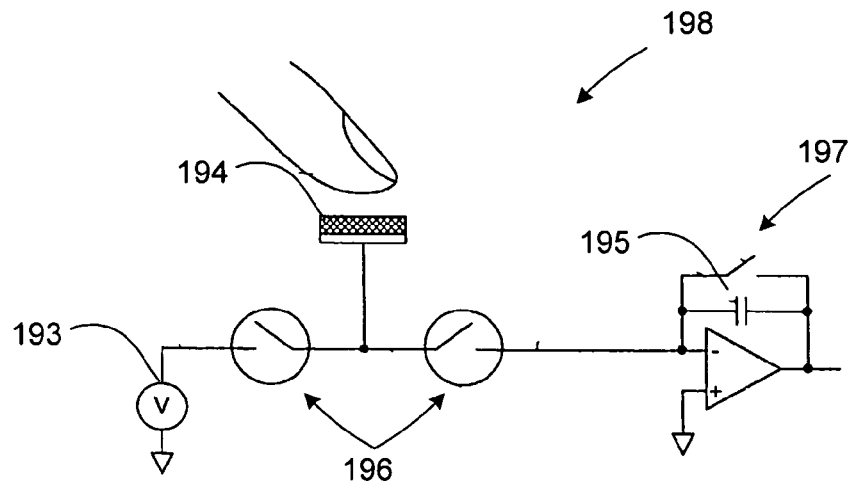
FIG. 1J illustrates another conventional charge-accumulation circuit, including an integrator.
Figure 1K:
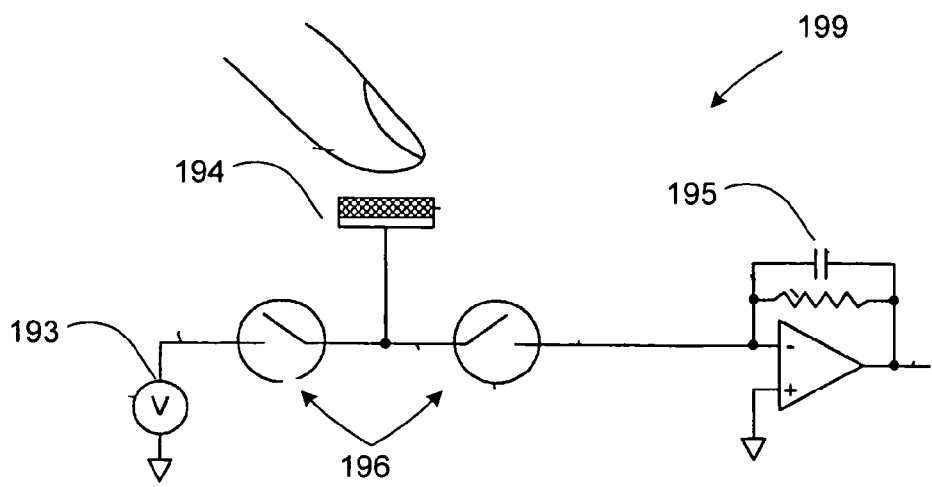
FIG. 1K illustrates another conventional charge-accumulation circuit, including an integrating low-pass filter.
Figure 1L:
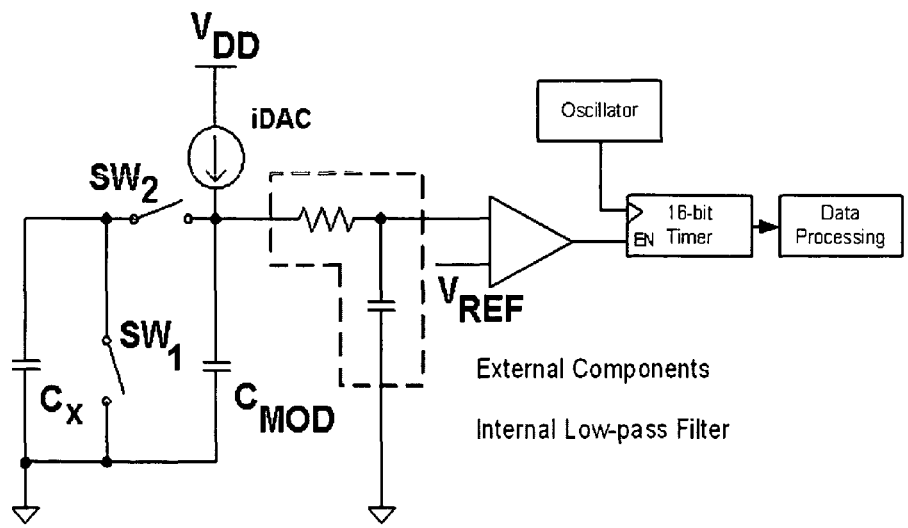
FIG. 1L illustrates another switching capacitor design, called the successful approximation.
Figure 1M:
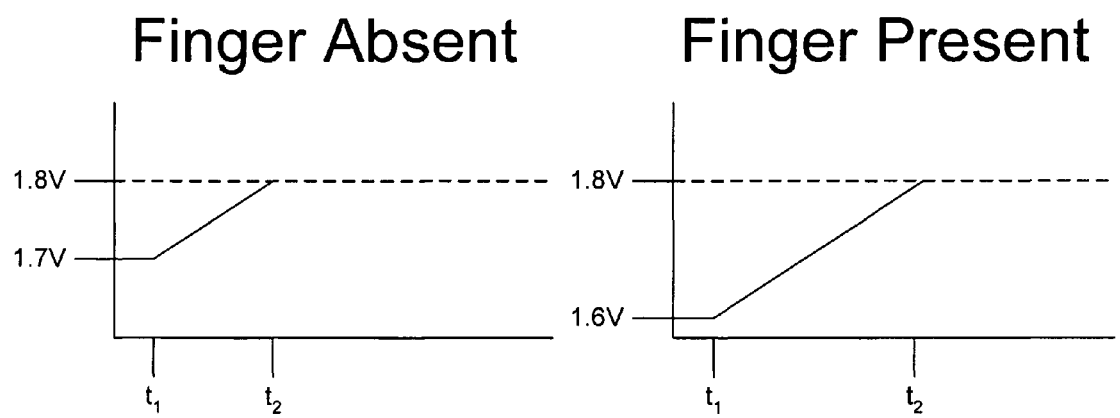
FIG. 1M illustrates conventional successful approximation method to measure the capacitance
Figure 1N:
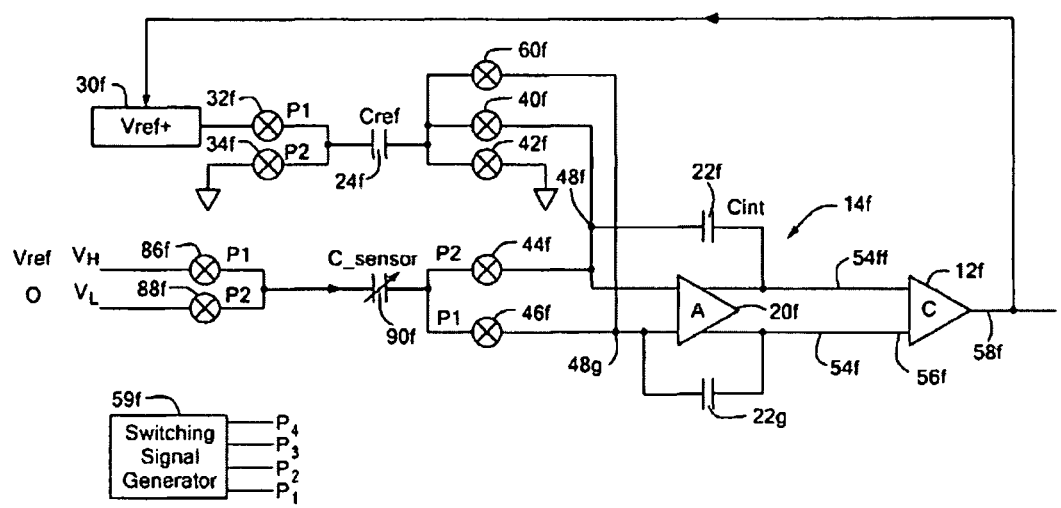
FIG. 1N illustrates a conventional solution with sigma-delta modulator

Described herein is a method and apparatus converting a capacitance measured on a sensor element to a digital code. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus are described to convert a capacitance measured on a sensor element to a digital code. In one embodiment, the method may include measuring a capacitance on a sensor element of a sensing device using a sigma-delta modulator, and converting the capacitance measured on the sensor element to a digital code. In one embodiment, the apparatus may include a switching capacitor as a sensor element of a sensing device, and a sigma-delta modulator coupled to the sensor element to convert a capacitance measured on the sensor element to a digital code. The switching capacitor is in a feedback loop of the sigma-delta modulator. The output of the sigma-delta modulator is used to control the switching operation of the switching capacitor, instead of using an external switching signal generator, as done conventionally. Also, the switching capacitor is place between the inputs of the sigma-delta modulator and ground, instead of between an excitation source and the inputs of the sigma-delta modulator, as done conventionally. The embodiments described herein may use a one-wire configuration for exciting the sensing capacitor and one wire for sensing the capacitance, instead of a two-wire configuration as done conventionally in the configurations where both ends of the sensing capacitor are used. The proposed invention uses the sigma-delta modulator with sensing capacitor, connected by one terminal to ground. Also, unlike the conventional capacitance sensing methods that utilize a sigma-delta modulator, the embodiments described herein do not include an operational amplifier with feedback capacitors (e.g., integrator), and a separate comparator. In addition, the embodiments described herein do not include a separate terminal for excitation voltage supply, as done conventionally.

Most conventional charge accumulation methods have several stages that are executed in series: reset, integrate, and measure. Therefore, in order to track the faster capacitance changes, the conversion time can be reduced by using smaller integration capacitor, which reduces the accuracy as well. In the embodiments described herein, the delta-sigma modulator operates continuously, permitting adjustments to the conversion time versus resolution. Also, the modulator bit stream data can be passed to different digital filters at same time, one can track the fast capacitance changes at low resolution, second perform high-precision absolute values measurement, which is not possible with the conventional charge accumulation methods described above.

In one embodiment, the method includes measuring the capacitance on a sensor element. This may include charging the capacitance on the sensor element on a line coupled to one end of the switching capacitor, measuring the capacitance using the same line that is coupled to the one end of the switching capacitor. In one embodiment, the switching capacitor is switched in and out of the feedback loop of the sigma-delta modulator using a switching circuit. The switching circuit may be controlled by the output of the sigma-delta modulator. Alternatively, the switching circuit may be controlled by a clock source, such as a spread spectrum clock source, in conjunction with the output of the sigma-delta modulator.

Figure 2:
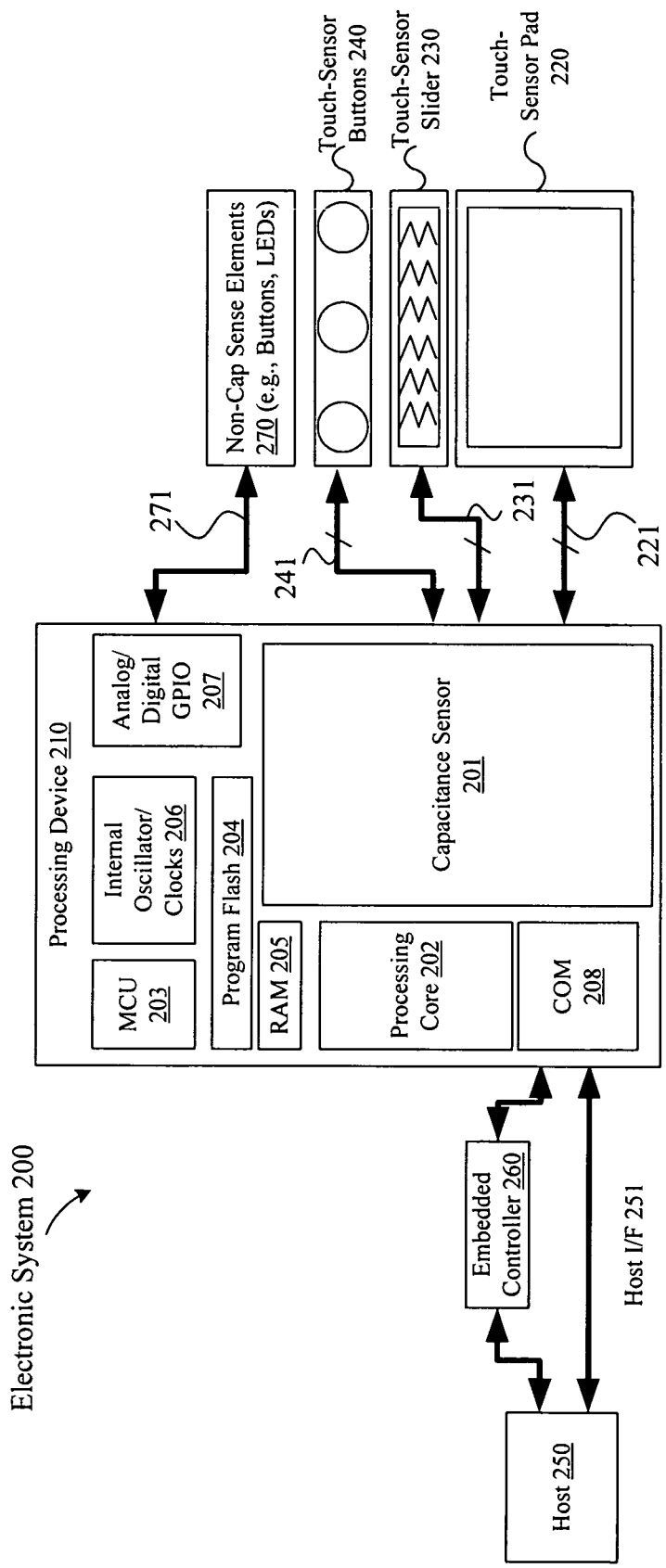
FIG. 2 illustrates a block diagram of one embodiment of an electronic system having a processing device for detecting a presence of a conductive object.

FIG. 2 illustrates a block diagram of one embodiment of an electronic system having a processing device for detecting a presence of a conductive object. Electronic system 200 includes processing device 210, touch-sensor pad 220, touch-sensor slider 230, touch-sensor buttons 240, host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus. Processing device 210 may also include memory, such as random access memory (RAM) 205 and program flash 204. RAM 205 may be static RAM (SRAM), and program flash 204 may be a non-volatile storage, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters, etc.) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor pad 220, touch-sensor slider 230, touch-sensor buttons 240, and/or other devices. Capacitance sensor 201 and processing device 202 are described in more detail below.

It should be noted that the embodiments described herein are not limited to touch-sensor pads for notebook implementations, but can be used in other capacitive sensing implementations, for example, the sensing device may be a touch screen, a touch-sensor slider 230, or a touch-sensor button 240 (e.g., capacitance sensing button). It should also be noted that the embodiments described herein may be implemented in other sensing technologies than capacitive sensing, such as resistive, optical imaging, surface wave, infrared, dispersive signal, and strain gauge technologies. Similarly, the operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, the electronic system 200 includes a touch-sensor pad 220 coupled to the processing device 210 via bus 221. Touch-sensor pad 220 may include a multi-dimension sensor array. The multi-dimension sensor array includes multiple sensor elements, organized as rows and columns. In another embodiment, the electronic system 200 includes a touch-sensor slider 230 coupled to the processing device 210 via bus 231. Touch-sensor slider 230 may include a single-dimension sensor array. The single-dimension sensor array includes multiple sensor elements, organized as rows, or alternatively, as columns. In another embodiment, the electronic system 200 includes a touch-sensor button 240 coupled to the processing device 210 via bus 241. Touch-sensor button 240 may include a single-dimension or multi-dimension sensor array. The single- or multi-dimension sensor array includes multiple sensor elements. For a touch-sensor button, the sensor elements may be coupled together to detect a presence of a conductive object over the entire surface of the sensing device. Alternatively, the touch-sensor button 240 has a single sensor element to detect the presence of the conductive object. In one embodiment, the touch-sensor button 240 may be a capacitance sensor element. Capacitance sensor elements may be used as non-contact sensor elements. These sensor elements, when protected by an insulating layer, offer resistance to severe environments.

The electronic system 200 may include any combination of one or more of the touch-sensor pad 220, touch-sensor slider 230, and/or touch-sensor button 240. In another embodiment, the electronic system 200 may also include non-capacitance sensor elements 270 coupled to the processing device 210 via bus 271. The non-capacitance sensor elements 270 may include buttons, light emitting diodes (LEDs), and other user interface devices, such as a mouse, a keyboard, or other functional keys that do not require capacitance sensing. In one embodiment, buses 271, 241, 231, and 221 may be a single bus. Alternatively, these buses may be configured into any combination of one or more separate buses.

The processing device may also provide value-added functionality such as keyboard control integration, LEDs, battery charger and general purpose 1/0, as illustrated as non-capacitance sensor elements 270. Non-capacitance sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) line 251. Alternatively, processing block 210 may also be coupled to embedded controller 260 to communicate with the external components, such as host 250. Interfacing to the host 250 can be through various methods. In one exemplary embodiment, interfacing with the host 250 may be done using a standard PS/2 interface to connect to an embedded controller 260, which in turn sends data to the host 250 via low pin count (LPC) interface. In some instances, it may be beneficial for the processing device 210 to do both touch-sensor pad and keyboard control operations, thereby freeing up the embedded controller 260 for other housekeeping functions. In another exemplary embodiment, interfacing may be done using a universal serial bus (USB) interface directly coupled to the host 250 via host interface line 251. Alternatively, the processing device 210 may communicate to external components, such as the host 250 using industry standard interfaces, such as USB, PS/2, inter-integrated circuit (I2C) bus, or system packet interfaces (SPI). The host 250 and/or embedded controller 260 may be coupled to the processing device 210 with a ribbon or flex cable from an assembly, which houses the sensing device and processing device.

In one embodiment, the processing device 210 is configured to communicate with the embedded controller 260 or the host 250 to send and/or receive data. The data may be a command or alternatively a signal. In an exemplary embodiment, the electronic system 200 may operate in both standard-mouse compatible and enhanced modes. The standard-mouse compatible mode utilizes the HID class drivers already built into the Operating System (OS) software of host 250. These drivers enable the processing device 210 and sensing device to operate as a standard pointer control user interface device, such as a two-button PS/2 mouse. The enhanced mode may enable additional features such as scrolling (reporting absolute position) or disabling the sensing device, such as when a mouse is plugged into the notebook. Alternatively, the processing device 210 may be configured to communicate with the embedded controller 260 or the host 250, using non-OS drivers, such as dedicated touch-sensor pad drivers, or other drivers known by those of ordinary skill in the art.

In one embodiment, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

In one embodiment, the data sent to the host 250 from the processing device 210 includes click, double-click, movement of the pointer, scroll-up, scroll-down, scroll-left, scroll-right, step Back, and step Forward. In another embodiment, the data sent to the host 250 include the position or location of the conductive object on the sensing device. Alternatively, other user interface device commands may be communicated to the host 250 from the processing device 210. These commands may be based on gestures occurring on the sensing device that are recognized by the processing device, such as tap, push, hop, and zigzag gestures. Alternatively, other commands may be recognized. Similarly, signals may be sent that indicate the recognition of these operations.

In particular, a tap gesture, for example, may be when the finger (e.g., conductive object) is on the sensing device for less than a threshold time. If the time the finger is placed on the touchpad is greater than the threshold time it may be considered to be a movement of the pointer, in the x- or y-axes. Scroll-up, scroll-down, scroll-left, and scroll-right, step back, and step-forward may be detected when the absolute position of the conductive object is within a pre-defined area, and movement of the conductive object is detected.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSOC™) processing device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 210 may also be done in the host.

In one embodiment, the method and apparatus described herein may be implemented in a fully self-contained touch-sensor pad, which outputs fully processed x/y movement and gesture data signals or data commands to a host. In another embodiment, the method and apparatus may be implemented in be a touch-sensor pad, which outputs x/y movement data and also finger presence data to a host, and where the host processes the received data to detect gestures. In another embodiment, the method and apparatus may be implemented in a touch-sensor pad, which outputs raw capacitance data to a host, where the host processes the capacitance data to compensate for quiescent and stray capacitance, and calculates x/y movement and detects gestures by processing the capacitance data. Alternatively, the method and apparatus may be implemented in a touch-sensor pad, which outputs pre-processed capacitance data to a host, where the touchpad processes the capacitance data to compensate for quiescent and stray capacitance, and the host calculates x/y movement and detects gestures from the pre-processed capacitance data.

In one embodiment, the electronic system that includes the embodiments described herein may be implemented in a conventional laptop touch-sensor pad. Alternatively, it may be implemented in a wired or wireless keyboard integrating a touch-sensor pad, which is itself connected to a host. In such an implementation, the processing described above as being performed by the "host" may be performed in part or in whole by the keyboard controller, which may then pass fully processed, pre-processed or unprocessed data to the system host.

In another embodiment, the embodiments may be implemented in a mobile handset (e.g., cellular phone or mobile phone) or other electronic devices where the touch-sensor pad may operate in one of two or more modes. For example, the touch-sensor pad may operate either as a touch-sensor pad for x/y positioning and gesture recognition, or as a keypad or other array of touch-sensor buttons and/or sliders.

Capacitance sensor 201 may be integrated into the IC of the processing device 210, or alternatively, in a separate IC. Alternatively, descriptions of capacitance sensor 201 may be generated and compiled for incorporation into other integrated circuits. For example, behavioral level code describing capacitance sensor 201, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above.

In one embodiment, electronic system 200 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

In one embodiment, capacitance sensor 201 may be a capacitance-to-code converter with a sigma-delta modulator (CCSD). The CCSD may have an array of capacitive touch sensor elements using a sigma-delta modulator, an analog multiplexer, digital counting functions, and high-level software routines to compensate for environmental and physical sensor element variations. The sensor array may include combinations of independent sensor elements, sliding sensor elements (e.g., touch-sensor slider), and touch-sensor sensor element pads (e.g., touch pad) implemented as a pair of orthogonal sliding sensor elements. The CCSD may include physical, electrical, and software components. The physical component may include the physical sensor element itself, typically a pattern constructed on a printed circuit board (PCB) with an insulating cover, a flexible membrane, or a transparent overlay. The electrical component may include an oscillator or other means to convert a charged capacitance into a measured signal. The electrical component may also include a counter or timer to measure the oscillator output. The software component may include detection and compensation software algorithms to convert the count value into a sensor element detection decision (also referred to as switch detection decision). For example, in the case of slider sensor elements or X-Y touch-sensor sensor element pads, a calculation for finding position of the conductive object to greater resolution than the physical pitch of the sensor elements may be used.

Figure 3A:
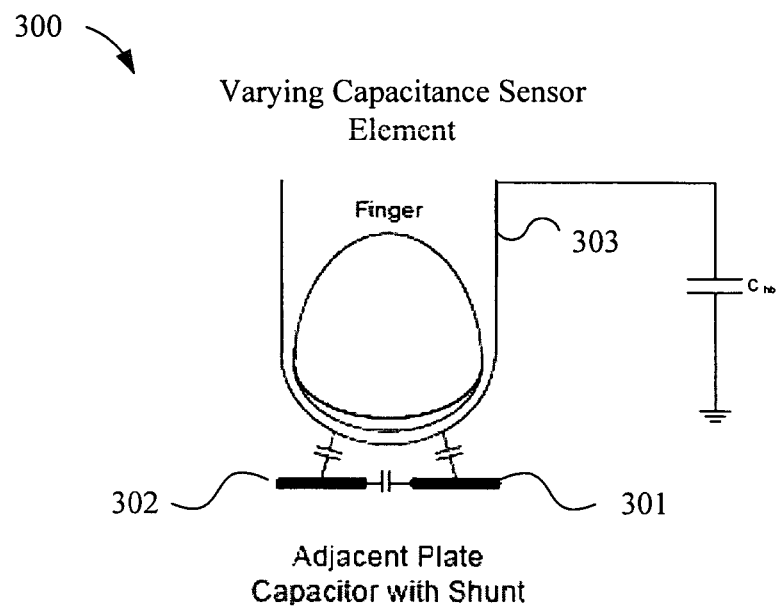
FIG. 3A illustrates a varying capacitance sensor element.

FIG. 3A illustrates a varying capacitance sensor element. In its basic form, a capacitive sensor element 300 is a pair of adjacent plates 301 and 302. There is a small edge-to-edge capacitance Cp, but the intent of sensor element layout is to minimize the base capacitance Cp between these plates. When a conductive object 303 (e.g., finger) is placed in proximity to the two plate 301 and 302, there is a capacitance between one electrode 301 and the conductive object 303 and a similar capacitance between the conductive object 303 and the other electrode 302. The capacitance between the electrodes when no conductive object 303 is present is the base capacitance Cp. This may be stored as a baseline value. There is also a total capacitance (Cp+Cf) on the sensor element 300 when the conductive object 303 is present on the sensor element 300. The baseline capacitance value Cp may be subtracted from the total capacitance when the conductive object 303 is present to determine the change in capacitance (e.g., capacitance variation Cf) when the conductive object 303 is present and when the conductive object 303 is not present on the sensor element. The capacitance variation Cf may include a capacitance caused by the capacitance with respect to a floating ground of a human body. The values introduced by the human body may range between approximately 100-300 pF. Effectively, the capacitance variation Cf can be measured to determine whether a conductive object 303 is present or not (e.g., sensor activation) on the sensor element 300. Capacitive sensor element 300 may be used in a capacitance sensor array. The capacitance sensor array is a set of capacitors where one side of each is grounded to a system ground. Thus, the active capacitor (as represented in FIG. 3C as capacitor 351) has only one accessible side. The presence of the conductive object 303 increases the capacitance (Cp+Cf) of the sensor element 300. Determining sensor element activation is then a matter of measuring change in the capacitance (Cf) or capacitance variation. Sensor element 300 is also known as a grounded variable capacitor. In one exemplary embodiment, Cp may range from approximately 10-300 picofarads (pF), and Cf may be approximately 0.5% of Cp. Alternatively, Cf may be orders of magnitude smaller than Cp. Alternatively, other ranges and values, such as Cf may range between 0.1 to 30 pF, may be used.

In another embodiment, capacitance sensor element is able to operate without surrounding ground plane because human has own relatively large capacitance that can be considered connected between sensing electrode and some internal net that has fixed potential.

The conductive object 303 in this embodiment has been illustrated as a finger. Alternatively, this technique may be applied to any conductive object, for example, a conductive door switch, position sensor, or conductive pen in a stylus tracking system (e.g., stylus).

Figure 3B:
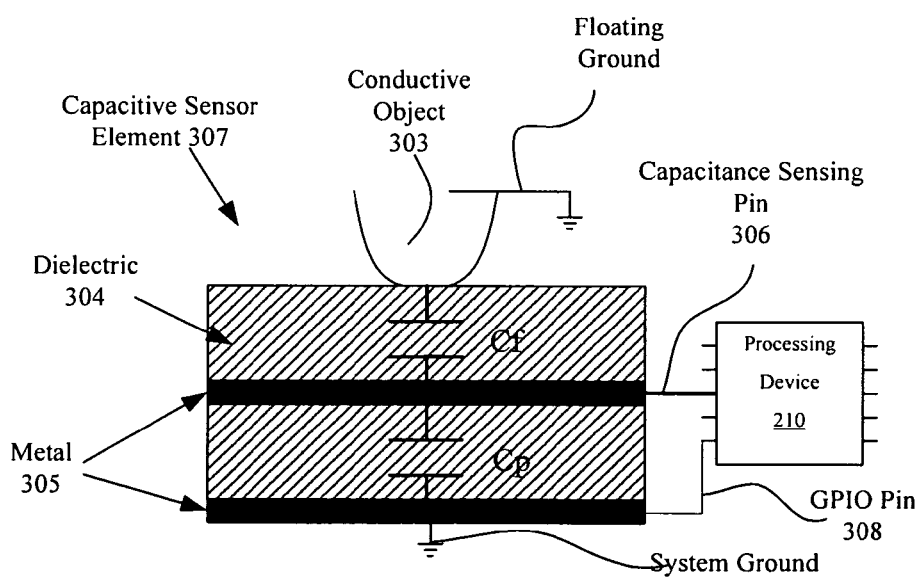
FIG. 3B illustrates one embodiment of a sensing device coupled to a processing device.

FIG. 3B illustrates one embodiment of a capacitive sensor element 307 coupled to a processing device 210. Capacitive sensor element 307 illustrates the capacitance as seen by the processing device 210 on the capacitance sensing pin 306. As described above, when a conductive object 303 (e.g., finger) is placed in proximity to one of the metal plates 305, there is a capacitance, Cf, between the metal plate and the conductive object 303 with respect to ground. This ground, however, may be a floating ground. Also, there is a capacitance, Cp, between the two metal plates, with one of the metal plates being ground to a system ground. The ground plate may be coupled to the processing device 210 using GPIO pin 308. In one embodiment, the ground plate may be an adjacent sensor element. Alternatively, the ground plate may be other grounding mechanisms, such as a surrounding ground plane. Accordingly, the processing device 210 can measure the change in capacitance, capacitance variation Cf, as the conductive object is in proximity to the metal plate 305. Above and below the metal plate that is closest to the conductive object 303 is dielectric material 304. The dielectric material 304 above the metal plate 305 can be the overlay, as described in more detail below. The overlay may be non-conductive material used to protect the circuitry from environmental conditions and to insulate the user's finger (e.g., conductive object) from the circuitry. Capacitance sensor element 307 may be a sensor element of a touch-sensor pad, a touch-sensor slider, or a touch-sensor button.

Figure 4:
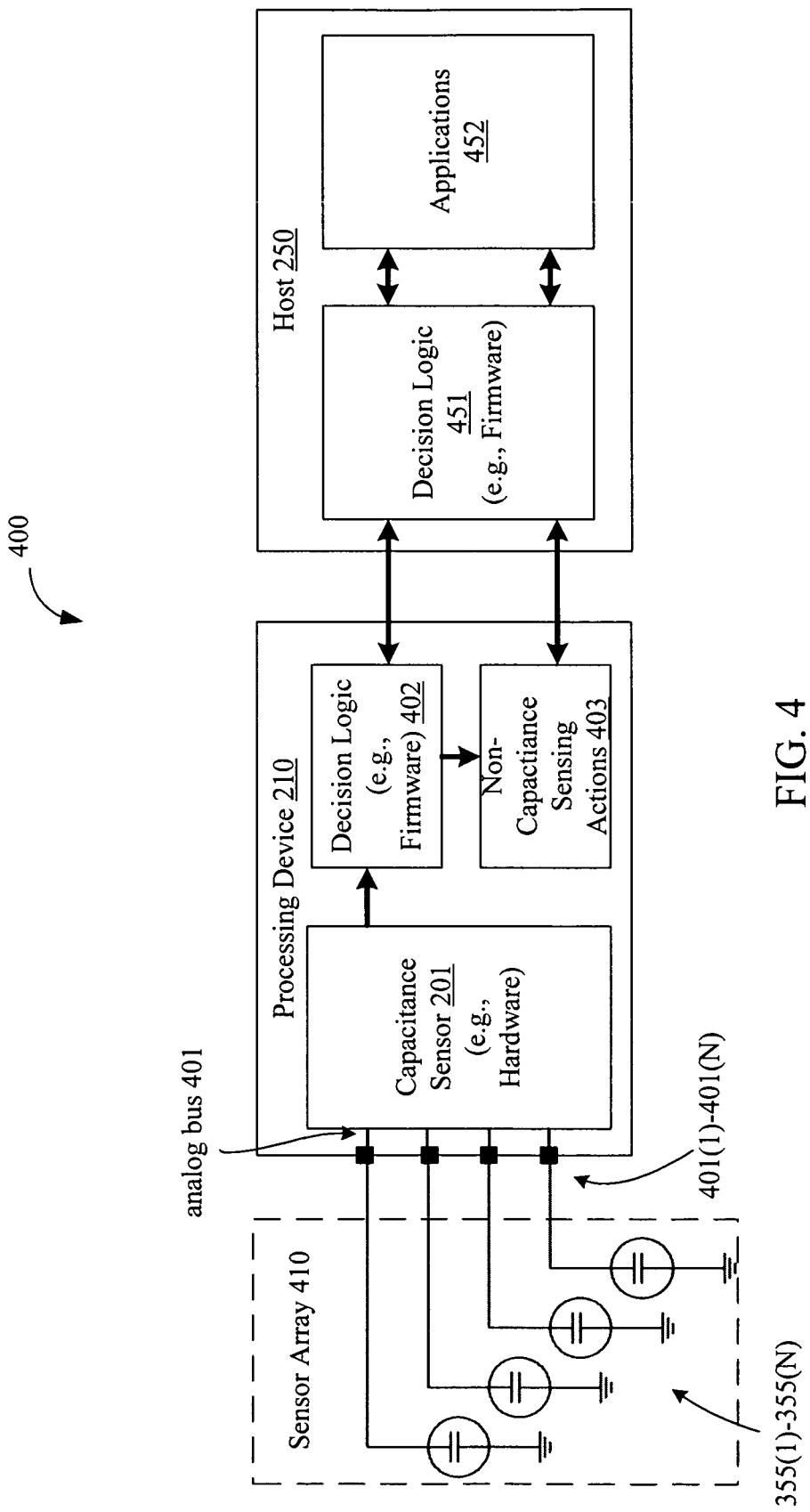
FIG. 4 illustrates a block diagram of one embodiment of an electronic device including a processing device that includes capacitance sensor with a sigma-delta modulator for measuring the capacitance on a senor array.
Figure 5:
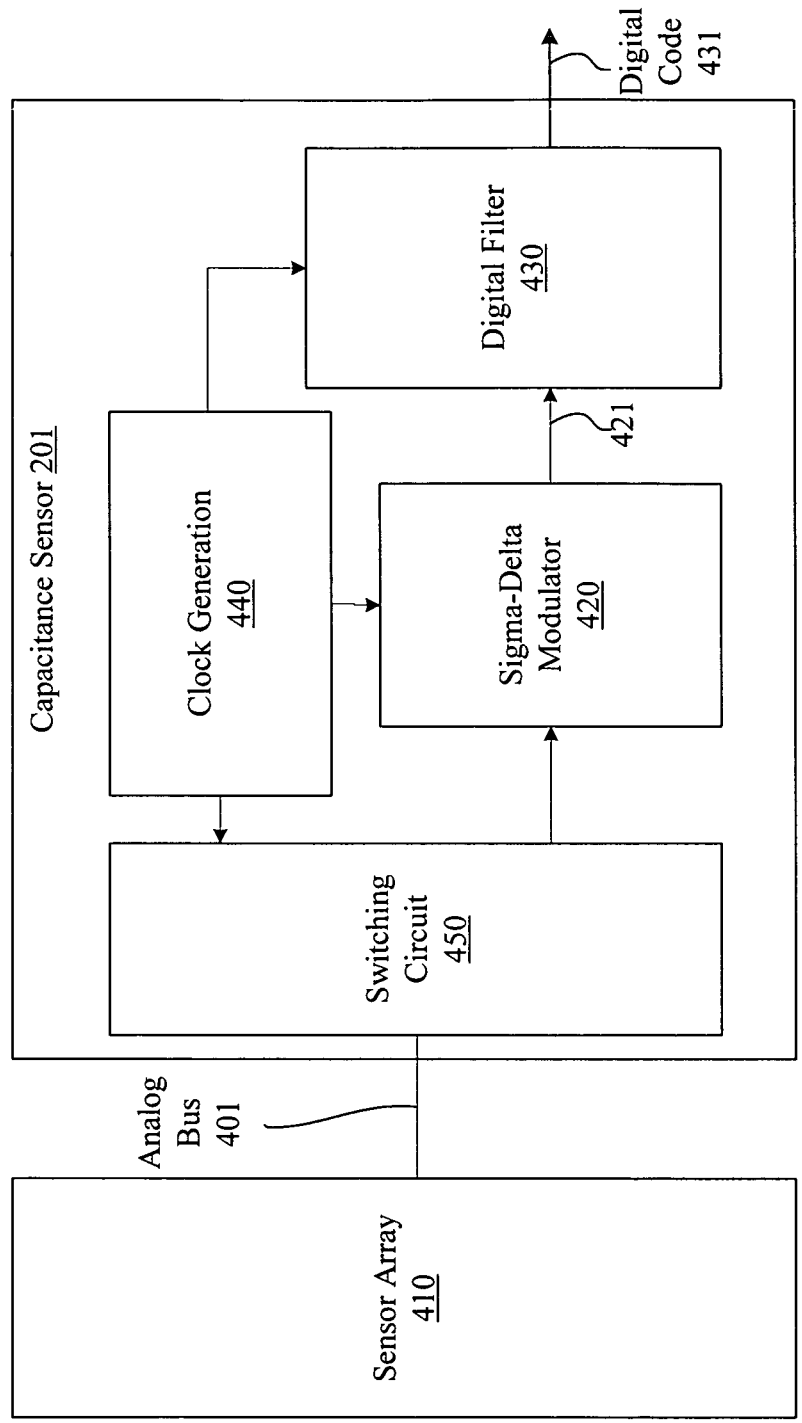
FIG. 5 illustrates a block diagram of one embodiment of a capacitance sensor including a sigma-delta modulator.

FIG. 4 illustrates a block diagram of one embodiment of an electronic device 400 including a processing device that includes capacitance sensor 201 with a sigma-delta modulator for measuring the capacitance on a senor array 410. The electronic device 400 of FIG. 4 includes a sensor array 410 (also known as a switch array), processing device 210, and host 250. Sensor array 410 includes sensor elements 355(1)-355(N), where N is a positive integer value that represents the number of rows (or alternatively columns) of the sensor array 410. Each sensor element is represented as a capacitor, as described above with respect to FIG. 3B. The sensor array 410 is coupled to processing device 210 via an analog bus 401 having multiple pins 401(1)-401(N). In one embodiment, the sensor array 410 may be a single-dimension sensor array including the sensor elements 355(1)-355(N), where N is a positive integer value that represents the number of sensor elements of the single-dimension sensor array. The single-dimension sensor array 410 provides output data to the analog bus 401 of the processing device 210 (e.g., via lines 231). Alternatively, the sensor array 410 may be a multi-dimension sensor array including the sensor elements 355(1)-355(N), where N is a positive integer value that represents the number of sensor elements of the multi-dimension sensor array. The multi-dimension sensor array 410 provides output data to the analog bus 401 of the processing device 210 (e.g., via bus 221).

In one embodiment, the capacitance sensor 201 includes a selection circuit (not illustrated). The selection circuit is coupled to the sensor elements 355(1)-355(N) and the sigma-delta modulator of the capacitance sensor 201. Selection circuit may be used to allow the sigma-delta modulator to measure capacitance on multiple sensor elements (e.g., rows or columns). The selection circuit may be configured to sequentially select a sensor element of the multiple sensor elements to provide the charge current and to measure the capacitance of each sensor element. In one exemplary embodiment, the selection circuit is a multiplexer array. Alternatively, selection circuit may be other circuitry inside or outside the capacitance sensor 201 to select the sensor element to be measured. In another embodiment, the capacitance sensor 201 may include one sigma-delta modulator for measuring capacitance on all of the sensor elements of the sensor array. Alternatively, capacitance sensor 201 may include multiple sigma-delta modulator to measure capacitance on the sensor elements of the sensor array, for example, one sigma-delta modulator per sensor array. The multiplexer array may also be used to ground the sensor elements that are not being measured. This may be done in conjunction with a dedicated pin in the GP10 port 207.

In another embodiment, the capacitance sensor 201 may be configured to simultaneously scan the sensor elements, as opposed to being configured to sequentially scan the sensor elements as described above. For example, the sensing device may include a sensor array having multiple rows and columns. The rows may be scanned simultaneously, and the columns may be scanned simultaneously.

In one exemplary embodiment, the voltages on all of the rows of the sensor array are simultaneously moved, while the voltages of the columns are held at a constant voltage, with the complete set of sampled points simultaneously giving a profile of the conductive object in a first dimension. Next, the voltages on all of the rows are held at a constant voltage, while the voltages on all the rows are simultaneously moved, to obtain a complete set of sampled points simultaneously giving a profile of the conductive object in the other dimension.

In another exemplary embodiment, the voltages on all of the rows of the sensor array are simultaneously moved in a positive direction, while the voltages of the columns are moved in a negative direction. Next, the voltages on all of the rows of the sensor array are simultaneously moved in a negative direction, while the voltages of the columns are moved in a positive direction. This technique doubles the effect of any transcapacitance between the two dimensions, or conversely, halves the effect of any parasitic capacitance to the ground. In both methods, the capacitive information from the sensing process provides a profile of the presence of the conductive object to the sensing device in each dimension. Alternatively, other methods for scanning known by those of ordinary skill in the art may be used to scan the sensing device.

In one embodiment, the processing device 210 further includes a decision logic block 402. The operations of decision logic block 402 may be implemented in firmware; alternatively, it may be implemented in hardware or software. The decision logic block 402 may be configured to receive the digital code or counts from the capacitance sensor 201, and to determine the state of the sensor array 410, such as whether a conductive object is detected on the sensor array, where the conductive object was detected on the sensor array (e.g., determining the X-, Y-coordinates of the presence of the conductive object), determining absolute or relative position of the conductive object, whether the conductive object is performing a pointer operation, whether a gesture has been recognized on the sensor array 410 (e.g., click, double-click, movement of the pointer, scroll-up, scroll-down, scroll-left, scroll-right, step Back, step Forward, tap, push, hop, zigzag gestures, or the like), or the like.

In another embodiment, instead of performing the operations of the decision logic 402 in the processing device 210, the processing device 201 may send the raw data to the host 250, as described above. Host 250, as illustrated in FIG. 4, may include decision logic 451. The operations of decision logic 451 may also be implemented in firmware, hardware, and/or software. Also, as described above, the host may include high-level APIs in applications 452 that perform routines on the received data, such as compensating for sensitivity differences, other compensation algorithms, baseline update routines, start-up and/or initialization routines, interpolations operations, scaling operations, or the like. The operations described with respect to the decision logic 402 may be implemented in decision logic 451, applications 452, or in other hardware, software, and/or firmware external to the processing device 210.

In another embodiment, the processing device 210 may also include a non-capacitance sensing actions block 403. This block may be used to process and/or receive/transmit data to and from the host 250. For example, additional components may be implemented to operate with the processing device 210 along with the sensor array 410 (e.g., keyboard, keypad, mouse, trackball, LEDs, displays, or the like)

FIG. 4B illustrates a block diagram of one embodiment of a capacitance sensor 201 including a sigma-delta modulator 420. Capacitance sensor 201 couples to sensor array 410 via analog bus 401, as previously described. Capacitance sensor 201 includes sigma-delta modulator 420, digital filter 430, switching circuit 450, and clock generation circuit 440. As previously described, sensor array has one or more sensor elements (represented as capacitors) on which capacitance can be measured. The switching capacitor is also referred to as a sensing capacitor, variable-switch capacitor, or variable sensing capacitor. The sigma-delta modulator 420 includes a modulator capacitor, which is configured to receive a transferred charge, accumulated on the switching capacitor (e.g., sensor element). Transferring charge, accumulated on the switching capacitor to the modulator capacitor may provide an advantage because modulator circuits have low sensitivity for RF fields and noise because the sensing capacitor is charged from a low-impedance source and charge is transferred to a low-impedance modulator capacitor.

In one embodiment, the sigma-delta modulator 420 may also include a comparator. The output of the comparator may be configured to toggle when the voltage on the modulator capacitor crosses a reference voltage. The reference voltage may be a pre-programmed value, and may be configured to be adjustable. In another embodiment, the sigma-delta modulator 420 may also include a latch coupled to the output of the comparator. The latch may be configured to latch the output of the comparator based on a clock signal from the clock generation circuit 440. In another embodiment, the sigma-delta modulator 420 may include a synchronized latch that operates to latch an output of the comparator for a length of time. The output of the comparator may be latched for measuring or sampling the output signal of the comparator by the digital filter 430. The latch may be used to set the sigma-delta modulator sample frequency. The sigma-delta modulator 420 may also include additional components as described below in the various embodiments.

Clock source circuit 440 is configured to provide the clock to the switching circuit for the switching operation of the switching capacitor. The clock generation circuit 440 may also provide a clock signal to the sigma-delta modulator 420 for latching the output of the comparator. The clock circuit 440 may be configured to set a sample frequency and/or an output bitstream frequency of the sigma-delta modulator. The clock circuit 440 may include a clock source, such as an oscillator, or a pseudo-random signal (PRS) counter. The clock circuit 440 may also include additional components as described below in the various embodiments. In one embodiment, to minimize noise, the same number of switching capacitor cycles can be implemented in each conversion cycle. This may be achieved by using a single clock source for the modulator and the switching capacitor circuit, without requiring any synchronization circuit.

The modulator output is single bit bit-stream, which can be filtered and converted to the numerical values using a digital filter. The digital filter 430 is coupled to receive the output 421 of the sigma-delta modulator 420. The digital filter 430 is configured to obtain desired characteristics, such as resolution, sample rate, low-pass or high-pass type filtering, or the like. The output 421 may be a single bit bit-stream, which can be filtered and/or converted by the digital filter 430 to numerical values, such as multi-bit values. In one embodiment, the digital filter is a single integrator (e.g., counter). Alternatively, other standard ADC digital filters can be used, for example, SincN filter (where N is the order of the Sinc filter), or the like.

When a finger or other type of conductive object is placed on or near the switch, the capacitance increases from $C_p$ to $C_p + C_x$ which cause a change in the output 421. In one embodiment, the sigma-delta modulator 420 operates as a capacitance-to-duty-cycle converter. As the capacitance on the switching capacitor increase or decrease, the duty-cycle of the sigma-delta modulator subsequently changes. The duty cycle of the sigma-delta modulator 420 may be measured by the digital filter to provide a digital code 431.

Figure 6A:
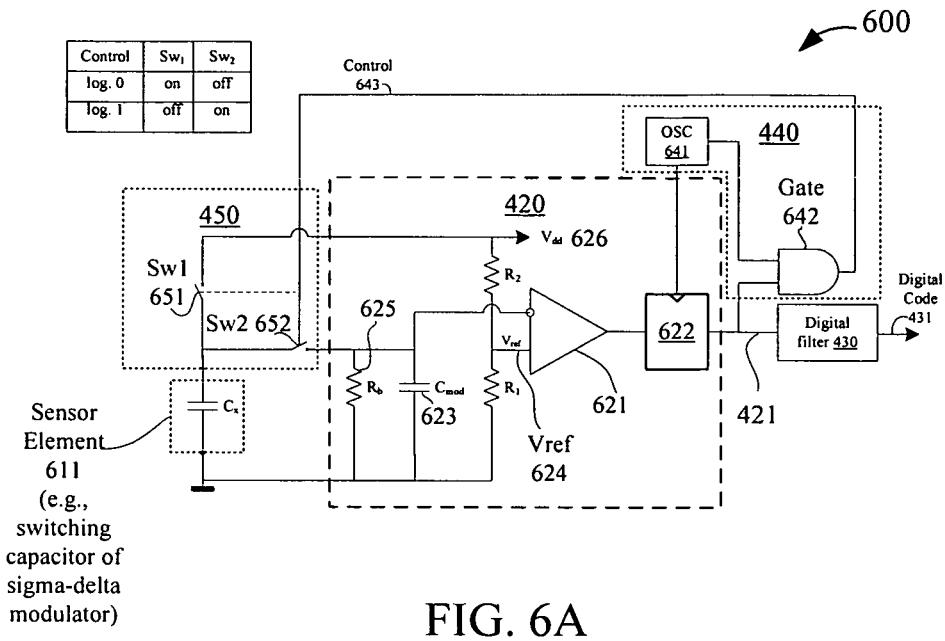
FIG. 6A illustrates a schematic of one embodiment of a circuit including a sigma-delta modulator and a digital filter for measuring capacitance on a sensor element.
Figure 6B:
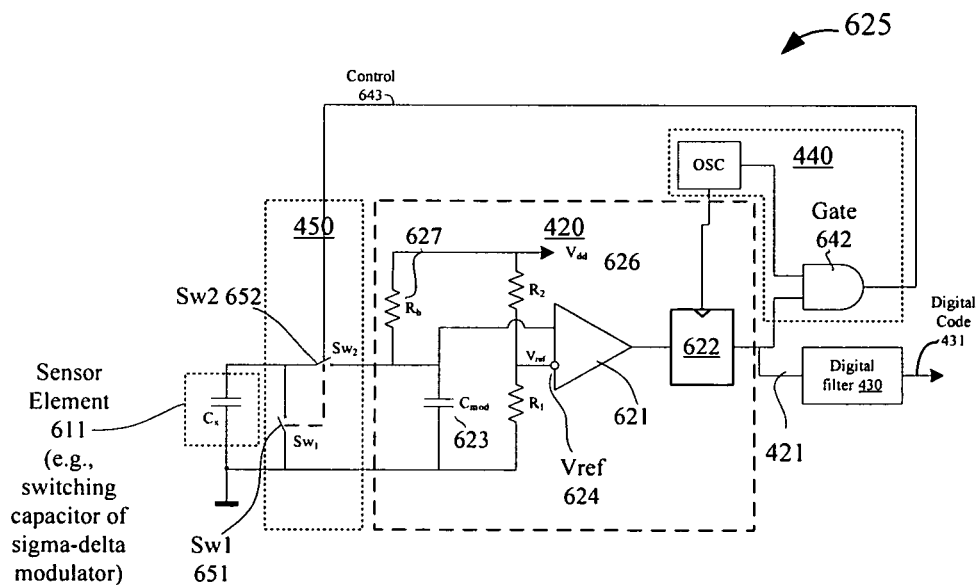
FIG. 6B illustrates a schematic of another embodiment of a circuit including a sigma-delta modulator and a digital filter for measuring capacitance on a sensor element.

FIG. 6A illustrates a schematic of one embodiment of a circuit 600 including a sigma-delta modulator 420 and a digital filter 430 for measuring capacitance on a sensor element 611. Circuit 600 includes a switching circuit 450, clock source 440, sigma-delta modulator 420, and digital filter 430 for measuring the capacitance on sensor element 611. Sensor element 611 may be a sensor element of sensor array 410, and is represented as a switching capacitor 611 in the modulator feedback loop. Alternatively, sensor element 611 may be a single element, such as a touch-sensor button. Switching circuit 450 includes two switches $Sw_1$ 651 and $Sw_2$ 652. The switches $Sw_1$ 651 and $Sw_2$ 652 operate in two, non-overlapping phases (also known as break-before-make configuration). These switches together with sensing capacitor $C_x$ 611 form the switching capacitor equivalent resistor, which provides the modulator capacitor $C_{mod}$ 623 of sigma-delta modulator 420 charge current (as illustrated in FIG. 6A) or discharge current (as illustrated in FIG. 6B) during one of the two phases.

The sigma-delta modulator 430 includes the comparator 621, latch 622, modulator capacitor $C_{mod}$ 623, modulator feedback resistor 625, which may also be referred to as bias resistor 625, and voltage source 626. The output of the comparator may be configured to toggle when the voltage on the modulator capacitor 623 crosses a reference voltage 624. The reference voltage 624 may be a pre-programmed value, and may be configured to be adjustable. The sigma-delta modulator 420 also includes a latch 622 coupled to the output of the comparator 621 to latch the output of the comparator 621 for a given amount of time, and provide as an output, output 421. The latch may be configured to latch the output of the comparator based on a clock signal from the gate circuit 440 (e.g., oscillator signal from the oscillator 641). In another embodiment, the sigma-delta modulator 420 may include a synchronized latch that operates to latch an output of the comparator for a pre-determined length of time. The output of the comparator may be latched for measuring or sampling the output signal of the comparator 621 by the digital filter 430.

Sigma-delta modulator 420 is configured to keep the voltage on the modulator capacitor 623 close to reference voltage $V_{ref}$ 624 by alternatively connecting the switching capacitor resistor (e.g., switches $Sw_1$ 651 and $Sw_2$ 652 and sensing capacitor $C_x$ 611) to the modulator capacitor 623. The output 421 of the sigma-delta modulator 420 (e.g., output of latch 622) is feedback to the gate circuit 440, which controls the timing of the switching operations of switches $Sw_1$ 651 and $Sw_2$ 652 of switching circuit 450. For example, in this embodiment, the clock source circuit 440 includes an oscillator 641 and gate 642. The output 421 of the sigma-delta modulator 420 is used with an oscillator signal to gate a control signal 643, which switches the switches $Sw_1$ 651 and $Sw_2$ 652 in a non-overlapping manner (e.g., two, non-overlapping phases). The output 421 of the sigma-delta modulator 420 is also output to digital filter 430, which filters and/or converts the output into the digital code 431.

In one embodiment of the method of operation, at power on, the modulator capacitor 623 has zero voltage and switching capacitor resistor (formed by sensing capacitor Cx 611, and switches $Sw_1$ 651 and $Sw_2$ 652) is connected between Vdd line 626 and modulator capacitor 623. This connection allows the voltage on the modulator capacitor 623 to rise. When this voltage reaches the comparator reference voltage, $V_{ref}$ 624, the comparator 621 toggles and gates the control signal 643 of the switches $Sw_1$ 651 and $Sw_2$ 652, stopping the charge current. Because the current via bias resistors $R_b$ 625 continues to flow, the voltage on modulator capacitor 623 starts dropping. When it drops below the reference voltage 624, the output of the comparator 621 switches again, enabling the modulator 623 to start charging. As previously mentioned, the latch 622 and the comparator 621 set sample frequency of the sigma-delta modulator 420.

The digital filter 430 is coupled to receive the output 421 of the sigma-delta modulator 420. The output 421 of the sigma-delta modulator 420 may be a single bit bit-stream, which can be filtered and/or converted to the numerical values using a digital filter 430. In one embodiment, the digital filter 430 is a counter. In the other embodiment, the standard Sinc digital filter can be used. Alternatively, other digital filters may be used for filtering and/or converting the output 421 of the sigma-delta modulator 420 to provide the digital code 431. It should also be noted that the output 421 may be output to the decision logic 402 or other components of the processing device 210, or to the decision logic 451 or other components of the host 250 to process the bitstream output of the sigma-delta modulator 420.

Described below are the mathematical equations that represent the operations of FIG. 6A. During a normal operation mode, the sigma-delta modulator 420 keeps these currents equal in the average by keeping the voltage on the modulator 623 equal to, or close to, the reference voltage $V_{ref}$ 624. The current of the bias resistor $R_b$ 625 is:

$$I_{Rb} = \frac{V_{cmod}}{R_b} \quad (2)$$

The sensing capacitor $C_x$ 611 in the switched-capacitor mode has equivalent resistance:

$$R_c = \frac{1}{f_s C_x} \quad (3)$$

where $f_s$ is the operation frequency of the switches (e.g., switching circuit 450). If the output 421 of the sigma-delta modulator 420 has a duty cycle of $d_{mod}$, the average current of the switching capacitor 611 can be expressed in the following equation (4):

$$i_c = d_{mod} \frac{V_{dd} - V_{Cmod}}{R_c} \quad (4)$$

In the operation mode, $I_{Rb} = I_c$, (5)

$V_{Cmod} = V_{ref}$ or: $\dfrac{V_{ref}}{R_b} = d_{mod} \dfrac{V_{dd} - V_{ref}}{R_c}$ or taking into account that the reference voltage 624 is part of supply voltage:

$$V_{ref} = k_d V_{dd}; k_d = \frac{R_1}{R_1 + R_2} \quad (6)$$

The Equation (5) can be rewritten in the following form:

$$d_{mod} = \frac{R_c}{R_b} \frac{k_d}{1 - k_d} = \frac{1}{f_s R_b} \frac{k_d}{1 - k_d} \frac{1}{C_x} \quad (7)$$

The Equation (7) determines the minimum sensing capacitance value, which can be measured with the proposed method at given parameters set:

$$d_{mod} \leq 1, \text{ or: } C_{xmin} = \frac{1}{f_s R_b} \frac{k_d}{1-k_d} \qquad (8)$$

The resolution of this method may be determined by the sigma-delta modulator duty cycle measurement resolution, which is represented in the following equations:

$$\Delta d_{mod} = \beta \frac{\Delta C_x}{C_x^2}; \qquad (9)$$

$$\beta = \frac{1}{f_s R_b} \frac{k_d}{1-k_d}$$

or after rewriting relatively $\Delta C_x$, we obtain:

$$\Delta C_x = \frac{1}{\beta} \Delta d_{mod} C_x^2 \qquad (10)$$

In one exemplary embodiment, the resistance of the bias resistor 625 is 20K Ohms ($R_b$=20 k), the operation frequency of the switches is 12 MHz ($f_s$=12 MHz), the capacitance on the switching capacitor 611 is 15 picofarads ($C_x$=15 pF), and the ratio between Vdd 626 and the voltage reference 624 is 0.25 ($k_d$=0.25), the duty cycle has a 12-bit resolution and the capacitance resolution is 0.036 pF.

In some embodiments of capacitive sensing applications, it may be important to get fast data measurements. For example, the modulator can operate at sample frequency 10 MHz (period is 0.1 microseconds (us)), for the 12-bit resolution sample, and digital filter as single-type integrator/counter the measurement time is approximately 410 us (e.g., $2^{12}$*0.1 us=410 us). For faster measurement speeds at same resolutions, other types of digital filters may be used, for example, by using the Sinc2 filter, the scanning time at the same resolution may be reduced approximately 4 times. To do this the sensing method should have suitable measurement speed. In one embodiment, a good measurement rate may be accomplished by using a double integrator as the digital filter 430.

FIG. 6B illustrates a schematic of another embodiment of a circuit 625 including a sigma-delta modulator 420 and a digital filter 430 for measuring capacitance on a sensor element 611. Circuit 625 is similar to the circuit 600, as describe above, except the bias resistor 627 is located between the $V_{dd}$ voltage line 626 and the modulator capacitor 623, instead of between ground and the modulator capacitor 623 (as illustrated in FIG. 6A). Even though this configuration includes a lower switch configuration, it can still have the same positive effect on the noise immunity of the system.

Figure 6C:
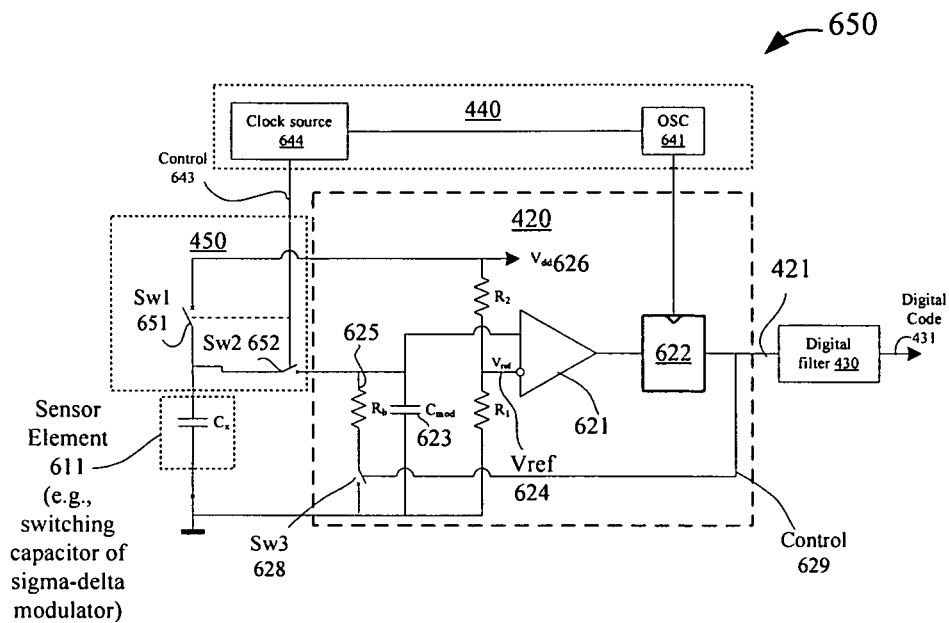
FIG. 6C illustrates a schematic of another embodiment of a circuit including a sigma-delta modulator and a digital filter for measuring capacitance on a sensor element.

FIG. 6C illustrates a schematic of another embodiment of a circuit 650 including a sigma-delta modulator 420 and a digital filter 430 for measuring capacitance on a sensor element 611. Circuit 650 is similar to the circuit 600, as describe above, except the bias resistor 625 is switched in and out by a third switch $S_{W3}$ 628, which is controlled by the output 421 of the sigma-delta modulator 420 via control line 629. Circuit 650 is also dissimilar to circuit 600 in that the clock generation 440 includes a clock source 644 (instead of gate 642) and the oscillator 641. In one embodiment, the clock source 644 is a conventional frequency divider or counter. For better noise immunity, the clock source 644 may be a spread-spectrum clock source, such as a pseudo-random signal (PRS) source, which includes a PRS generator. Alternatively, other clock sources may be used, such as clock dithering, or the like. The oscillator 641 generates an oscillator signal and outputs it to the PRS source 644, which generates control signal 643. The switches $Sw_1$ 651 and $Sw_2$ 652 of switching circuit 440 operate in two, non-overlapping phases, as controlled by the control signal 643. Using the control signal 643, the switching circuit 440 operates to provide a charge current to the switching capacitor 611 in one phase (e.g., activating switch $Sw_1$ 651), and to transfer charge from the switching capacitor 611 in a second phase (e.g., activating switch $Sw_2$ 652). Using the control signal 629, the sigma-delta modulator 420 operates to switch, in and out, the connection of bias resistor 625 to the charge modulator capacitor 623 to discharge and charge the modulator capacitor 623. The circuits described with respect to FIG. 6C differ from the embodiments described above in that they differ in operational capacitance range and resolution. In the embodiments of FIGS. 6A and 6B, the duty cycle is inversely proportional to the sensing capacitance and the resolution is not constant. In contrast, the embodiments of FIG. 6C and FIG. 6D include a duty cycle that is linearly proportional to the sensing capacitance and the resolution is constant. These embodiments may be used to keep the resolution constant in the operational capacitance range.

Figure 6D:
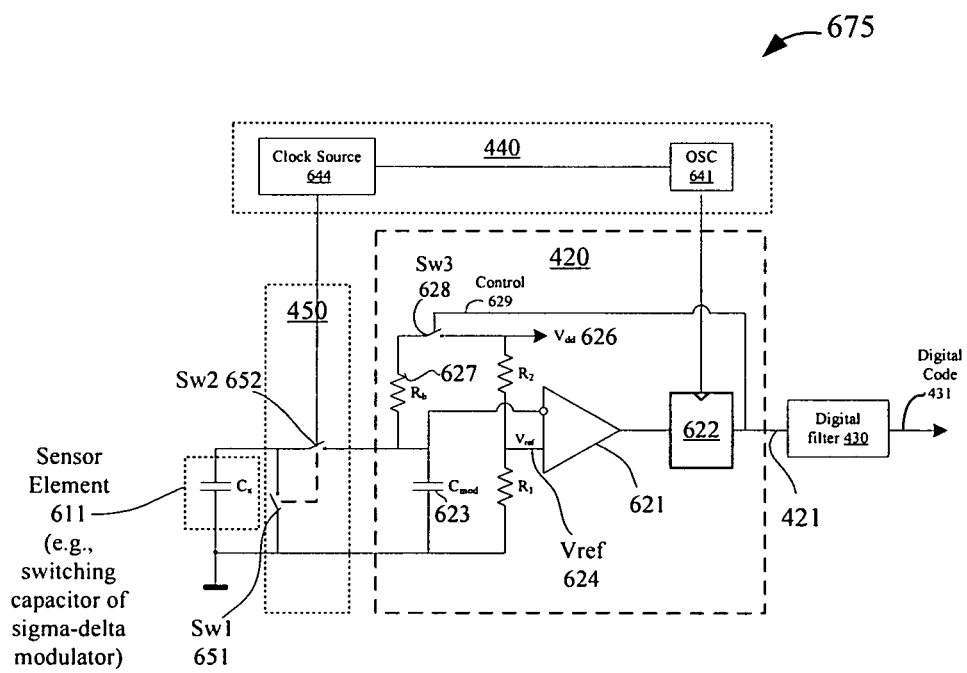
FIG. 6D illustrates a schematic of another embodiment of a circuit including a sigma-delta modulator and a digital filter for measuring capacitance on a sensor element.

It should also be noted that the embodiments of FIGS. 6A and 6C use the upper switch placements, while the embodiments of FIGS. 6B and 6D use lower switch placements; however, their operations may be the same.

Described below are the mathematical equations that represent the operations of FIG. 6C. The switching capacitor 611 has equivalent resistance accordingly to the Equation (11). The current via this resistor is:

$$I_c = C_x f_s (V_{dd} - V_{Cint}) \qquad (11)$$

The averaged current via bias resistor $R_b$ 625 is:

$$I_{Rb} = \frac{d_{mod} V_{Cint}}{R_b} \qquad (12)$$

sigma-delta modulator 420 keeps these currents equal in the average by keeping the voltage on the modulator capacitor 623 equal to, or close to, the reference voltage $V_{ref}$ 624. By $I_c=I_{Rb}$ and taking into account the equation (6) we can obtain:

$$d_{mod} = C_x f_s R_b \left( \frac{1}{k_d} - 1 \right) \qquad (13)$$

The Equation (13) determines the maximum sensing capacitance value, which can be measured with the proposed method at given parameters set: $d_{mod} \leq 1$, or:

$$C_{xmax} = \frac{k_d}{1-k_d} \frac{1}{R_b f_s} \qquad (14)$$

The resolution for this configuration can be evaluated by the following Equation (15):

$$\Delta C_x = \frac{k_d}{1-k_d} \frac{1}{R_b f_s} \Delta d_{mod} \qquad (15)$$

In one exemplary embodiment, by substituting the following values: $k_d$=0.25, Rb=1.6 k, $f_s$=12 MHz, the capacitance on switching capacitor 611 is measured with 12-bits resolution, the maximum sensing capacitance value is equal to 17 pF (Cxmax=17 pF), and the resolution is 0.05 pF.

The embodiment described with respect to FIG. 6C may include some advantages. These advantages may include that the duty cycle of the sigma-delta modulator 420 is linearly proportional to the capacitance on the sensor element 611, and that the sensitivity is constant regardless the capacitance value.

In one embodiment, the control signal 643 is from a spread source, such as the PSR source 644, to provide some electromagnetic interference (EMI) immunity. EMI may be an electrical disturbance in a system due to natural phenomena, low-frequency waves from electromechanical devices or high-frequency waves (RFI) from chips and other electronic devices. Alternatively, other spread-clock sources can be used, such as voltage controlled oscillators with an analog noise source, or the like.

FIG. 6D illustrates a schematic of another embodiment of a sigma-delta modulator and a digital filter. Circuit 675 is similar to the circuit 650, as describe above, except the bias resistor 627 is located between the Vdd voltage line 626 and the modulator capacitor 623, instead of between ground and the modulator capacitor 623 (as illustrated in FIG. 6C). This embodiment is similar to the embodiment of FIG. 6C, however, the modulator capacitor in FIG. 6D is charged by the feedback resistor and discharged by the switching capacitor, while the modulator capacitor in FIG. 6C is charged from the switching capacitor and is discharged by the feedback resistor.

In one embodiment, the bias resistor 625 or 627 and the modulator capacitor 623 are external components to the sigma-delta modulator 420, which resides in the processing device 210. This may allow modifications to be made to these components without modifications to the processing device 210. In another embodiment, these components reside within the sigma-delta modulator 420 and the sigma-delta modulator 420 may reside external to the processing device 210. Alternatively, all components reside in the processing device 210. Similarly, in other embodiments, the components described herein may reside on a common carrier substrate such as, for example, an integrated circuit (IC) die substrate, a multi-chip module substrate, or the like. Alternatively, the components of circuits of FIGS. 6A-6D may be one or more separate integrated circuits and/or discrete components. In another embodiment, the voltage divider 829, including the two resistors R1 and R2 are external components to the sigma-delta modulator 420, as illustrated in FIG. 8A. The voltage divider 829 is configured to divide the voltage on the voltage source line 626 to provide as output, the reference voltage 624. In another embodiment, the reference voltage 624 may be provided by a bandgap voltage 824. Alternatively, other circuits known by those of ordinary skill in the art may be used to supply the circuit with the reference voltage 624.

It should be noted that the reference voltage 624 of FIGS. 6A-6D is derived from a voltage divider using two resistors (e.g., R1 and R2) and the voltage source Vdd line 626. Alternatively, the reference voltage 624 may be set using other methods known by those of ordinary skill in the art, such as a separate voltage source, filtered PWM signal, or the like.

It should be noted that FIGS. 6A-6D are simplified schematics, and the additional components may be included in the circuits of FIGS. 6A-6D. Alternatively, the schematics may include only the components illustrated in FIGS. 6A-6D.

It should be noted that the bias resistor (e.g., bias resistor 625 or 627 of FIGS. 6A and 6C, and FIGS. 6B and 6D, respectively) can be replaced by a current source and a fixed reference voltage for the reference voltage 624 can be used. For example, the charging current may be generated in a register programmable current output DAC (also known as IDAC). Accordingly, the current source may be a current DAC or IDAC. The IDAC output current may be set by an 8-bit value provided by the processing device 210, such as from the processing core 202. The 8-bit value may be stored in a register or in memory. Alternatively, other types of current sources may be used. One advantage of using a current source may be that it can be programmable with a wide range of values, for example, the current source may be programmed in the firmware of the processing device 210. However, currents source may be unstable, and may have limited output impedance. One advantage of using resistors and the voltage source is it may have less dependence on the power supply voltage change.

In other embodiments, one of the switches 651 or 652 can be replaced by a resistor. This however, may result in performance degradation, but allows the circuit to be implement on a processing device with limited resources.

Figure 7A:
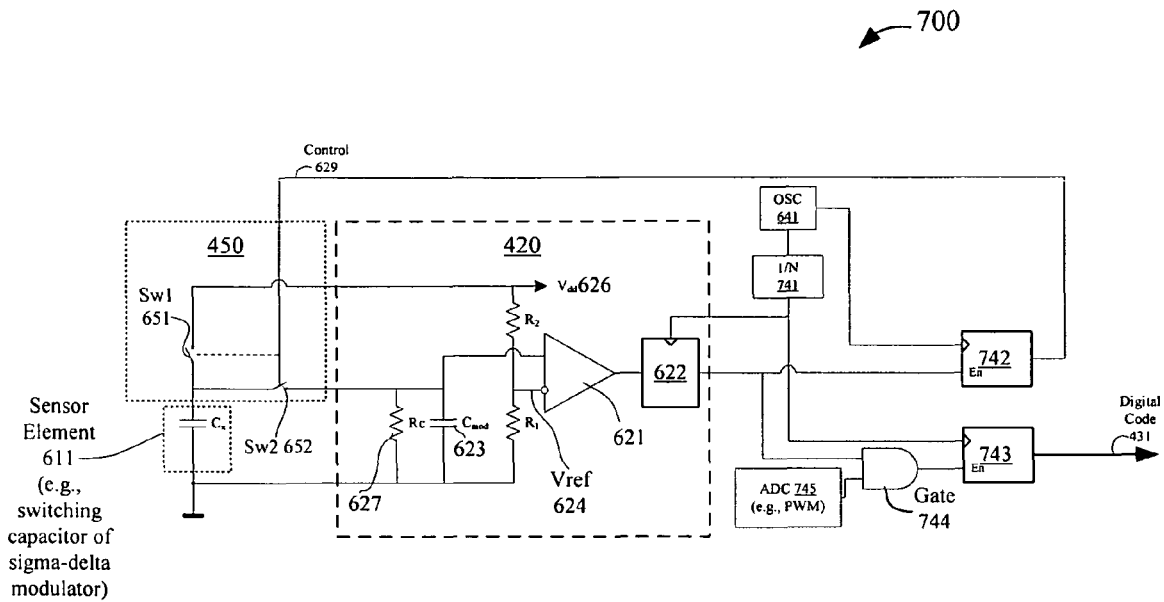
FIG. 7A illustrates a schematic of one embodiment of a circuit including a sigma-delta modulator for measuring capacitance on a sensor element.

FIG. 7A illustrates a schematic of one embodiment of a circuit including a sigma-delta modulator for measuring capacitance on a sensor element. Circuit 700 is similar to the circuit 600 with respect to the switching circuit and the sigma-delta modulator 420. However, the output of the sigma-delta modulator 420 is coupled to receive a clock signal to latch 622 from a frequency divider 741 (also referred to as a prescaler), which divides an oscillator signal from oscillator 641. The output of the latch 622 is input into the enable input of a first flip-flop 742, which provides a control signal 629 to the switching circuit 450. The output of the latch 622 is also input into one input of gate 744, which also receives on the other input a signal from the pulse width modulator (PWM) 745, which generates variable-length pulses to represent the amplitude of an analog input signal). The output of the gate is input into the enable input of a second flip-flop 743, which receives the clock signal from the frequency divider 741. The output of the second flip-flop 743 includes the digital code 431.

Figure 7B:
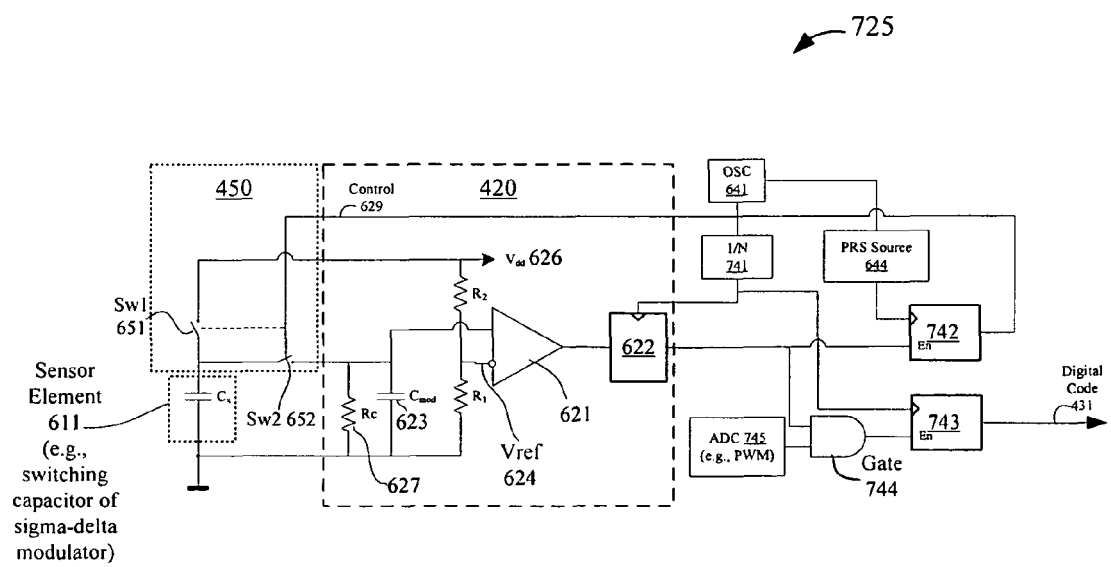
FIG. 7B illustrates a schematic of another embodiment of a circuit including a sigma-delta modulator for measuring capacitance on a sensor element.

FIG. 7B illustrates a schematic of another embodiment of a circuit including a sigma-delta modulator for measuring capacitance on a sensor element. Circuit 725 is similar to the circuit 700, as describe above, except a PRS source 644 is coupled between the oscillator 641 and the first flip-flop 742. As described above, the PRS source provides spread-spectrum operations.

Figure 7C:
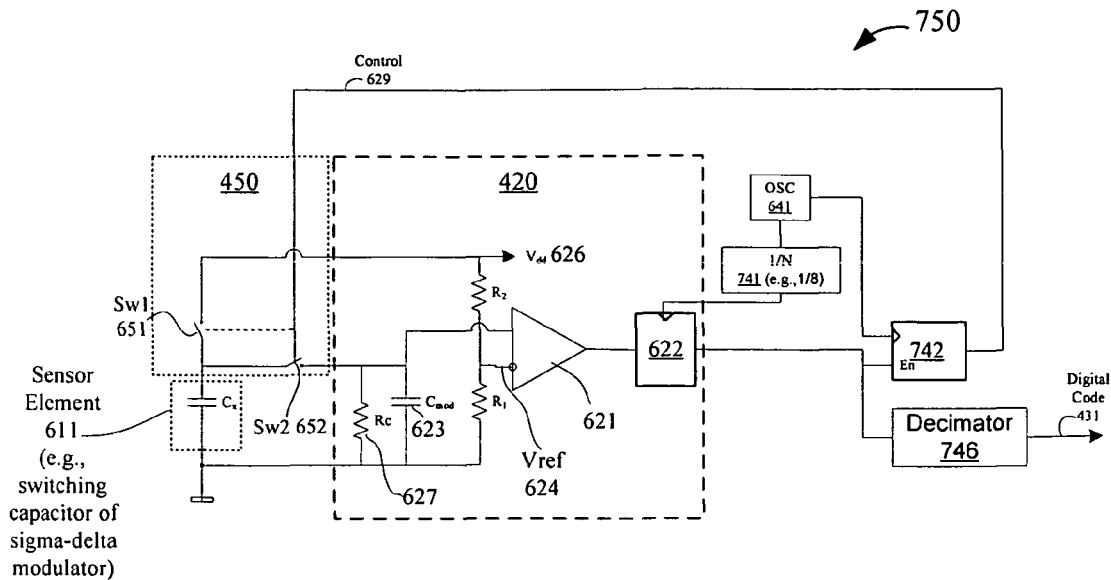
FIG. 7C illustrates a schematic of another embodiment of a circuit including a sigma-delta modulator for measuring capacitance on a sensor element.

FIG. 7C illustrates a schematic of another embodiment of a circuit including a sigma-delta modulator and a decimator type digital filter for measuring capacitance on a sensor element. Circuit 750 is similar to the circuit 700, as describe above, except a decimator 746 is coupled to the output of the latch 622 of the sigma-delta modulator 420, instead of the PWM 745, gate 744, and second flip-flop 743. The decimator 746 is configured to provide the digital code 431. In one embodiment, the frequency divider 741 is a ⅛ frequency divider. Alternatively, other values may be used.

Figure 7D:
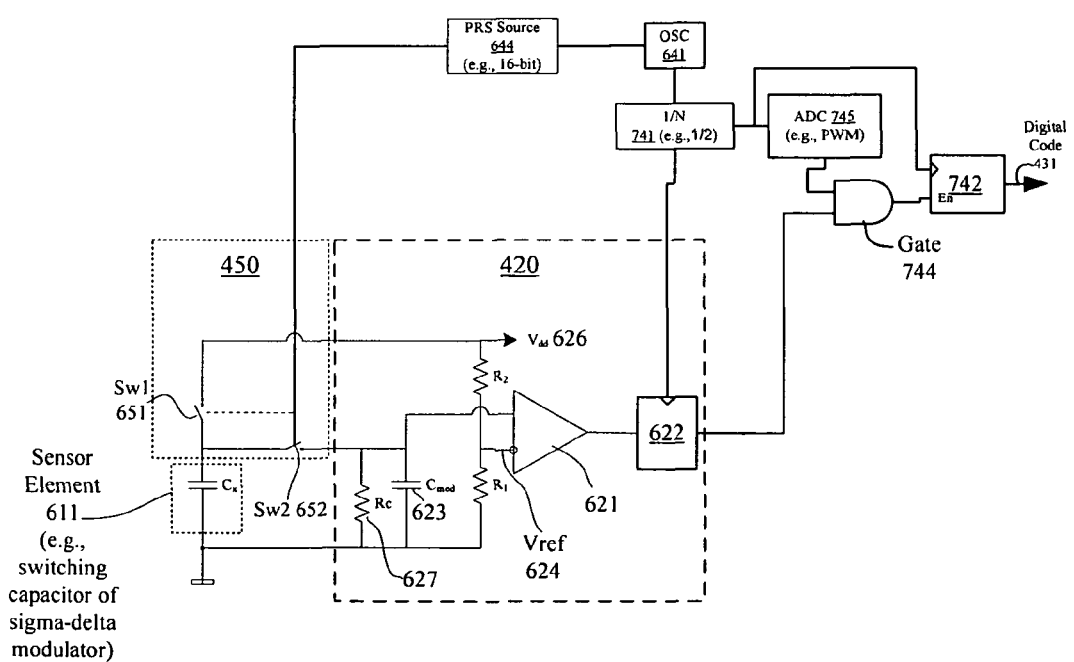
FIG. 7D illustrates a schematic of another embodiment of a circuit including a sigma-delta modulator and for measuring capacitance on a sensor element.

FIG. 7D illustrates a schematic of another embodiment of a circuit including a sigma-delta modulator and a synchronizing and filter circuit for measuring capacitance on a sensor element. Circuit 775 is similar to the circuit 700 with respect to the switching circuit and the sigma-delta modulator 420. However, the output of the sigma-delta modulator 420 is coupled to receive a clock signal to latch 622 from a frequency divider 741, which divides an oscillator signal from oscillator 641. The output of the latch 622 is input to one input of gate 744, which also receives on the other input the output of PWM 745, which receives the same clock signal from the frequency divider 741. The output of the gate 744 is input as the enable input to the flip-flop 742, which receives the input of the PWM 745. The output of the flip-flop 742 includes the digital code 431. In addition, this embodiment includes a PRS source 644 is placed between the oscillator 641 and the switching circuit 450 to provide the control signal 629, instead of the first flip-flop 742 of circuit 700 of FIG. 7A.

FIG. 8A illustrates a schematic of another embodiment of a circuit including a sigma-delta modulator, a clock generation circuit, and a counter-based digital filter for measuring capacitance on a sensor element. Circuit 800 includes the sigma-delta modulator 420, the switching circuit 450, the sensor element 611, as described with respect to the embodiments above of FIGS. 6A-6D, and 7A-7D. However, the clock generation circuit 440 and the digital filter 430 include different elements than the circuits described above.

The digital filter 430 includes the PWM 745, a gate 831, and counter 832. The digital filter 430 may be a simple single integrator, based on the counter 832 with enabled input. The gate receives, as inputs, the output of the sigma-delta modulator 420 (e.g., from latch 622) and the output of the PWM 745, and provides, as output, an enable signal for the counter 832. The counter 832 is clocked by the clock signal received from the $VC_1$ 842 of the synchronizing circuit 440. The counter 832 provides, as output, the digital code 643 to the decision logic, such as decision logic 402 or 451.

FIG. 8B illustrates a schematic of another embodiment of a circuit including a sigma-delta modulator and a decimator-type digital filter for measuring capacitance on a sensor element. The circuit 825 is similar to the circuit 800, as describe above, except the digital filter 430 includes a decimator 833. In one embodiment, the decimator 833 is a hardware decimator, second order Sinc type digital filter. Alternatively, other types of decimators may be used. Decimators are known by those of ordinary skill in the art, and according, a detailed description regarding them has not been included. Alternatively, the digital filter 430 may not include the gate 831 and PWM 745.

In the embodiments of FIGS. 8A and 8B, the clock generation circuit 440 includes an internal main oscillator (IMO) 841, clock source 844, and a frequency divider 741 (also referred to as a prescaler). The output of the clock source 844 provides the control signal 629 to control the switching operations of the switching circuit 450 (e.g., two non-overlapping switches). Alternatively, the control signal may be provided to the switching circuit 440 using other embodiments described herein. The internal main oscillator (IMO) 841 forms all clock signals. The modulator latch signal comes from frequency divider 741 (also referred to as a prescaler). The switches clock source may be built around a pseudo-random sequence (PRS) generator that is used for spread-spectrum operation.

Embodiments described herein may include one or more of the following advantages. The embodiments may include higher sensitivity and higher resolution than conventional capacitance measuring techniques (e.g., relaxation oscillator), and better noise immunity than conventional designs because the switching capacitor 611 is charged from low-impedance source (voltage source 626) at one phase, which output impedance is less than approximately 1K Ohm, and is discharged to the low-impedance current recipient (e.g., modulator capacitor 623 is a larger value capacitor than the switching capacitor 611) at second phase. The embodiments described herein may have the ability to operate with thicker overlays than the conventional capacitance measuring techniques (e.g., thicknesses greater than approximately 5 mm). The embodiments described herein may have an improved EMI immunity than conventional designs when a spread spectrum source is used for the switching capacitor operation. The spread spectrum source allows the system to operate in a wide frequency range with the presence of noise, as compared to the fixed operation frequency systems of the conventional designs that can easily be disturbed by noise when the noise frequency is close to the operation frequency. The embodiments described herein may have low sensitivity to the sensing element resistance in series, which allows operations with high-resistive conductive materials (e.g., larger than 100 Ω/square, for example ITO panels. For example, ITO panels which have a larger sensing zone can be used because the summarized resistance is less than 1K Ohms, as compared to a thin and long ITO line that has a resistance about 30-100K Ohms, which makes capacitance sensing more difficult, especially when a high operational frequency is used. The embodiments described herein may also be expandable to the linear position sensing through conductive materials (e.g., two-wire touch-sensor sliders, three-wire rotation wheel touch-sensor slider, or a four-wire touch-sensor pad).

The embodiments of the method described herein may also include advantages over the conventional capacitance sensing methods, such as flexible configuration measurement resolution versus conversion time, flexible capacitance measurement resolution versus time, such as by properly configuring the digital filter for "decimation" ratio; provides continuous type operation. Another advantage may include filtering the modulator bitstream in the parallel by several digital filters, one can be integration digital filter with long accumulation interval for high-resolution absolute values capacitance measurements, and a second can be digital filter for tracking fast capacitance change, for example. Due to the integration nature of operation of the sigma-delta modulator 420, the sigma-delta modulator output bit-stream is passed to through a low-pass digital filter, which attenuates the noise during measurement phase, which may provide an additional advantage over conventional methods. In other embodiments that include spread-spectrum operations, even if only the counter-based clock source is used, the switching signal is modulated by sigma-delta modulator output, providing some spectrum spreading in the circuit of FIG. 6A. However, using the PRS source as switches clock source (e.g., control signal 643) for the spread spectrum operation provides a circuit that is more robust to external noise signals.

In addition, the embodiments described herein may be configured so that no precision external capacitors are used, and there may be no demands for the stable charge-accumulation capacitor to be resistant to the sharp temperature changes, as in the existing charge transfer methods.

In one embodiment, a threshold operation mode may be supported. For example, in the circuits 600 and 625 of FIGS. 6A and 6B, may be configured to set the reference voltage at a level (e.g., voltage on at which if sensing capacitance on the switching capacitor 611 is too low (e.g., the comparator input voltage is less than the reference voltage by a pre-determined value), the device can be put in a low-power or standby mode, and a subsequent touch (e.g., presence of a conductive object) brings the device from the standby mode to normal operation mode. This mode may be configured to be used as an automatic device wake-up operation, for example.

The embodiments described herein may be easy to manufacture on silicon (e.g., Easy to silicon implementations), for example, for the analog resources may be minimal (e.g., only one analog comparator with couple resistors). Also, the additional components, such as the PRS (or other spread spectrum sources), counters, decimators may be easy to manufacture using modern silicon process. In one exemplary embodiment, the embodiments are implemented in one digital block and one analog block of the (PSOC™) processing device, manufactured by Cypress Semiconductor Corporation, San Jose, Calif. Also, by selecting the switching frequency properly, good environmental factor compensation may be possible, such as for humidity, water films, or the like). For example, the water influence can be reduced by using the higher operation frequencies (12 MHz or more), where water dielectric constant is reduced.

The embodiments described herein may be implemented in various capacitance sensing applications, such as linear slider sensing, plane sensing, key matrix switches implementation, and the like. Some of these embodiments have been described in additional detail below. The embodiments described herein may be implemented in a one-dimensional position sensing device, such as two-pin sliders, three-pin rotation wheel slider, keyboards by connection keys, level sensing devices (e.g., water level sensing, etc), and other one-dimensional position sensing devices. The embodiments described herein may also be implemented in multi-dimensional position sensing devices, such as various touch-sensor pads, transparent touch screens, keyboards (e.g., personal computer (PC) keyboards, industrial controller keyboards, remotes, or the like), game accessories, or other multi-dimensional position sensing devices. Alternatively, the embodiments described herein may be implemented to measure capacitance on a single sensor element, such as a touch-sensor button.

The embodiments described herein may be with conductive materials of position sensing, such as ITO materials for both single and multi-dimensional sensing devices. For example, the embodiments may be implemented in a dual layer, matrix scanning application, such as illustrate in FIG. 9. The dual layer ITO panel example consists of non-interlaced row and column sensing zones. The ITO panel may scan the rows and columns in series (e.g., sequentially), or alternatively, in parallel (e.g., simultaneously). This design may have the following advantages over the oscillator-based methods: the capacitance measurements have no dependence on the resistor in series, which is important for scanning via high-resistance conductive materials. In the embodiments described herein, the transmitted charge amount between cycles does not depend on the resistor in series if equilibrium state is reached within each cycle.

In one embodiment, the operational frequency of the switching circuit should be selected in such as way as to provide complete row or column line re-charge each switching cycle. For example, the operation frequency can be selected to be less than 1 MHz, such as 300-400 kHz for a 50×50 mm panel with 10 mils connection and inter-segment tracks, made from 400 Ω/square ITO material. Alternatively, other higher receptivity materials can be used, which use lower operation frequency.

Described below are embodiments of applications that may be implemented using the embodiments described above.

Some applications of capacitance sensing devices require the reliable operation in the presence of the water films or drops on the sensing device. For example, various applications, such as household appliances, automotive applications, industrial application, need sensor elements that do not provide false triggering when the presence of water, ice, humidity, or the like exists and/or changes on the sensor elements. In one embodiment, a separate shielding electrode can be used.

Figure 9A:
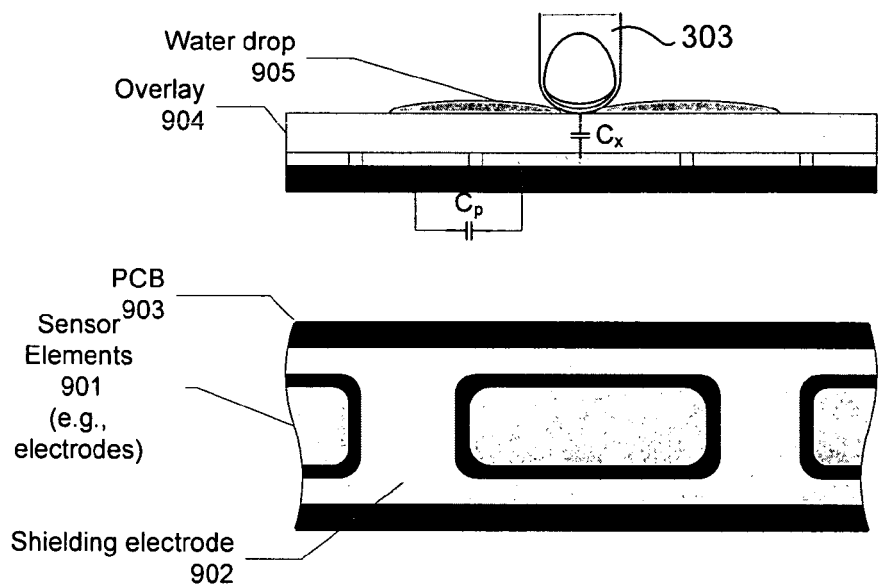
FIG. 9A illustrate cross-sectional and top-side views of one embodiment of a water drop on a sensing device including multiple sensor elements and a shielding electrode.

FIG. 9A illustrate cross-sectional and top-side views of one embodiment of a water drop on a sensing device including multiple sensor elements and a shielding electrode. The sensing device 900 includes sensor elements 901 and a shielding electrode 902 on a printed circuit board 903. The printed circuit board including an overlay 904, upon which a water drop 905 is disposed. The shielding electrode 902 may be located on the same layer of the sensor elements 901, or alternatively, on a separate layer of the PCB 903. The shielding electrode 902 may surround the sensor elements 901, or alternatively, may be adjacent to the sensor elements 901.

When a water drop or water film is present on the overlay of the sensing device, the coupling between the shielding electrode 902 and the sensor elements 901 is increased. For example, when water drops are located between shielding and sensing electrodes, the $C_p$ is increased and modulator current is reduced. The increase of coupling between the sensor elements and the shielding electrode may increase the raw counts measured by the processing device. This may result in false triggering of button activation when no button has been pressed. In one embodiment, in response to the presence of water drops, the modulator reference voltage is increased by an API in such way that the raw count increase caused from the water drops can be corrected (e.g., calibrated to be close to zero, or alternatively, slightly negative).

In this example button is covered by shielding electrode plane. As alternative placement example the shielding electrode can be located at the opposite PCB layer, including the plane under button. In one embodiment, a hatch pattern, as illustrated in FIG. 9A, may be used for the shielding electrode. In one embodiment, the fill ratio of the shielding electrode to sensor element is approximately 30-40%. Alternatively, other patterns and ratios may be used.

In one embodiment, the shield electrode may be in a transparent touchpad device. This may be useful to block the noise influence of the LCD drive electrodes and reduce the stray capacitance at the same time.

Figure 9B:
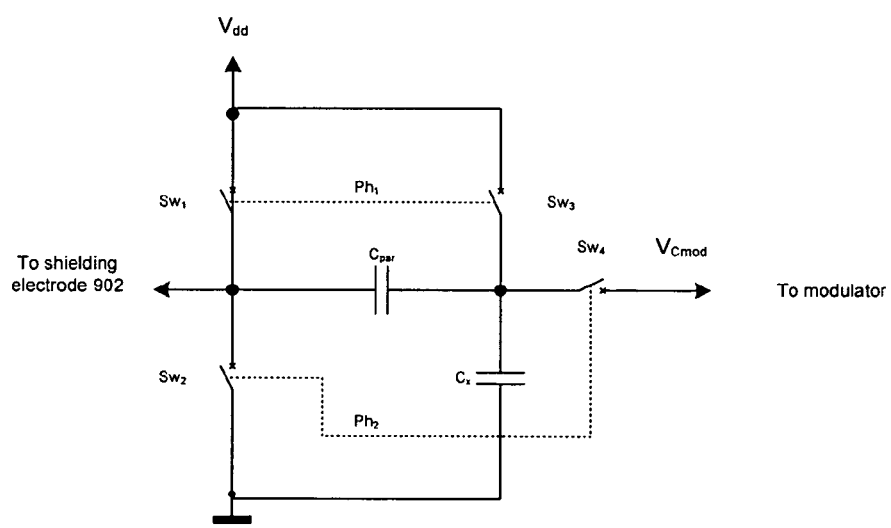
FIG. 9B illustrates one embodiment of a switching circuit and switching capacitor coupled to a shielding electrode.

FIG. 9B illustrates one embodiment of a switching circuit and switching capacitor coupled to a shielding electrode. In this embodiment, the same clock signal that is used to precharge the sensor element 901 is supplied to shielding electrode 902. Here the sensor capacitance $C_x$ is the capacitance on the sensor element (e.g., switching capacitor) and the parasitic capacitance $C_p$ is between the shielding electrode 902 and sensor element 901. The first and third switches $Sw_1$ and $Sw_3$ are on at on at phase 1, $Phi_1$ phase, and the second and fourth switches $Sw_2$ and $Sw_4$ are on at phase 2, $Phi_2$. The $C_{par}$ is discharged at $Ph_1$ phase and is charged at $Ph_2$ phase. The modulator current is algebraic sum of $C_x$ and $C_{par}$ currents, which is represented in the following equation:

$$I_{mod}=I_C-I_{Cpar}=f_sC_x(V_{dd}-V_{Cmod})-f_sC_{par}V_{Cmod} \quad (16)$$

As seen from equation (16), the modulator current is reduced with coupling increasing between electrodes, which allows separate signals from water and conductive object 303 (e.g., finger). Water drops may decrease the modulator current, and the finger touch may increase the modulator current. This may simplify the decision logic operation.

Figure 10A:
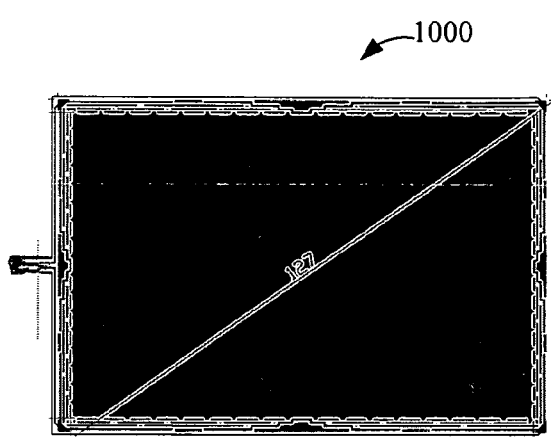
FIG. 10A illustrates one embodiment of a single layer, four-wire ITO touch panel.

FIG. 10A illustrates one embodiment of a single layer, four-wire ITO touch panel. The ITO touch panel 1000 includes solid ITO coating with the electric filed linearization electrodes. It should be noted that some embodiments may not use the field linearization electrodes, and alternatively, the linearization may be in firmware of the processing device.

Figure 10B:
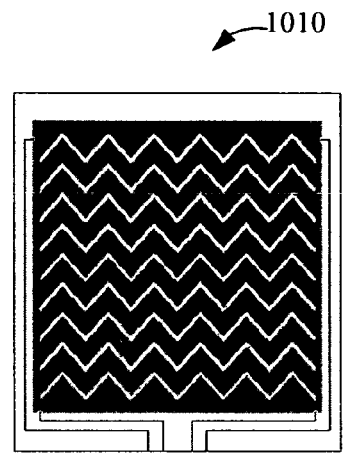
FIG. 10B illustrates another embodiment of a single layer, four-wire ITO touch panel.

FIG. 10B illustrates another embodiment of a single layer, four-wire ITO touch panel. The ITO touch panel 1010 includes multiple resistive sliders, connected in the parallel, that provide linear electric field gradient over the panel 1010. Similarly, this topology may not use the field linearization electrodes, and the linearization may be done in firmware of the processing device.

Figure 10C:
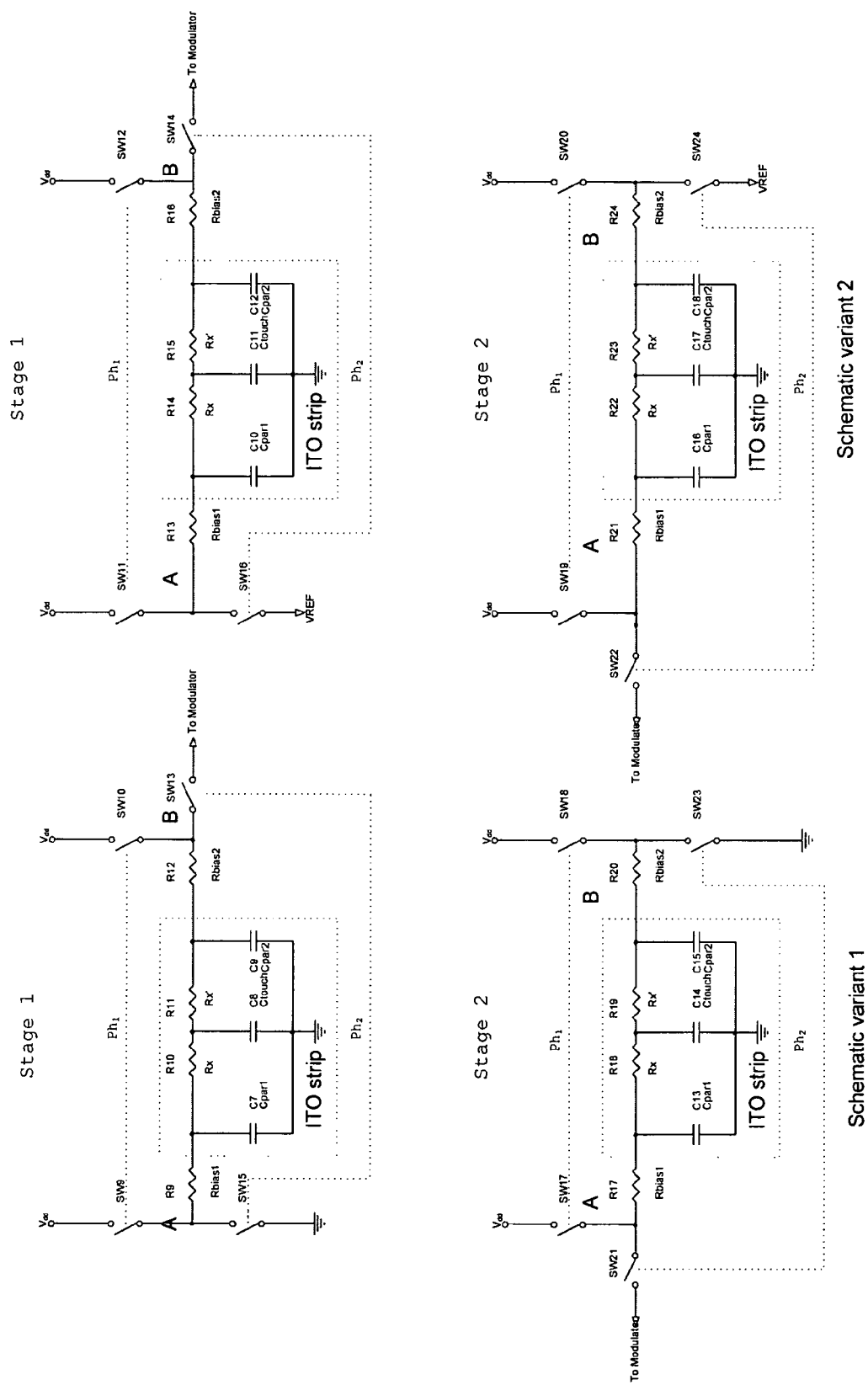
FIG. 10C illustrates various embodiments of upper switch placements of the switches of a one-dimensional touch panel.

FIG. 10C illustrates various embodiments of upper switch placements of the switches of a one-dimensional touch panel. The operation idea is charging the resistive material to some voltage at $Ph_1$. At the $Ph_2$ one edge of resistive material is connected to the ground or fixed voltage source, the second edge is connected to the sigma-delta modulator capacitor. This connection forms the resistive network that provides the modulator filter capacitor current flow path. The current value depends on the touch capacitance and its position on slider.

To find the touch position regardless its capacitance, the slider ends are reversed and measurement cycle is repeated. These stages are called Stage 1 and Stage 2. In the Stage 1 the A edge of conductive material is connected to the fixed potential net at $Ph_2$ operation cycle and current is sensed from side B of conductive strip. In the Stage 2 the B edge of conductive material is connected to the fixed voltage net and signal from edge A is passed to the modulator filtering capacitor. The touch position can be found by doing relatively simple math calculations as described below.

Capacitor $C_x$ indicates the capacity of slider and capacity introduced by finger in the touch point. This discussion, however does not consider the slider distributed parasitic capacitance and its influence on the measurement results for math simplification. It should be noted that the influence of the parasitic capacitance should be constant over one dimensional strip during measurement cycle.

At the $Ph_1$, the capacitor $C_x$ is charged by fixed voltage $V_{dd}$. Charge time should be enough for transient process finalization. At the $Ph_2$ the $C_x$ is discharged. Discharge time is limited by $Ph_2$ duration period, mark as $t_r$. The sigma-delta modulator keeps the input voltage close to $V_{ref}$ and this voltage can be assumed constant during operation. Quantity of charge, passed through resistor $R_x$ will be equal to integral of current passed through this resistor, as represented in the following equations:

$$i_{Rx} = \frac{V_{Cx}(t) - V_{ref}}{R_x} \qquad (17)$$

$$\Delta Q = \int_0^{t_r} \frac{V_{Cx}(t) - V_{ref}}{R_x} \cdot dt \qquad (18)$$

The process of capacitor discharging is described by the following first order differential equation:

$$V_{Cx}(t) = \frac{R_x \cdot R_{x1}}{R_x + R_{x1}} \cdot C_x \cdot \frac{dV_{Cx}}{dt} + \frac{R_{x1}}{R_x + R_{x1}} \cdot V_{ref} \qquad (19)$$

For the initial conditions: $V_{Cx}(0) = V_{dd}$, $V_{ref}$=constant, the solution of equation (19) will be:

$$V_{Cx}(t) = \qquad (20)$$
$$\frac{R_{x1}}{R_x + R_{x1}} \cdot V_{ref} + \left(V_{dd} - \frac{R_{x1}}{R_x + R_{x1}} \cdot V_{ref}\right) \cdot \exp\left(-\frac{R_x + R_{x1}}{R_x + R_{x1}} \cdot \frac{t_r}{C_x}\right)$$

The following equation includes the resistive divider on $R_x$, $R_{x1}$. We can simplify it by using the following substitutions:

$$R_{x1} + R_x = R; \quad K = \frac{R_{x1}}{R}; \quad 1 - K = \frac{R_x}{R}; \qquad (21)$$

$$\frac{R}{R_x \cdot R_{x1}} = \frac{1}{K \cdot (1-K) \cdot R}$$

Now, changing equation 21, taking into account equation 20 for resistive tap, the following equation is derived:

$$V_{Cx}(t) = K \cdot V_{ref} + (V_{dd} - K \cdot V_{ref}) \times \exp\left(-\frac{1}{K \cdot (1-K) \cdot R} \cdot \frac{t}{C_x}\right) \qquad (22)$$

By substituting the equation 22 in equation 18 and integrating over cycle time $t_r$, we can get the following equation for charge, transferred each switching cycle with duration $t_r$:

$$\Delta Q = \frac{1}{R} \cdot V_{ref} \cdot t_r + \qquad (23)$$
$$K \cdot C_x \cdot (V_{dd} - K \cdot V_{ref}) \times \left(\exp\left[-\frac{1}{K \cdot (1-K) \cdot R} \cdot \frac{t_r}{C_x}\right] - 1\right)$$

By dividing the equation (23) on $Ph_2$ duration time $t_r$, one can determine the current value via switching capacitor slider, as represented in the following equation:

$$I_{sw} = \qquad (24)$$
$$\frac{1}{R} \cdot V_{ref} + \frac{K \cdot C_x}{t_r} \cdot (V_{dd} - K \cdot V_{ref}) \times \left(\exp\left[-\frac{1}{K \cdot (1-K) \cdot R} \cdot \frac{t_r}{C_x}\right] - 1\right)$$

This equation represents two components. One component covers the resistive strip DC current (left term, that is inversely proportional to the R), and second component is caused by the presence of the conductive object (e.g., touch influence). The sigma-delta modulator converts the $I_{se}$ current in the duty cycle.

Figure 10D:
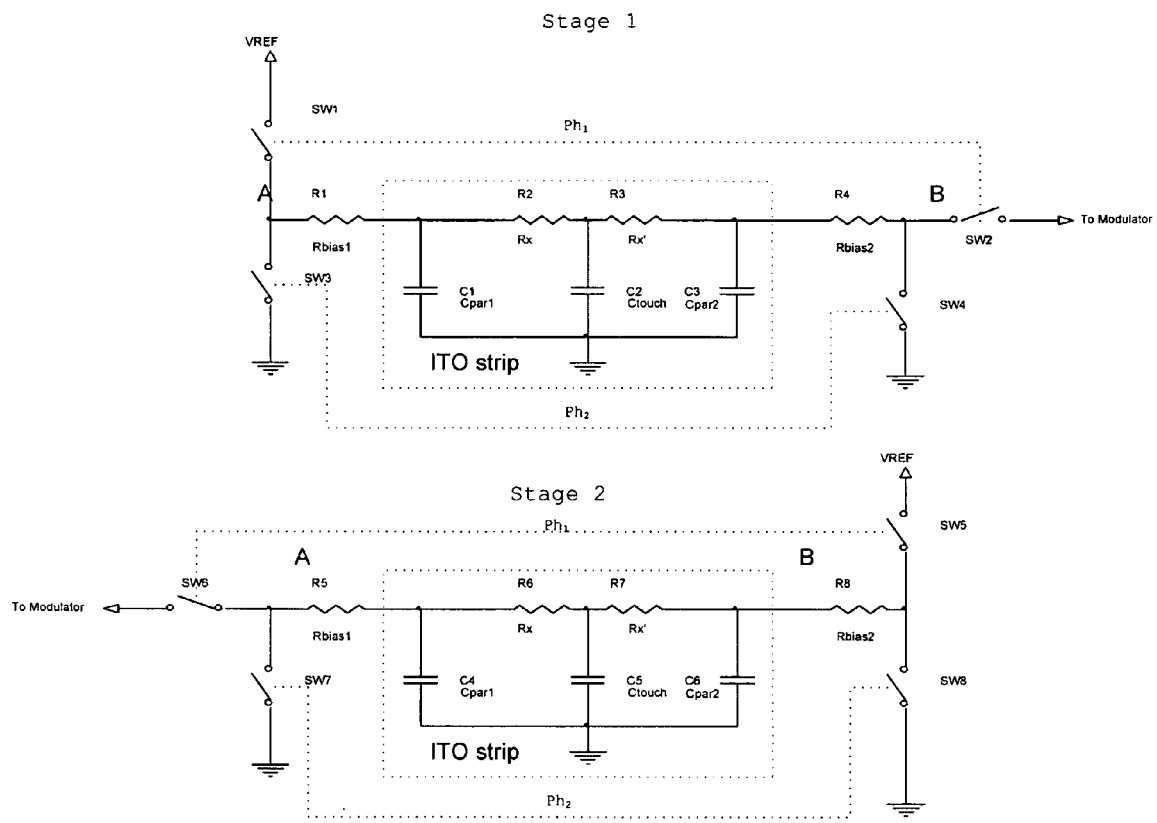
FIG. 10D illustrates various embodiments of lower switch placements of the switches of a one-dimensional touch panel.

FIG. 10D illustrates various embodiments of lower switch placements of the switches of a one-dimensional touch panel. The operation of these embodiments is similar to those described above with respect to the upper switch placements, and is apparent to one of ordinary skill in the art. Accordingly, additional details regarding their operation have not been included.

Figure 10E:
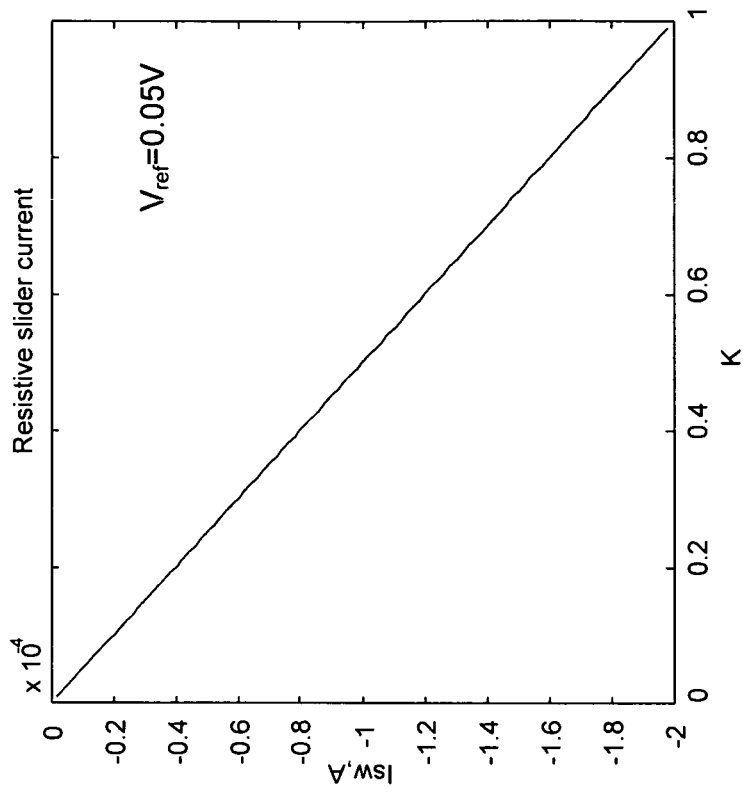
FIG. 10E illustrates two graphs of two embodiment of the transfer function of the ITO touch panel of FIG. 10C.
Figure 10E:
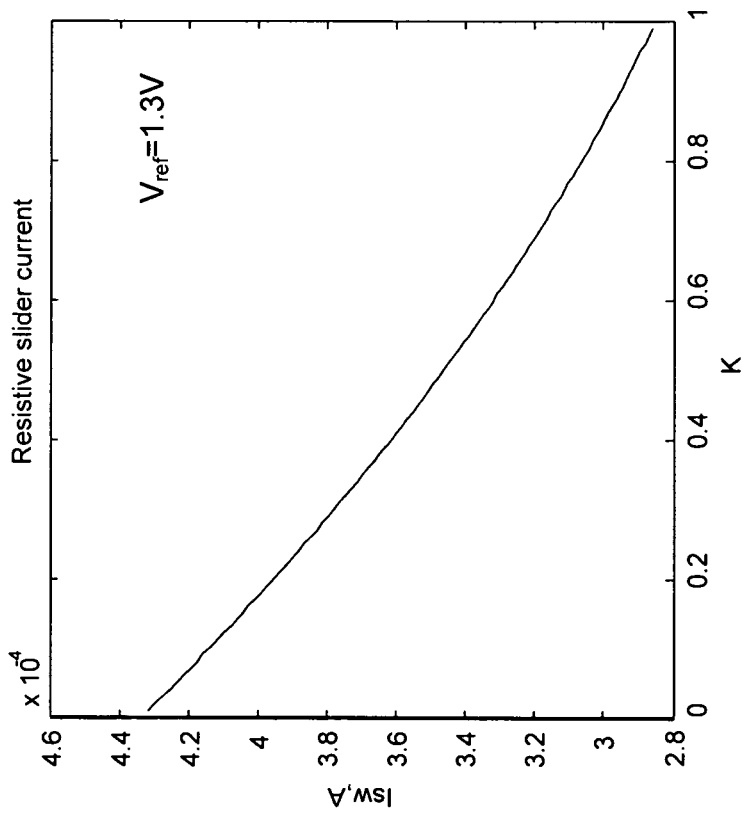

FIG. 10E illustrates two graphs of two embodiment of the transfer function of the ITO touch panel of FIG. 10C. These embodiments include the following exemplary values: $C_x$=10 pF, $t_r$=500 ns, $V_{dd}$=5V, R=300 Ohm. Alternatively, other values may be used. As noted in the two graphs, the transfer function becomes more linear when reference voltage is lowered. For example, in the left graph the reference voltage is 1.3 V and the right graph the reference voltage is 0.05 volts, and the resulting transfer function of the graph on the right is more linear than the transfer function on the left graph. Also, by lowering the reference voltage $V_{ref}$, the resistive material current component is reduced. In one embodiment, the configuration includes connecting the second end of resistive strip to net with same potential as the modulator reference voltage $V_{ref}$. This may provide the linear transfer characteristic and no dependence from resistive strip absolute resistance value.

It should be noted that the description above may be extended for two dimension operation by increasing the number of parallel operation channels (e.g., using two or more sigma-delta modulators, operating in parallel) or by sensing the two dimensional panel as a set of one dimension sliders. In this embodiment, the two panel edges effectively are a one-dimensional slider with A,B terminals. The left two edge connectors can be left non-connected or be connected to the modulator reference voltage source, forming the different measurement schemes.

For example, a 4 wire ITO panel configuration may include four modulators with four separate digital filters, which are used at same time. If two sigma-delta modulators are running in parallel, slider touch position may be determined in one single stage, eliminating the need for two separate stages, Stage 1 and Stage 2. Running several modulators in parallel may reduce scan time and improve SNR. One disadvantage may be an increase in cost of hardware resources. Alternatively, other configurations are possible.

Figure 11:
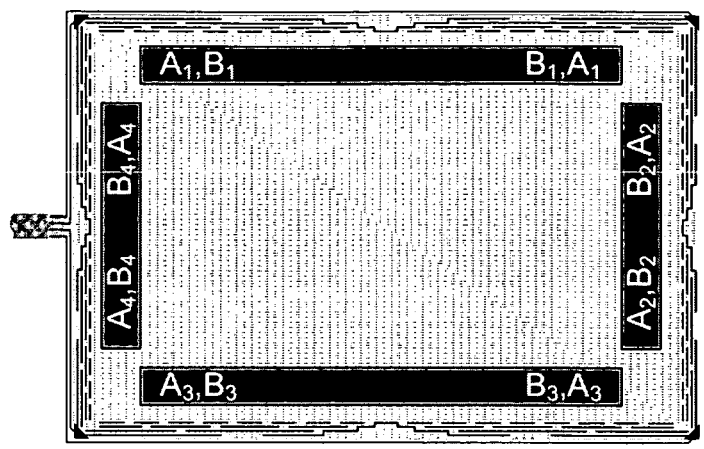
FIG. 11 illustrates one embodiment of a two-dimensional, four-wire resistive touch panel.

FIG. 11 illustrates one embodiment of a two-dimensional, four-wire resistive touch panel. In this mode the two coordinates can be evaluated by doing the several measurements in series using one sigma-delta modulator. The eight conversions may be used for high-accuracy position calculation and touch capacitance compensation. If two sigma-delta modulators running in parallel modulators are used, only four measurements are made. Running four sigma-delta modulators allows the touch panel position to be made using a single conversion.

The embodiments described herein may be implemented in a matrix scanning device, such as a keyboard.

Figure 12A:
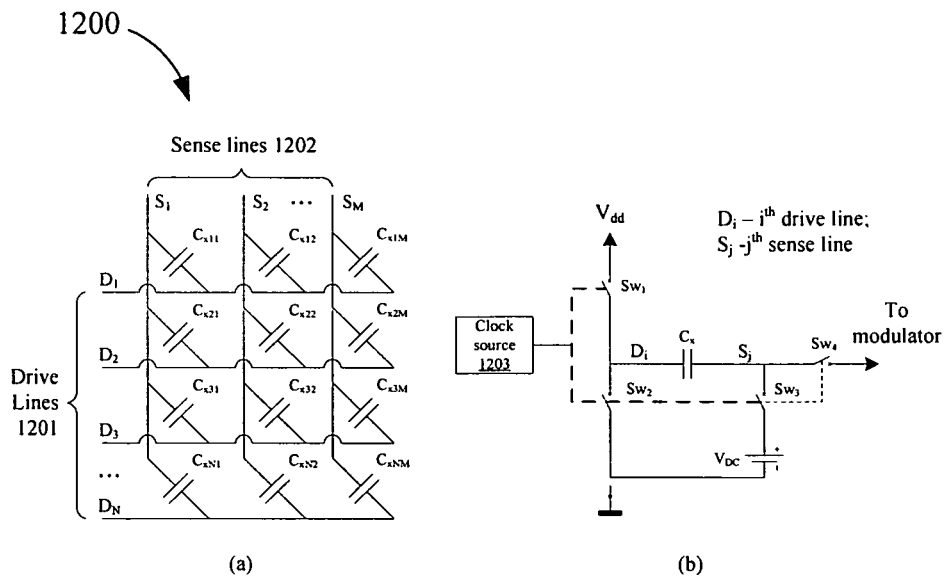
FIG. 12A illustrates one embodiment of a matrix scanning device.

FIG. 12A illustrates one embodiment of a matrix scanning device. Matrix scanning, using the embodiments described herein, may reduce the number of connection lines for a keyboard, and may be useful for multi-button scanning applications, such as PC keyboards, or the like. The scanning matrix 1200 includes the N drive lines 1201 and M sense lines 1202, and each capacitive key is located at drive/sense line intersection. It should be noted that multiple implementations are possible for forming the drive signals and sensing strategy depending on the available hardware resources. In one embodiment, the drive signal is applied to the N drive lines 1201 in series or sequentially using a clock source 1203, and the M sensing lines 1202 are sensed in parallel. Alternatively, other excitation signal sources may be used. In this embodiment, there are M sigma-delta modulators running in parallel. However, alternatively, a multiplexer may be used to reduce the number of sigma-delta modulators. Alternatively, other number of sigma-delta modulators may be used. In another embodiment, the drive signals are applied to each drive line 1201 in series, and each sense line 1201 is scanned in series as well. In this embodiment, there may be 1 sigma-delta modulator. This embodiment includes taking N*M conversions to scan the complete matrix. Alternatively, two or more sigma-delta modulators may be used.

In one embodiment, the DC voltage source (Vdc) is used for parasitic capacitance compensation. The value of Vdc may be adjusted such that there is minimal or no modulator current when there is not presence of the conductive object (e.g., no touch is being detected). In another embodiment, the DC source voltage can be selected to be equal to zero, or alternatively, equal to $V_{dd}$ (e.g., bottom lead of the third switch $SW_3$ is connected to ground or $V_{dd}$). Alternatively, the DC source voltage may be equal to the reference voltage $V_{ref}$. In one exemplary embodiment, the switch can be connected to the $V_{dd}$ or $V_{ss}$ lines of the PSoC™ processing device, manufactured by Cypress Semiconductor Corporation, San Jose, Calif. In another embodiment, DC voltage source to the first switch $Sw_1$, which may allow offset compensation in a circuit that includes two analog buses, such as the PSoC™ processing device, manufactured by Cypress Semiconductor Corporation, San Jose, Calif.

Figure 12B:
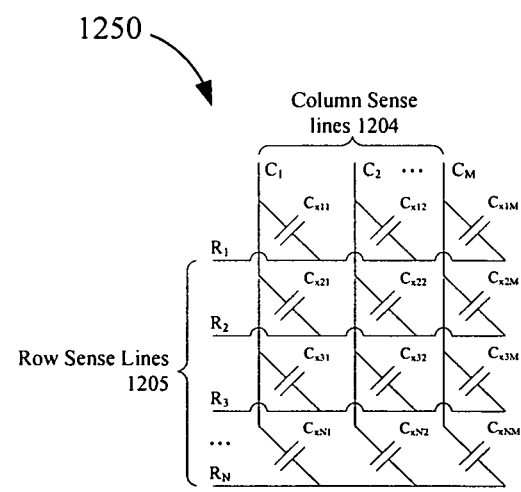
FIG. 12B illustrates another embodiment of a matrix scanning device.

FIG. 12B illustrates another matrix scanning device 1250 (e.g., keyboard matrix) that does not use the excitation signal source. The matrix is formed by column and row sense lines 1204 and 1205. The touched key is determined as intersection detected row and column touched sensors.

In another embodiment, an insulated sensor element and a sigma-delta modulator may be used a liquid level metering device. The insulated sensor element may be placed inside a tank with liquid. The sensor capacitance may be configured to increase linearly in response to an increase in level of the liquid in the tank.

As described above, the embodiments described herein describe a capacitance-to-code converter that allows continuous type operation by providing a continuous output bitstream that can be filtered by one or more filters, (e.g., parallel multiple digital filters) to obtain desired characteristics, such as resolution, sample rate, low-pass or high-pass filtering, or the like. The embodiments describe herein may also be configured to provide a direct capacitance-to-code conversion using a sigma-delta modulator with linear transfer characteristic and fixed measurement time, for example, using a decimator, whose output code is directly proportional to the capacitance.

The embodiments described herein may have the advantage of keeping all benefits of existing charge transfer/accumulation methods (especially in the high immunity for RF/EMI noise signals), and may be configured for easy implementation in existing devices from hardware and software perspectives, as well as in future devices.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   measuring a capacitance on a sensor element of a sensing device using a sigma-delta modulator, wherein the sensor element is a switching capacitor in a feedback loop of the sigma-delta modulator;
   switching the switching capacitor between a voltage source and a first node of a modulator capacitor of the sigma-delta modulator to provide a charge current to the modulator capacitor using a plurality of switches, wherein a first of the plurality of switches is coupled between the voltage source and a first node of the switching capacitor and the second of the plurality of switches is coupled between the first node of the switching capacitor and the first node of the modulator capacitor; and
   converting the capacitance measured on the sensor element to a digital code.

2. The method of claim 1, further comprising switching the switching capacitor in the feedback loop using an output of the sigma-delta modulator.

3. The method of claim 1, wherein measuring the capacitance on the sensor element comprises:
   charging the capacitance on the sensor element on a line coupled to one end of the switching capacitor; and
   measuring the capacitance on the sensor element on the line coupled to the one end of the switching capacitor.

4. The method of claim 1, wherein the digital code is proportional to the measured capacitance.

5. The method of claim 1, wherein the digital code is a modulator bitstream, and wherein the method further comprises converting the modulator bitstream into a multi-bit value.

6. The method of claim 1, wherein measuring the capacitance further comprises alternately coupling the switching capacitor and a discharge resistor to the first node of the modulator capacitor of the sigma-delta modulator.

7. The method of claim 1, wherein measuring the capacitance further comprises
   discharging the voltage on the modulator capacitor when the voltage on the modulator capacitor reaches a reference voltage.

8. The method of claim 7, wherein discharging the voltage on the modulator capacitor comprises connecting a discharge resistor between the first node of the modulator capacitor and ground using a third switch of the plurality of switches controlled by an output signal of a comparator, wherein the comparator toggles the output signal when the voltage on the modulator capacitor crosses the reference voltage.

9. The method of claim 8, wherein the comparator is configured to toggle the switch when the voltage crosses the reference voltage in either a positive or negative direction.

10. The method of claim 7, wherein the switching capacitor, the first switch, and the second switch form a switching capacitor equivalent resistor to provide the charge current to the modulator capacitor.

11. An apparatus, comprising:
    a sensor element, wherein the sensor element is a switching capacitor;
    a sigma-delta modulator coupled to the sensor element, wherein the switching capacitor is in a feedback loop of the sigma-delta modulator; and
    a switching circuit having a plurality of switches, wherein a first of the plurality of switches is coupled between a voltage source and a first node of the switching capacitor and the second of the plurality of switches is coupled between the first node of the switching capacitor and a first node of a modulator capacitor of the sigma-delta modulator, wherein the switching capacitor is configured to provide a charge current to the modulator capacitor using the second switch, wherein the sigma-delta modulator is configured to measure a capacitance on the sensor element using the plurality of switches, wherein the switching capacitor is configured to provide a charge current to the modulator capacitor using the second switch, and wherein the sigma-delta modulator is configured to convert the measured capacitance to a digital code.

12. The apparatus of claim 11, wherein an output of the sigma-delta modulator is configured to switch the switching capacitor in the feedback loop of the sigma-delta modulator.

13. The apparatus of claim 11, wherein one end of the switching capacitor is coupled to a line, wherein the sigma-delta modulator is configured to measure the capacitance on the line, and wherein the switching capacitor is charged on the line.

14. The apparatus of claim 11, wherein the digital code is proportional to the measured capacitance.

15. The apparatus of claim 11, wherein the switching capacitor, the first switch, and the second switch form a switching capacitor equivalent resistor that provides charge current to the modulator capacitor of the sigma-delta modulator.

16. The apparatus of claim 11, wherein the switching circuit is further configured to alternately couple a discharge resistor to the first node of the modulator capacitor to discharge the voltage of the modulator capacitor and the switching capacitor to the first node of the modulator capacitor to charge the voltage of the modulator capacitor.

17. The apparatus of claim 11, wherein the switching circuit is configured to couple the switching capacitor in parallel to the modulator capacitor.

18. The apparatus of claim 11, wherein the sigma-delta modulator comprises a linear transfer characteristic and a fixed measurement time.

19. The apparatus of claim 11, wherein the sigma-delta modulator is a capacitance-to-duty-cycle converter, wherein the modulator duty cycle of the sigma-delta modulator changes when a presence of a conductive object is detected on the sensor element.

20. The apparatus of claim 11, further comprising a decimator coupled to the sigma-delta modulator.

21. The apparatus of claim 11, further comprising a two-dimensional, four wire touch-sensor pad, wherein the two-dimensional, four wire touch-sensor pad wherein the single-layer, four wire ITO panel comprises the sensor element.

22. The apparatus of claim 11, further comprising means for digital filtering an output of the sigma-delta modulator to generate a multi-bit value for the digital code.

23. The apparatus of claim 11, further comprising means for reducing a difference between the voltage of the modulator capacitor and a reference voltage.

24. The apparatus of claim 11, further comprising means for providing a continuous type operation for capacitance measurement on the sensor element.

25. The apparatus of claim 11, further comprising one or more digital filters coupled to receive an output of the sigma-delta modulator, wherein the output of the sigma-delta modulator is a digital output bitstream, and wherein the one or more digital filters are configured to convert the digital output bitstream into the digital code.

26. The apparatus of claim 25, wherein the digital output bitstream is a continuous, single-bit bitstream, and the converted digital code is a multi-bit value.

27. The apparatus of claim 11, wherein the sigma-delta modulator further comprises a discharge resistor to discharge the modulator capacitor.

28. The apparatus of claim 27, wherein the sigma-delta modulator further comprises a third switch of the plurality of switches coupled to the discharge resistor and the output of the sigma-delta modulator, the output of the sigma-delta modulator to toggle the switch when a voltage on the modulator capacitor increases to be equal to a reference voltage and when the voltage on the modulator capacitor decreases to be equal to the reference voltage.

29. The apparatus of claim 11, wherein the switching circuit is configured to transfer charge on the sensor element, accumulated during a first phase, to the modulator capacitor during a second phase.

30. The apparatus of claim 29, wherein the switching circuit is further configured to couple a discharge resistor to discharge the transferred charge on the modulator capacitor.

31. The apparatus of claim 11, wherein the sigma-delta modulator further comprises a comparator, wherein the comparator is configured to toggle an output signal when the voltage on the modulator capacitor crosses a reference voltage.

32. The apparatus of claim 31, wherein the output signal of the comparator activates charging of the modulator capacitor when the voltage on the modulator capacitor is below the reference voltage, and activates discharging of the modulator capacitor when the voltage on the modulator capacitor is above the reference voltage.

33. The apparatus of claim 31, wherein the comparator is configured to toggle a switch, which couples and decouples a discharge resistor to the first node of the modulator capacitor.

34. The apparatus of claim 11, further comprising a single layer, four wire Indium-tin-oxide (ITO) panel, wherein the single-layer, four wire ITO panel comprises the sensor element.

35. The apparatus of claim of claim 34, wherein the ITO panel comprises a solid ITO coating with the electric filed linearization electrodes.

36. The apparatus of claim of claim 34, wherein the ITO panel comprises multiple resistive sliders connected in parallel to provide linear electric field gradient over the ITO panel.

37. The apparatus of claim 11, further comprising a scanning matrix, wherein the scanning matrix comprises the sensor element.

38. The apparatus of claim 37, wherein the scanning matrix is implemented in a keyboard.

39. The apparatus of claim 11, further comprising means for reducing a number of connection lines in a multi-button scanning application.

40. The apparatus of claim 39, wherein the multi-button scanning application is a keyboard.

41. An apparatus, comprising:
a sensor element, wherein the sensor element is a switching capacitor; and
a sigma-delta modulator coupled to the sensor element to measure a capacitance on the sensor element and to convert the measured capacitance to a digital code, wherein the switching capacitor is in a feedback loop of the sigma-delta modulator, wherein the sigma-delta modulator further comprises:
a comparator configured to receive two inputs, wherein the two inputs are the voltage on the modulator capacitor and the reference voltage;
a latch coupled to an output of the comparator, wherein the latch is configured to latch the output of the comparator based on a clock signal; and
a control circuit coupled to receive an output of the latch and the clock signal, wherein the control circuit is configured to control the first and second switches of the switching circuit.

42. The apparatus of claim 41, wherein the sigma-delta modulator further comprises a discharge resistor to discharge the modulator capacitor.

43. The apparatus of claim 41, wherein the control circuit comprises a gate coupled to receive the output of the latch and the clock signal, and wherein the gate is configured to control the first and second switches of the switching circuit.

44. The apparatus of claim 41, wherein the control circuit comprises
a counter coupled to receive the clock signal, wherein the counter is configured to control the first and second switches of the switching circuit, wherein the switching circuit further comprises a third switch of the plurality of switches to switch in the discharge resistor, and wherein the output of the latch is configured to control the third switch.

45. The apparatus of claim 44, wherein the counter is a pseudo-random signal (PRS) counter, wherein the PRS is used as a spread spectrum source for electromagnetic interference (EMI) immunity.

46. The apparatus of claim 44, wherein the sigma-delta modulator further comprises a discharge resistor to discharge the modulator capacitor, wherein the discharge resistor is coupled between the voltage source and the first node of the modulator capacitor, and wherein the third switch is coupled between the discharge resistor and the voltage source.

47. An apparatus, comprising:
a sensor element, wherein the sensor element is a switching capacitor; and
a sigma-delta modulator coupled to the sensor element to measure a capacitance on the sensor element and to convert the measured capacitance to a digital code, wherein the switching capacitor is in a feedback loop of the sigma-delta modulator;
a clock generation circuit coupled to the sigma-delta modulator, wherein the clock generation circuit is configured to provide a clock to the switching circuit; and
a digital filter coupled to the sigma-delta modulator, wherein the digital filter is configured to filter the output of the sigma-delta modulator.

48. The apparatus of claim 47, wherein the clock generation circuit and the output of the sigma-delta modulator set a sample frequency and an output bitstream frequency of the sigma-delta modulator.

49. The apparatus of claim 47, wherein the clock generation circuit comprises:
an oscillator to provide a clock signal to the sigma-delta modulator; and
a gate coupled to receive the clock signal and an output of the sigma-delta modulator, wherein an output signal of the gate is configured to control the switching circuit.

50. The apparatus of claim 47, wherein the clock generation comprises:
an oscillator to provide a clock signal to the sigma-delta modulator; and
a counter to receive the clock signal, wherein the counter is configured to control the switching circuit.

51. The apparatus of claim 47, wherein the clock generation circuit and digital filter circuit comprises:
an oscillator to provide an oscillator signal;
a frequency divider coupled to receive the oscillator signal and to provide a clock signal to a latch of the sigma-delta modulator, wherein the latch is coupled to the output of a comparator of the sigma-delta modulator, and wherein the frequency divider is configured to divide the oscillator signal by eight;
a first latch coupled to receive the oscillator signal, and wherein the first latch is enabled by the output of the latch of the sigma-delta modulator, wherein an output of the first latch is configured to control the switching circuit; and
a decimator coupled to receive the output of the latch of the sigma-delta modulator, and wherein an output of the decimator comprises the digital code.

52. The apparatus of claim 47, wherein the clock generation circuit and the filter circuit comprise:
an oscillator to provide an oscillator signal;
a frequency divider coupled to receive the oscillator signal and to provide a clock signal to a latch of the sigma-delta modulator, wherein the latch is coupled to the output of a comparator of the sigma-delta modulator;
a pulse width modulator (PWM);
a gate coupled to receive an output of the latch and clock signal and an output of the PWM;
a first latch coupled to receive the clock signal, and wherein the first latch is enabled by the output of the gate, wherein an output of the first latch comprises the digital code; and
a second latch coupled to receive the oscillator signal, wherein the second latch is enabled by the output of the latch of the sigma-delta modulator, and wherein an output signal of the second latch is configured to control the switching circuit.

53. The apparatus of claim 52, wherein the clock generation circuit and digital filter circuit further comprises a pseudo-random signal (PRS) counter coupled between the oscillator and the second latch, wherein the PRS is used as a spread spectrum source for electromagnetic interference (EMI) immunity.

54. The apparatus of claim 47, wherein the clock generation circuit and digital filter circuit comprises:
a modulator bitstream filter coupled to the sigma-delta modulator; and
a clock signal circuit coupled to the sigma-delta modulator to provide a clock signal to each of the switching circuit, the sigma-delta modulator, and the modulator bitstream filter.

55. The apparatus of claim 54, wherein the sigma-delta modulator comprises a comparator and a latch, wherein the comparator is configured to toggle an output signal when the voltage on the modulator capacitor crosses the reference voltage, wherein the latch is coupled to an output of the comparator and is configured to latch the output of the comparator based on the clock signal latch provided by the clock signal circuit, wherein the modulator bitstream filter comprises a pulse width modulator (PWM), a gate, and a counter, wherein the PWM is configured to receive the clock signal provided by the clock signal circuit, wherein the gate is configured to receive an output of the PWM and the output of the latch of the sigma-delta modulator, wherein the counter is configured to receive an output of the gate and the clock signal provided by the clock signal circuit, wherein an output of the counter comprises the digital code, and wherein the clock circuit comprises an IMO, and a VC, wherein the output of the VC is configured to provide the clock signals to the switching circuit, the PWM, and the counter.

56. The apparatus of claim 48, wherein the clock source circuit further comprises a clock source coupled to the IMO and the switching circuit, wherein the clock source is configured to provide the clock signal to the switching circuit.

57. The apparatus of claim 56, wherein the clock source is a 16-bit pseudo-random signal (PRS) counter.

58. A method, comprising:
measuring a capacitance on a sensor element of a sensing device using a sigma-delta modulator, wherein the sensor element is a switching capacitor in a feedback loop of the sigma-delta modulator; and
converting the capacitance measured on the sensor element to a digital code, wherein measuring the capacitance further comprises:
charging a modulator capacitor of the sigma-delta modulator using a first charge on the switching capacitor to increase a voltage on the modulator capacitor;
when the voltage is equal to a reference voltage, discharging the modulator capacitor until the voltage is equal to the reference voltage; and
charging the modulator capacitor using a second charge on the switching capacitor to increase the voltage on the modulator capacitor.

* * * * *